(12) United States Patent
Ohsawa

(10) Patent No.: US 6,650,565 B1
(45) Date of Patent: Nov. 18, 2003

(54) SEMICONDUCTOR MEMORY DEVICE

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/290,355

(22) Filed: Nov. 8, 2002

(30) Foreign Application Priority Data

Sep. 11, 2002 (JP) ..................................... 2002-265623

(51) Int. Cl.[7] .............................................. G11C 16/04
(52) U.S. Cl. ........................... 365/185.05; 365/185.13; 365/185.2
(58) Field of Search ...................... 365/185.05, 185.13, 365/185.2

(56) References Cited

U.S. PATENT DOCUMENTS

| | | | | |
|---|---|---|---|---|
| 5,345,416 A | * | 9/1994 | Nakagawara | 365/185.13 |
| 6,044,016 A | * | 3/2000 | Itoh | 365/185.17 |
| 6,091,633 A | * | 7/2000 | Cernea et al. | 365/185.13 |
| 6,144,583 A | * | 11/2000 | Shiba | 365/185.13 |
| 6,483,763 B2 | * | 11/2002 | Uchikoba et al. | 365/205 |

OTHER PUBLICATIONS

Takashi Ohsawa, et al. "Memory Design Using One–Transistor Gain Cell on SOI", 2002 IEEE International Solid-State Circuits Conference, Feb. 5, 2002, pp. 152, 153, 454.
US–2002/0051378, May 2, 2002, Takashi Ohsawa.
US–2002/0110018, Aug. 15, 2002, Takashi Ohsawa.

* cited by examiner

Primary Examiner—Richard Elms
Assistant Examiner—Tuan T. Nguyen
(74) Attorney, Agent, or Firm—Oblon, Spivak, McClelland, Maier & Neustadt, P.C.

(57) ABSTRACT

A semiconductor memory device has a memory cell array which includes memory cells arranged in a matrix form on a semiconductor substrate, each of the memory cells including a MISFET which has a source, a drain, a channel body and a gate electrode, each of the memory cells having a first state and a second state; word lines, each of which is connected to the gate electrodes of the memory cells arranged in a first direction; first bit lines, each of which is connected to the drains of the memory cells arranged in a second direction, the bit lines being formed in a first wiring layer located above the semiconductor substrate; and a second bit line which is formed in a second wiring layer located above the first wiring layer, the second bit line being connected to the first bit lines via bit line switches.

24 Claims, 41 Drawing Sheets

SEMICONDUCTOR MEMORY DEVICE

CROSS REFERENCE TO RELATED APPLICATION

This application claims benefit of priority under 35 U.S.C. §119 to Japanese Patent Application No. 2002-265623, filed on Sep. 11, 2002, the entire contents of which are incorporated by reference herein.

BACKGROUND OF THE INVENTION

1. Field of the Invention

The present invention relates to a semiconductor memory device, and particularly relates to a dynamic type semiconductor memory device which needs a refresh sequence.

2. Description of the Related Art

It is thought that it is difficult to scale down a related dynamic memory cell in which one bit is formed by one transistor and one capacitor (1T1C) to a design rule of less than 0.1 μm. This is because its structure becomes more complicated since the capacitance of the capacitor needs to be maintained constant. Under such a situation, an FBC (Floating Body transistor Cell) type memory cell is proposed, and the FBC type memory cell is a MISFET (Metal Insulator Silicon Field Effect Transistor) having a floating body and formed on an SOI (Silicon On Insulator) or the like. The FBC type memory cell stores information by accumulating majority carriers in a channel body of the MISFET. Such an FBC type memory cell is described, for example, in Japanese Patent application No. 2001-245584 (hereinafter referred to as patent document 1), Japanese Patent Application No. 2001-039122 (hereinafter referred to as patent document 2), and Japanese Patent Application No. 2001-220461 (hereinafter referred to as patent document 3). The entire contents of these patent documents 1 though 3 are incorporated herein by reference. The patent document 3 is not yet open to the public at the present time.

Moreover, the patent document 1 corresponds to U.S. Patent Application Publication No. 2002/0051378, the patent document 2 corresponds to U.S. Patent Application Publication No. 2002/0110018 and the patent document 3 corresponds to U.S. patent application Ser. No. 09/964,851, and then the entire contents of these documents are incorporated herein by reference.

The structure and operating principle of such a memory cell MC will be explained based on FIG. 1 to FIG. 4. As can be seen from these drawings, each of MISFETs arranged in a matrix form on an SOI substrate is used as the memory cell MC. In an example shown in these drawings the SOI substrate is structured, including an insulating film (a silicon oxide film, for example) 14 formed on a P-type semiconductor substrate 10. A semiconductor layer 16 is formed on this insulating film 14.

A drain 20 and a source 22 are formed in this semiconductor layer 16. The drain 20 is connected to a bit line BL, the source 22 is connected to a source line SL, and a gate electrode 24 constitutes a word line WL. A portion between the drain 20 and the source 22 is in an electrical floating state and forms a channel body 28. The aforementioned gate electrode 24 is located on this channel body 28 with a gate insulating film 26 therebetween. The source line SL is fixedly maintained at 0 V.

The drain 20 and the source 22 of the memory cell MC are formed by an N-type semiconductor region, and the channel body 28 is formed by a P-type semiconductor region. The memory cell MC stores data depending on whether or not holes which are majority carriers are accumulated in this channel body 28. Hereafter, a state in which more holes are accumulated in the channel body 28 is defined as "1" and a state in which fewer holes are accumulated therein is defined as "0".

To accumulate the majority carriers (holes in this case) in the channel body 28, as shown in FIG. 1, this memory cell MC is biased into a pentode (saturation) state. More specifically, the bit line BL connected to the drain 20 and the word line WL connected to the gate electrode 24 are set at high voltages. Consequently, impact ionization is caused to thereby create electron-hole pairs, and holes out of the electron hole pairs are accumulated in the channel body 28. This is a state in which "1" data is written.

Contrary to this, when "0" data is written, as shown in FIG. 2, the bit line BL is set at a low voltage, and a PN junction between the channel body 28 and the drain 20 or the source 20 is forward biased, whereby the accumulated holes are emitted to the bit line BL side.

As shown in FIG. 3, data written into the memory cell MC is read by applying to the drain 20 such a voltage as not destroy the data and operating the memory cell MC in a linear region. By using the property that a source-drain current Ids flowing between the source 22 and the drain 20 differs by a body effect according to a difference in the number of holes accumulated in the channel body 28, this difference in source-drain current Ids is sensed and amplified, whereby the data is read. Namely, as shown in FIG. 4, even when the same gate-source voltage Vgs is applied, the source-drain current Ids differs depending on the number of holes accumulated in the channel body 28, and hence, by sensing this difference, the number of holes accumulated in the channel body 28, that is, whether the memory cell MC holds the "1" data or the "0" data is read.

This memory cell MC is a gain cell including one MISFET on the SOI substrate and can be easily scaled down to less than 0.1 μm. Since read is performed nondestructively in this memory cell MC, unlike a related DRAM using 1T1C memory cells, it is unnecessary to arrange a sense amplifier for each bit line BL. Accordingly, it is required only to select one bit line out of plural bit lines BL by a bit line selector (multiplexer) and arrange a sense amplifier only for the selected bit line BL, which enables an increase in cell efficiency.

An example of such an arrangement of sense amplifiers is shown in FIG. 5 and FIG. 6. FIG. 5 is a diagram showing a cell array 100 of the FBC memory cells partially in detail, and FIG. 6 is a diagram showing the entire layout of the cell array 100.

As shown in FIG. 5 and FIG. 6, the cell array 100 is divided into plural cell array blocks 100B. Between the cell array blocks 100B, bit line selector arranging regions 120 in each of which bit line selectors are arranged, and a sense unit arranging region 122 in which sense amplifiers SA and reference voltage generating circuits VG are arranged are provided. The sense unit arranging region 122 is provided in common to the cell array blocks 100B adjacent on both sides.

Moreover, as shown in FIG. 5, one reference voltage generating circuit VG is provided in common to two sense amplifiers SA. By continuously arranging units of 32 (8×2+ 8×2) bit lines BL and one reference bit line RBL shown in FIG. 5 in a top-to-bottom direction, the cell array block 100B shown in FIG. 6 is configured. On the upper side of the cell array block 100B in FIG. 6, a row decoder and word line driver 130 is provided. Further, on the right side of the cell array 100 in FIG. 6, a column decoder 140 is provided.

FIG. 7 is a diagram showing the configuration of the sense amplifier SA, FIG. 8 is a diagram showing a circuit configuration of the reference voltage generating circuit VG, and FIG. 9 is a diagram showing a circuit configuration of a bit line selector BSTR. As shown in FIG. 7, in the cell array 100, read column selection signal lines RCSL, write column selection signal lines WCSL, and reference cell refresh column signal lines DWCSL are provided extending in a crosswise direction in FIG. 7. These read column selection signal line RCSL, write column selection signal line WCSL, and reference cell refresh column signal line DWCSL are inputted to each of the sense amplifiers SA across each of the cell array blocks 100B from the column decoder 140 in FIG. 6.

As shown in FIG. 7, two read column selection signal lines RCSL, two write column selection signal lines WCSL, and one reference cell refresh column signal line DWCSL are provided for 32 bit lines BL and one reference bit line RBL, and they are plurally provided in a word line direction to constitute the sense amplifiers SA.

The read column selection signal line RCSL, the write column selection signal line WCSL, and the reference cell refresh column signal line DWCSL are formed in a metal wiring layer which is a third layer. Incidentally, metal wiring in a first layer is used for wiring of bit lines BL and circuits of the sense unit arranging regions 122, metal wiring in a second layer is used for wiring of word lines WL and circuits of the sense unit arranging regions 122.

FIG. 10 is a conceptual diagram explaining the operations of the sense amplifier SA and the reference voltage generating circuit VG shown in FIG. 7. As shown in FIG. 10, by driving two reference word lines RWL high with respect to one reference bit line RBL, two reference cells into which two opposite sets of data are written (the "0" data and the "1" data are written) are selected at the same time. Therefore, the sum of a cell current I1 corresponding to the "1" data and a cell current I0 corresponding to the "0" data flows through the reference bit line RBL. By comparing this current I0+I1 with a current obtained by doubling a cell current flowing through the memory cell MC with a current mirror with a current ratio of 2 (namely, 2×I0 or 2×I1), data is read from the memory cell MC.

Moreover, FIG. 11 shows the configuration of the cell array 100 described in Japanese Patent application No. 2002-176931 (hereinafter referred to as patent document 4). This patent document 4 is not yet open to the public at the present time. The entire contents of this patent document 4 are incorporated herein by reference. In the cell array 100 in FIG. 11, the reference word line RWL does not exist. Instead, two reference cells are provided at intersection points of the normal word line WL and two reference bit lines RBL, and opposite sets of data are written into these two reference cells in advance. Thanks to such a configuration, by driving the normal word line WL high, the two reference cells are activated simultaneously, and a current which is the sum of the current I0 and the current I1 can be obtained. This read principle is the same as that in FIG. 10 described above, and by comparing the current I0+I1 with a current which is double the cell current, data is read from the memory cell MC. The reference cells to be used themselves, however, differ according to the word line WL which is driven high.

As described above, in a semiconductor memory device using the FBC memory cells MC, the number of sense amplifiers SA can be reduced further than that in the ordinary 1T1C cell DRAM, but the area itself of the sense amplifier SA becomes larger than that in the ordinary DRAM. Hence, it is desired to reduce the proportion of the area occupied by the sense amplifiers SA in the entire semiconductor memory device and thereby achieve further scale-down.

Moreover, as shown in FIG. 9, N-type MISFETs are used for the bit line selector BSTR for selecting the bit line BL. Therefore, when a high voltage is applied to the bit line BL, the gate voltage (a signal BSLn and a signal RBSL in FIG. 9) of the selected MISFET needs to be equal to or higher than a voltage obtained by adding a threshold voltage Vth to the voltage to be applied to the bit line BL. Besides, the threshold voltage Vth of the MISFET is increased by a substrate bias effect, and hence the gate voltage of the selected MISFET needs to be high correspondingly. When the voltage applied to the MISFET increases, the electric field intensity applied to an insulating film of the MISFET increases, which causes an undesirable situation including a reduction in device reliability, an increase in power consumption, and the like.

SUMMARY OF THE INVENTION

In order to accomplish the aforementioned and other objects, according to one aspect of the present invention, a semiconductor memory device comprises:

a memory cell array which includes a plurality of memory cells arranged in a matrix form on a semiconductor substrate, each of the memory cells including a MISFET which has a source, a drain, a channel body between the source and the drain and a gate electrode formed on the channel body, the channel body being in an electrical floating state, each of the memory cells having a first state in which the number of the stored majority carriers is larger in the channel body and a second state in which the number of the stored the majority carriers is smaller in the channel body;

a plurality of word lines, each of which is connected to the gate electrodes of the memory cells arranged in a first direction;

a plurality of first bit lines, each of which is connected to the drains of the memory cells arranged in a second direction which intersects the first direction, the bit lines being formed in a first wiring layer located above the semiconductor substrate; and a second bit line which is formed in a second wiring layer located above the first wiring layer, the second bit line being connected to the first bit lines via bit line switches.

DESCRIPTION OF THE PREFERRED EMBODIMENTS

First Embodiment

In the case of an ordinary 1T1C DRAM cell, destructive read-out is performed, and hence all of memory cells connected to a word line which is driven need to perform rewrite by connecting with a sense amplifier and sensing/amplifying signals. Accordingly, if an attempt to layered bit lines is made in an ordinary 1T1C DRAM, it is necessary that bit lines in a second layer are provided at the same pitch as bit lines in a first layer and connected to the bit lines in the first layer.

On the other hand, when the memory cell MC is configured by an FBC, nondestructive read-out can be performed, and hence it is enough to connect only the memory cell MC which actually performs a read operation to the sense amplifier. Accordingly, the bit lines in the second layer have only to exist in units of sense amplifiers, and thus can be provided at a bit line pitch markedly wider than a bit line pitch in the first layer.

When a column decoder is shared by plural cell array blocks and located at one place, and column selection lines (RCSL, WCSL, and DWCSL) are run on the cell array in a metal wiring layer as a third layer, there is a merit that since the pitches of these column selection lines are relatively wide, by providing the second layer's bit lines in metal wiring in the third layer which is the same layer as that of the column selection lines, the bit lines can be layered without increasing the number of wiring layers from the current number. Further details will be explained below.

Figure 12:
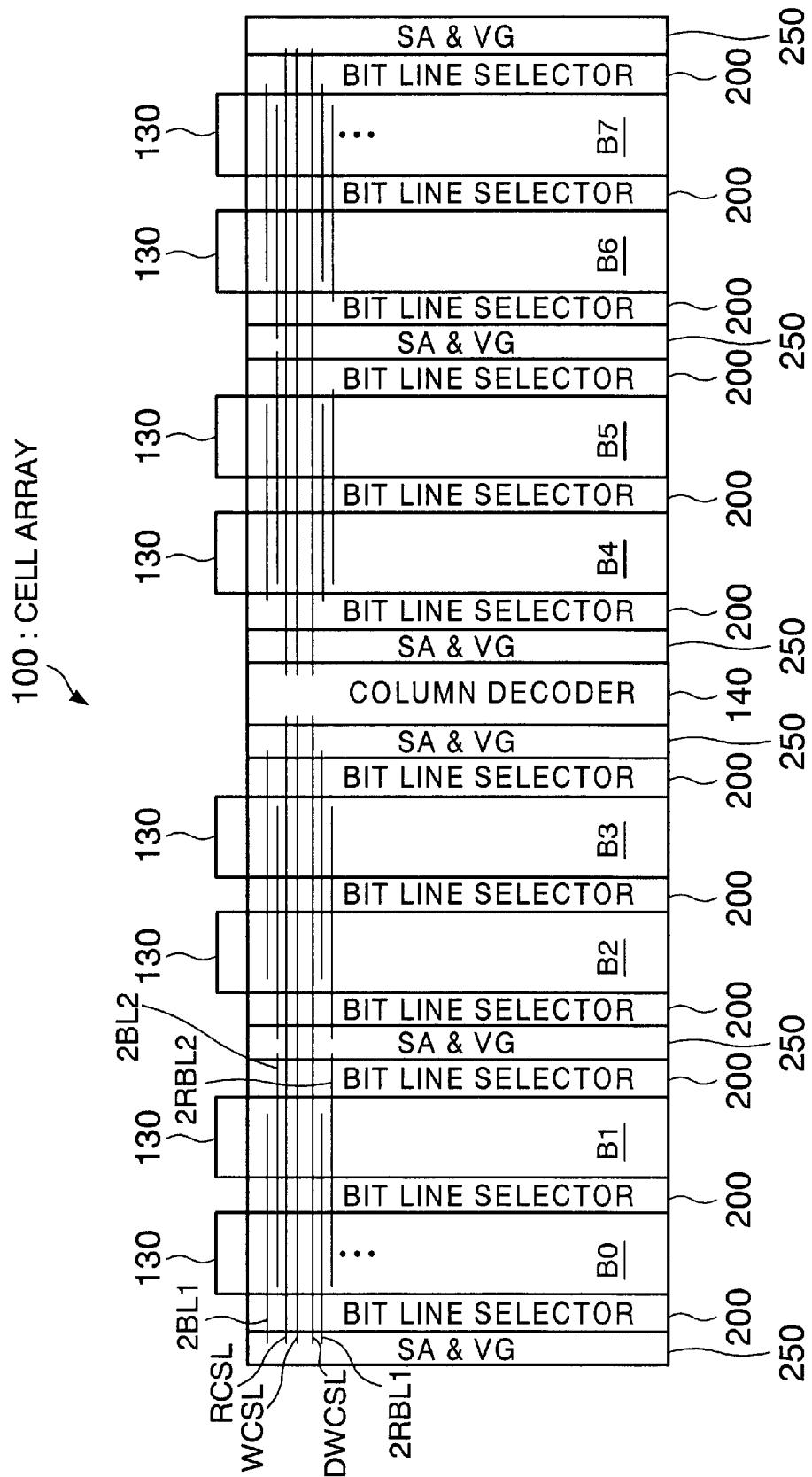
FIG. 12 is a diagram showing the layout of the entire cell array according to a first embodiment.
Figure 13:
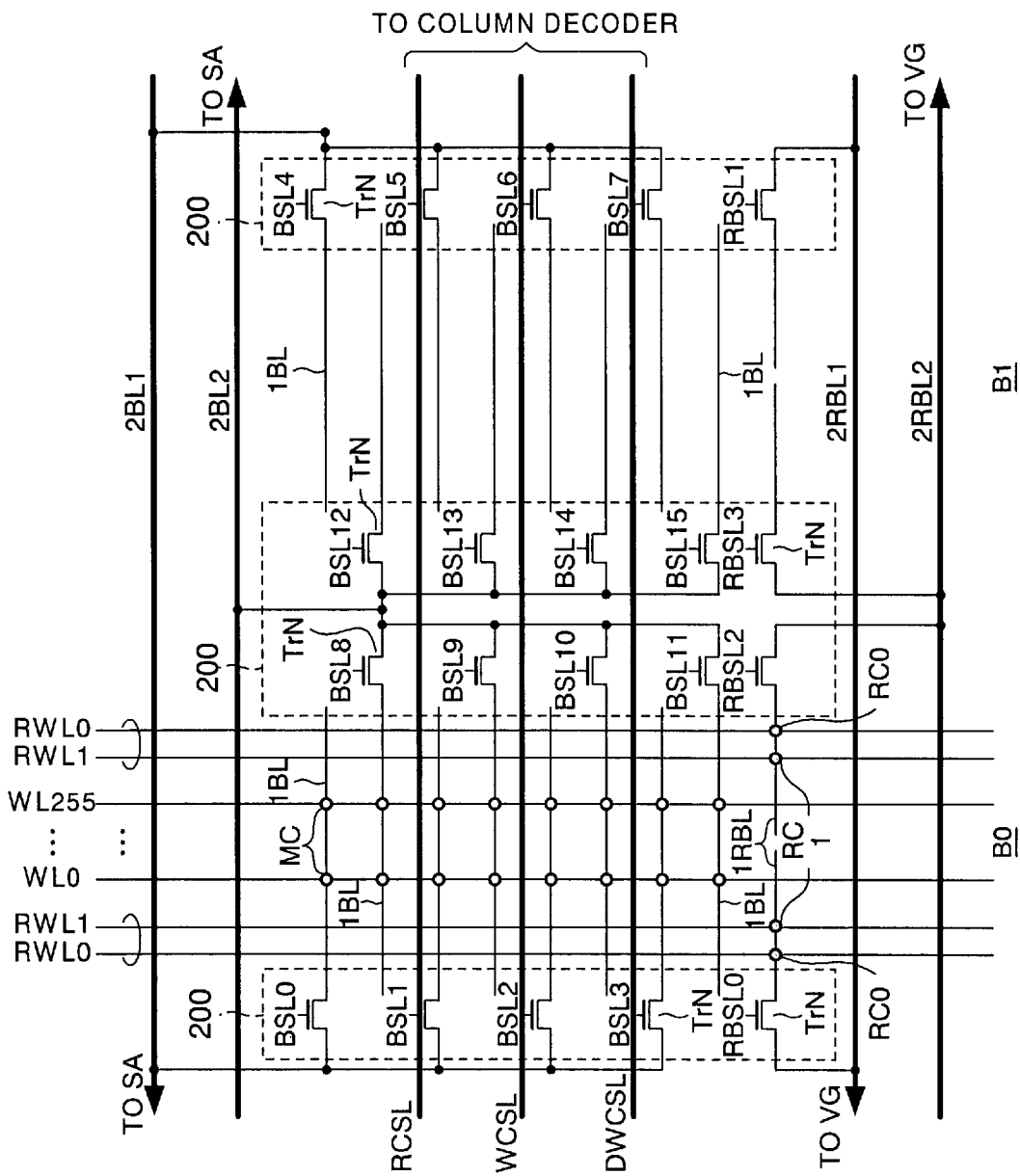
FIG. 13 is a diagram explaining the arrangement of respective memory cells, respective word lines, respective first bit lines, respective second bit lines, respective first reference bit lines, respective second reference bit lines, column selection lines, and bit line selectors in the first embodiment.
Figure 14:
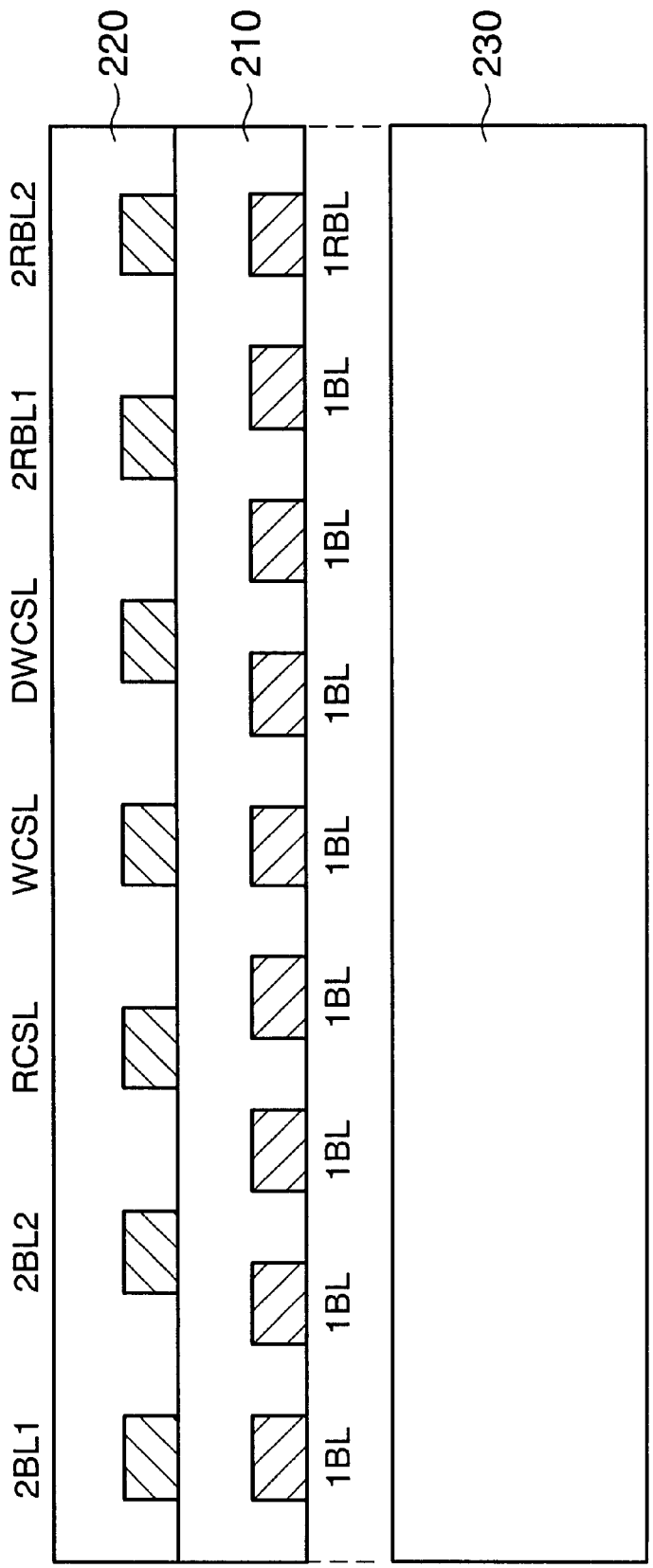
FIG. 14 is a sectional view explaining the structures of a first wiring layer and a second wiring layer corresponding to two left and right sense amplifiers and two left and right reference voltage generating circuits in the first embodiment.

FIG. 12 is a diagram showing the entire layout of a cell array 100 according to the first embodiment. FIG. 13 is a diagram showing the configurations of bit line selectors 200 corresponding to two left and right sense amplifiers SA and two left and right reference voltage generating circuits VG in the cell array 100 in FIG. 12, and the diagram showing the configurations of the bit line selectors 200 of cell array blocks B0 and B1. FIG. 14 is a partial sectional view of a semiconductor memory device according to this embodiment and shows second bit lines connected to the two left and right sense amplifiers SA, second reference bit lines connected to the two left and right reference voltage generating circuits VG, their associated column selection lines, eight first bit lines provided corresponding to these lines, and one first reference bit line.

As shown in FIG. 12, the cell array 100 according to this embodiment includes plural memory cells MC arranged in a matrix form and divided into eight cell array blocks B0 to B7. Moreover, the cell array 100 is configured, including one column decoder 140 and six systems of sense amplifiers SA and reference voltage generating circuits VG. In other words, six sense unit arranging regions 250 are provided.

In this embodiment, the column decoder 140 is located in the central portion of the eight cell array blocks B0 to B7. In other words, four cell array blocks B0 to B3 are located on the left side of the column decoder 140, and four cell array blocks B4 to B7 are located on the right side of the column decoder 140.

The column decoder 140 selects one column address based on a column address signal and sends out column selection signals (a read column selection signal, a write column selection signal, and a reference cell refresh column selection signal) to the column selection lines (a read column selection signal line RCSL, a write column selection signal line WCSL, and a reference cell refresh column signal line DWCSL). These column selection lines RCSL, WCSL, and DWCSL are inputted to each of the sense amplifiers SA and transmits the column selection signals from the column decoder 140 to each of the sense amplifiers SA.

Figure 1:
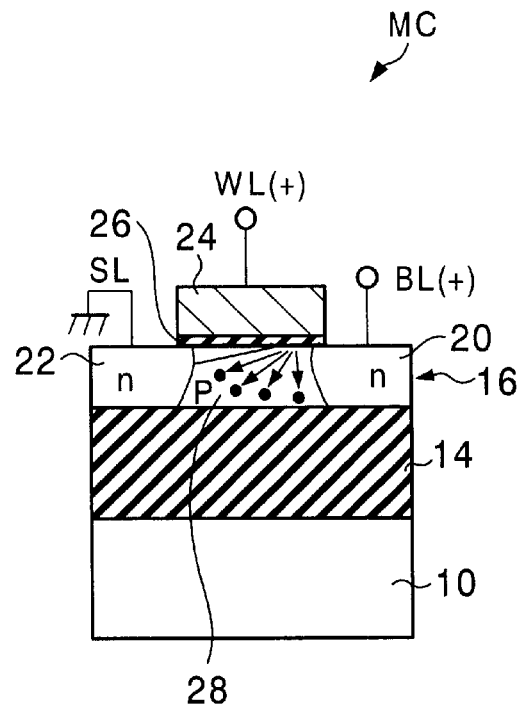
FIG. 1 is a sectional view of a memory cell for explaining the principle of writing "1" data in the FBC-type memory cell.
Figure 2:
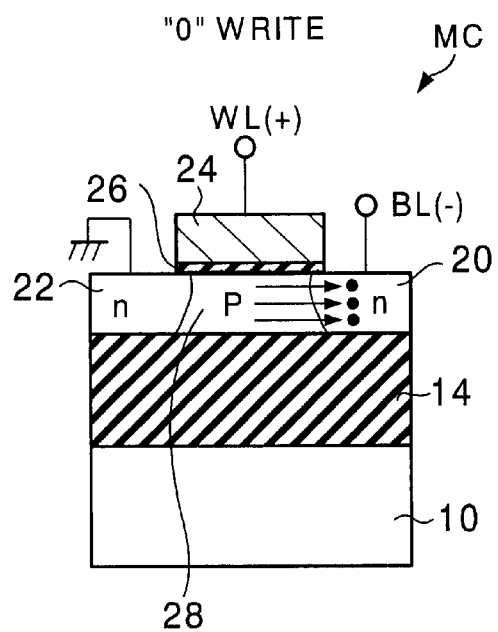
FIG. 2 is a sectional view of the memory cell for explaining the principle of writing "0" data in the FBC-type memory cell.
Figure 3:
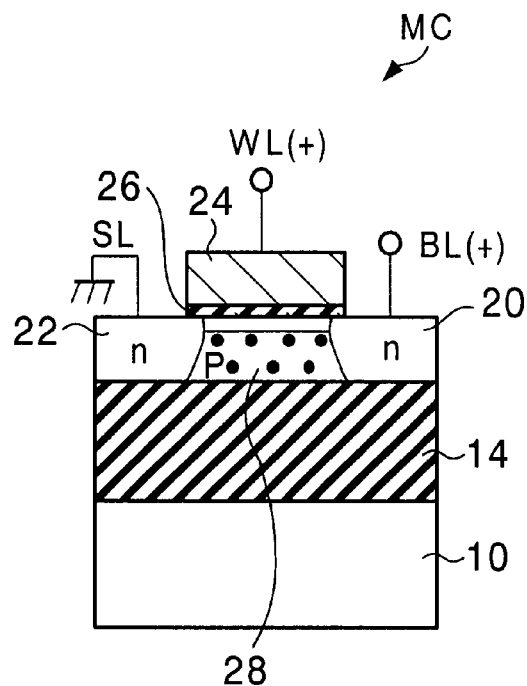
FIG. 3 is a sectional view of the memory cell for explaining the principle of reading data in the FBC-type memory cell.
Figure 4:
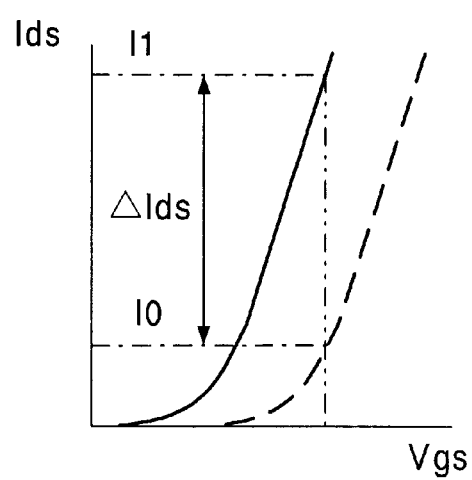
FIG. 4 is a graph explaining the difference between a current flowing between a drain and a source of a memory cell holding the "0" data and a current flowing between a drain and a source of a memory cell holding the "1" data when the gate-source voltage is changed.
Figure 5:
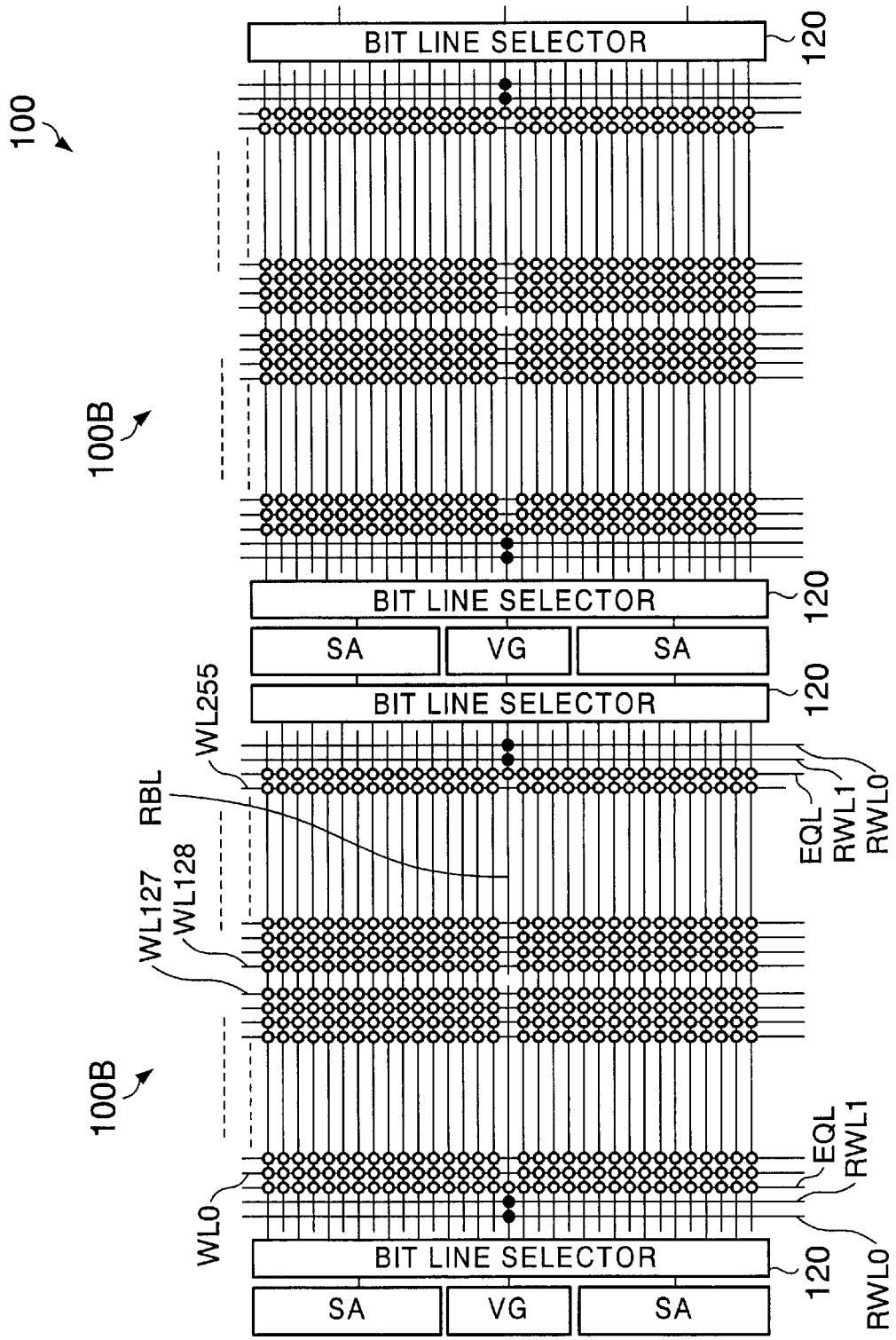
FIG. 5 is a diagram showing the arrangement of memory cells in a cell array having a double end type bit line structure in which a sense amplifier is shared by adjacent cell array blocks.
Figure 6:
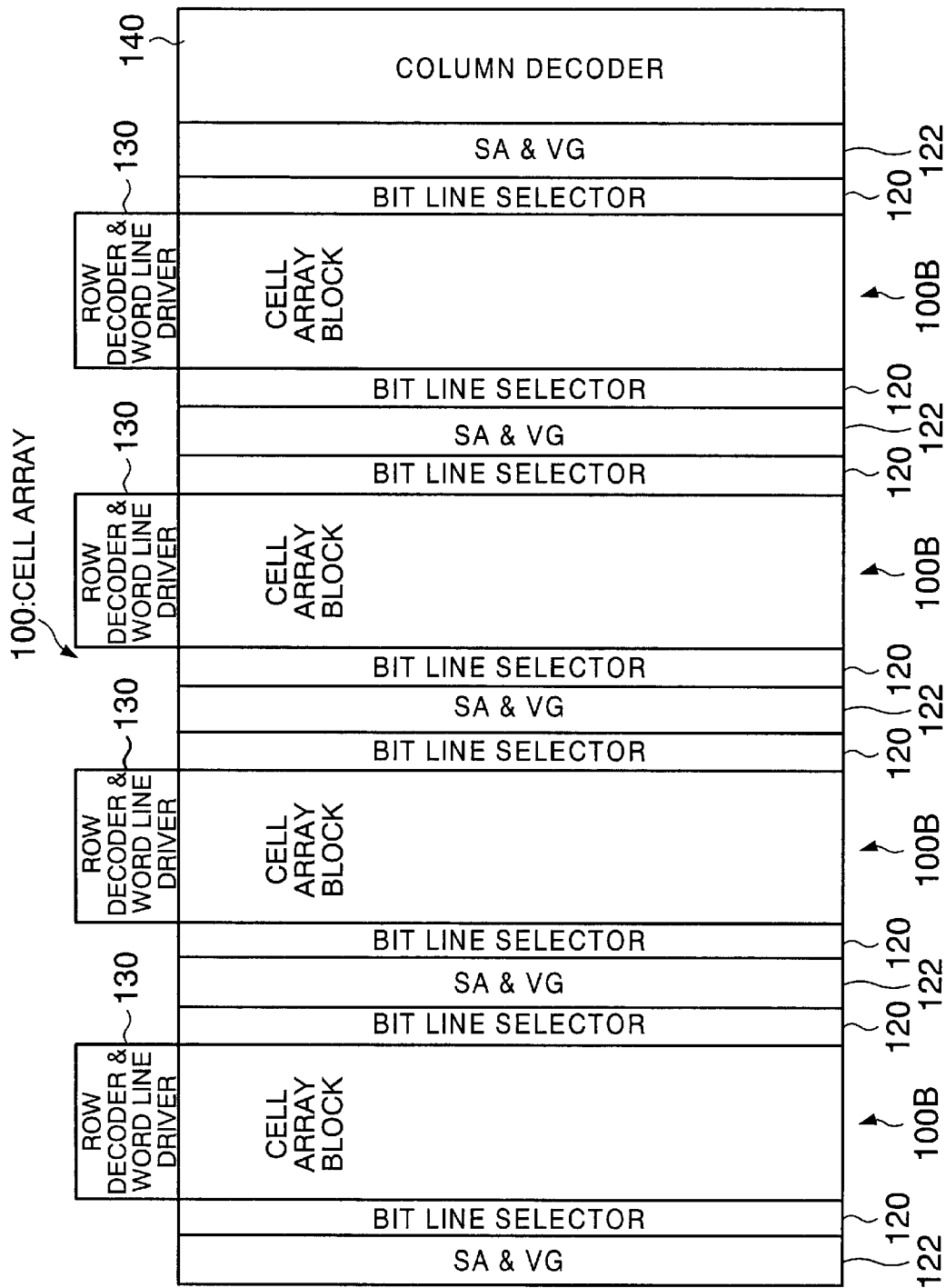
FIG. 6 is a diagram showing the layout of the entire cell array corresponding to FIG. 5.

Three sense unit arranging regions 250 are provided for every two cell array blocks. The memory cell array 100 in this embodiment adopts double end type bit line arrangement such as shown in FIG. 5.

As shown in FIG. 14, in the semiconductor memory device according to this embodiment, first bit lines 1BL and first reference bit lines 1RBL formed in a first wiring layer 210, and second bit lines 2BL1 and 2BL2 and second reference bit lines 2RBL1 and 2RBL2 formed in a second wiring layer 220 are provided. The first wiring layer 210 is one layer located above a semiconductor substrate 230 in which the FBC-type memory cells MC are formed. The second wiring layer 220 is one layer formed above the first wiring layer 210. The first wiring layer 210 is not necessarily the first layer which is formed directly on the semiconductor substrate 230, and has only to be the x-th layer formed above the semiconductor substrate 230. Moreover, the second wiring layer 220 is not necessarily the x+1-th layer formed directly on the first wiring layer 210 and has only to be the y-th (provided that y>x) layer formed above the first wiring layer 210.

Furthermore, in this embodiment, in the second wiring layer 220, the read column selection signal line RCSL, the write column selection signal line WCSL, and the reference cell refresh column signal line DWCSL are formed.

As shown in FIG. 13, in the cell array 100 according to this embodiment, plural word lines WL are provided in parallel for each of the cell array blocks. In this embodiment, 256 word lines WL (WL0 to WL255) are provided for each cell array block. Although the details thereof will be described later, when the memory cell MC is accessed, one word line WL is selected within two cell array blocks and activated by the row decoders and word line drivers 130.

At intersection points of the word lines WL and the first bit lines 1BL, the memory cells MC are provided. More specifically, the word lines WL are connected to gate electrodes of the memory cells MC arranged in a word line direction. The first bit lines 1BL are connected to drains of the memory cells MC arranged in a bit line direction.

In an example in FIG. 13, when attention is focused on one cell array block, four first bit lines 1BL are provided for each sense amplifier SA. In other words, four first bit lines 1BL are provided for the right sense amplifier SA, and four first bit lines BL are provided for the left sense amplifier SA. These eight first bit lines 1BL are connected to the second bit line 2BL1 or the second bit line 2BL2 via N-type MISFETs TrN which are provided alternately on both sides.

Bit line selection signals BSL0 to BSL15 are inputted to gate electrodes of the MISFETs TrN connected to the first bit lines 1BL, and based on these bit line selection signals BSL0 to BSL15, one first bit line 1BL is connected to the second bit line 2BL1 and one first bit line 1BL is connected to the second bit line 2BL2. More specifically, by driving any one of the bit line selection signals BSL0 to BSL7 high, one first bit line 1BL is connected to one second bit line 2BL1.

Moreover, by driving any one of the bit line selection signals BSL8 to BSL15 high, one first bit line 1BL is connected to one second bit line 2BL2.

As shown in FIG. 12, the second bit line 2BL1 is inputted to the left sense amplifier SA, and the second bit line 2BL2 is inputted to the right sense amplifier SA. Therefore, a cell current flowing through the second bit line 2BL1 is sensed by the left sense amplifier SA, and data is read. A cell current flowing through the second bit line 2BL2 is sensed by the right sense amplifier SA, and data is read.

As shown in FIG. 13, on the right side of each of the cell array blocks, one first reference word line RWL0 and one second reference word line RWL1 are provided in parallel with the word lines WL, and on the left side thereof, one first reference word line RWL0 and one second reference word line RWL1 are provided in parallel with the word lines WL. Reference cells are provided at intersection points of the first reference word lines RWL0 and the first reference bit lines 1RBL and at intersection points of the second reference word lines RWL1 and the first reference bit lines 1RBL. More specifically, to one first reference bit line 1RBL extending in the bit line direction, a drain of a reference cell RC0 for holding "0" data and a drain of a reference cell RC1 for holding "1" data are connected. Moreover, a gate electrode of the reference cell RC0 is connected to the first reference word line RWL0, and a gate electrode of the reference cell RC1 is connected to the second reference word line RWL1.

Namely, in this embodiment, two reference cells RC0 and RC1 are connected to one first reference bit line 1RBL. The structures of the reference cells RC0 and RC1 are the same as that of the memory cell MC.

These first reference bit lines 1RBL are connected to the second reference bit line 2RBL1 or the second reference bit line 2RBL2 via N-type MISFETs TrN. Reference bit line selection signals RBSL0 to RBSL3 are inputted to gate electrodes of the MISFETs TrN connected to the first reference bit lines 1RBL. Therefore, by driving either one of the reference bit line selection signal RBSL0 or RBSL1 high, one first reference bit line 1RBL is connected to one second reference bit line 2RBL1. On the other hand, by driving either one of the reference bit line selection signal RBSL2 or RBSL3 high, one first reference bit line 1RBL is connected to one second reference bit line 2RBL2.

As shown in FIG. 12, the second reference bit line 2RBL1 is inputted to the left reference voltage generating circuit VG, and the second reference bit line 2RBL2 is inputted to the right reference voltage generating circuit VG. Hence, currents I0+I1 flowing through the second reference bit lines 2RBL1 and 2RBL2 are respectively inputted to the left and right reference voltage generating circuits VG and used for generating a reference voltage VREF. The configuration of each of the reference voltage generating circuits VG is the same as that in FIG. 8 described above.

As shown in FIG. 12 and FIG. 13, the read column selection signal line RCSL, the write column selection signal line WCSL, and the reference cell refresh column signal line DWCSL extend in the bit line direction from the column decoder 140. These read column selection signal line RCSL, write column selection signal line WCSL, and reference cell refresh column signal line DWCSL are inputted in common to each of the sense amplifiers SA. The configuration of each of the sense amplifiers SA is the same as that in FIG. 7 described above.

Incidentally, similarly to FIG. 5, in this embodiment, the reference voltage generating circuit VG is configured to be shared by two sense amplifiers SA. Accordingly, in actuality, in FIG. 13, the memory cells MC and respective wires including the first bit lines 1BL, the second bit lines 2BL1 and 2BL2, and the column selection signal lines are provided symmetrically with respect to the first reference bit lines 1RBL and the second reference bit lines 2RBL1 and 2RBL2. With two sense amplifiers SA and one reference voltage generating circuit VG as one sense unit, more than one sense unit is arranged in the word line direction in the sense unit arranging region 250. This respect applies to embodiments described later.

Figure 7:
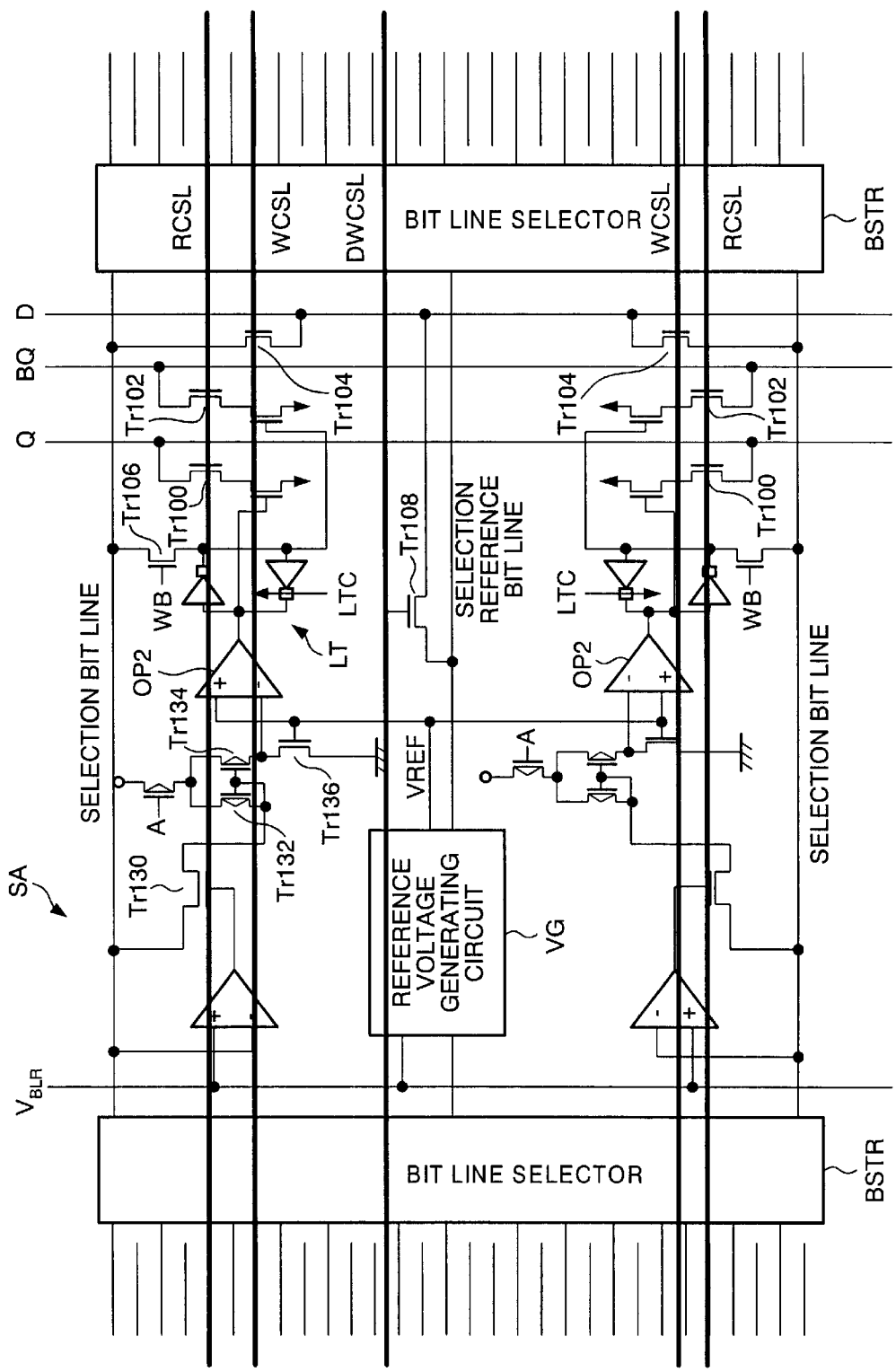
FIG. 7 is a diagram showing the configuration of a sense amplifier in FIG. 5.

Next, a read sequence in the semiconductor memory device according to this embodiment will be explained. As shown in FIG. 12, the column decoder 140 drives a pair of left and right read column selection signal lines RCSL high based on an inputted column address. Consequently, three sense amplifiers SA on the left side and three sense amplifiers SA on the right side are selected. Namely, as shown in FIG. 7, by driving the read column selection signal line RCSL high, MISFETs TR100 and Tr102 of each of the sense amplifiers SA in the column are turned on.

On the other hand, as shown in FIG. 12, the row decoders and word line drivers 130 select one word line WL from every two cell array blocks in the cell array blocks B0 to B7 and drive it high, based on an inputted row address. Namely, as shown in FIG. 13, one word line WL out of word lines WL in the two cell array blocks is driven high. For example, in FIG. 13, the number of the word line WL driven high in the cell array blocks B0 and B1 is one.

Moreover, simultaneously with the above, the bit line selectors 200 connect one first bit line 1BL to the second bit line 2BL1, and connect one first bit line 1BL to the second bit line 2BL2 in two cell array blocks. Thereby, a read current I0 or I1 corresponding to data held in each of the memory cells MC at intersection points of the word line WL driven high and two first bit lines 1BL and 1BL flows into the second bit lines 2BL1 and 2BL2. These read currents are respectively inputted to the sense amplifiers SA.

Further, the row decoders and word line drivers 130 drive two reference word lines RWL0 and two RWL1 in the cell array block in which the word line WL driven high exists simultaneously with the word line WL. Furthermore, the bit line selectors 200 connect the first reference bit lines 1RBL in the cell array block in which the word line WL driven high exists to the second reference bit lines 2RBL1 and 2RBL2 respectively. Thus, a current I0+I1 as a reference is inputted to each of the reference voltage generating circuits VG of the sense units in which the activated sense amplifiers SA exist.

Figure 8:
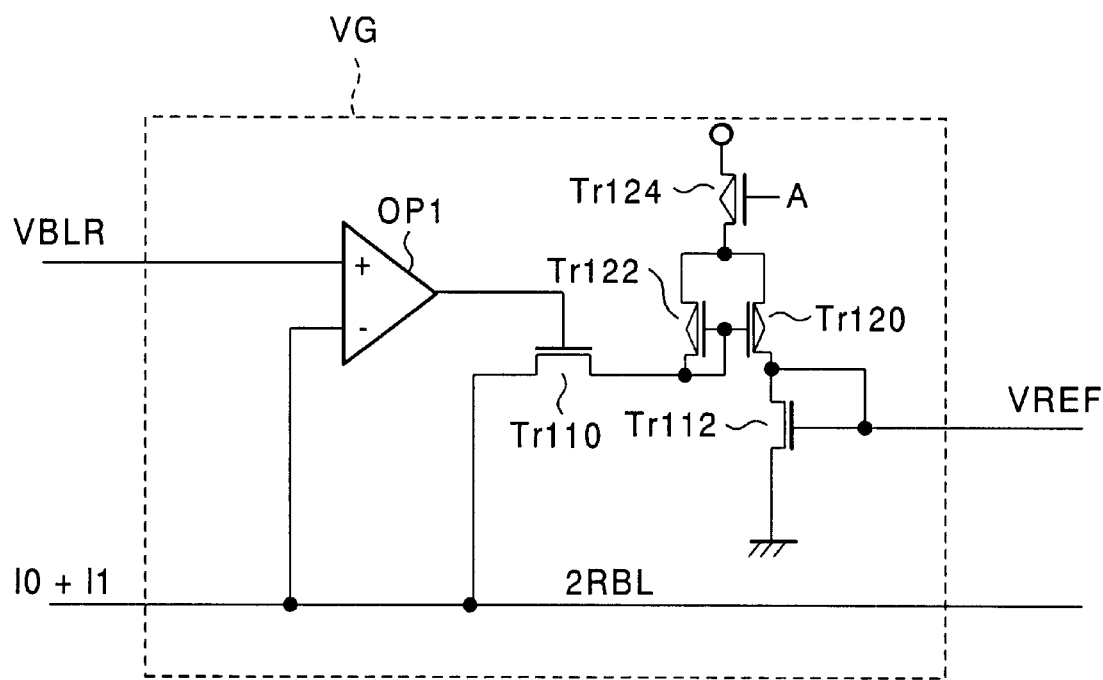
FIG. 8 is a diagram showing the configuration of a reference voltage generating circuit in FIG. 5.
Figure 9:
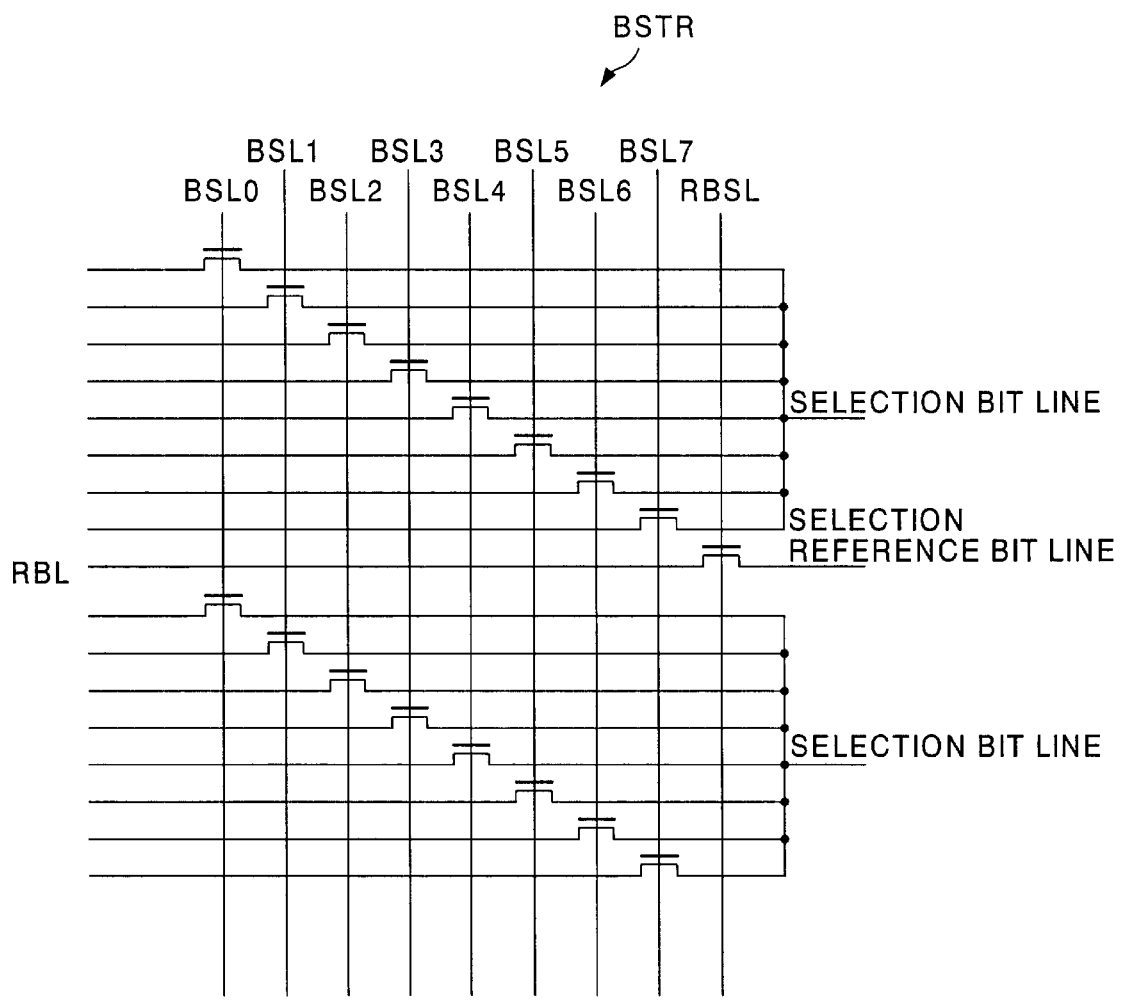
FIG. 9 is a diagram showing the configuration of a bit line selector in FIG. 5.
Figure 10:
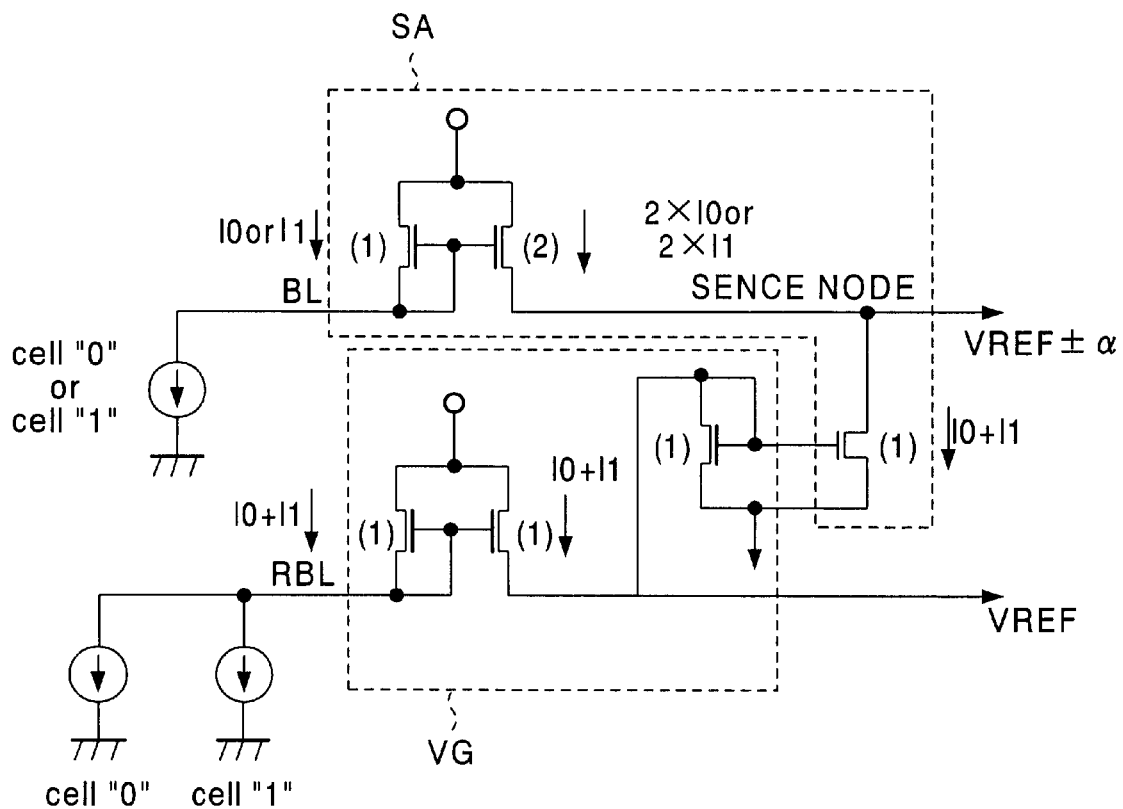
FIG. 10 is a diagram showing the principle of reading data in the cell array in FIG. 5.

As shown in FIG. 8, the reference voltage generating circuit VG is configured, including an operational amplifier OP1, N-type MISFETs Tr110 and Tr112 and P-type MISFETs Tr120, Tr122, and Tr124. As can be seen from FIG. 8 and FIG. 10, the current I0+I1 as the reference flows through the reference cells RC0 and RC1 via the MISFETs Tr122 and Tr110. This reference current I0+I1 flows through the Tr120 connected to the MISFET Tr122 by a current mirror, and outputted as the reference voltage VREF via the MISFET Tr112.

As shown in FIG. 7, the reference voltage VREF outputted from the reference voltage generating circuit VG is inputted to an operational amplifier OP2 of each of the sense amplifiers SA. Moreover, in this sense amplifier SA, the current I0 or I1 corresponding to data held in the selected memory cell MC flows through an N-type MISFET Tr130 and a P-type MISFET Tr132. The MISFET Tr132 is connected to a P-type MISFET Tr134 by a current mirror with a mirror ratio of 2. Consequently, a current which is double the read current flows into the MISFET Tr134. This read current becomes a read voltage VREF±α by passing through a MISFET Tr136, and it is then inputted to the operational amplifier OP2. In the operational amplifier OP2, data is recognized by comparing the reference voltage VREF with the read voltage VREF±α. The recognized data is outputted via a latch circuit LT and via data lines Q and BQ.

Incidentally, in a write sequence, as shown in FIG. 7, the write column selection signal line WCSL is driven high, and a MISFET Tr 104 is turned on. Hence, data in a data line D is written into the selected memory cell MC. Moreover, in a refresh sequence, a write back signal WB is driven high, and data held in the latch circuit LT is written back to the selected memory cell via an MISFET Tr106. When the reference cells RC0 and RC1 are refreshed, the reference cell refresh column signal line DWCSL is driven high, and a MISFET Tr108 is turned on. Therefore, the "0" data which is to be written back to the reference cell RC0 is written into the reference cell RC0 via the data line D, and the "1" data which is to be written back to the reference cell RC1 is written into the reference cell RC1 via the data line D.

As stated above, according to the semiconductor memory device according to this embodiment, since one sense amplifier SA is shared by two cell array blocks, the number of sense amplifiers SA in the entire semiconductor memory device can be reduced, whereby an area occupied by them can be reduced. Therefore, in this embodiment, the first bit lines 1BL connected to the respective memory cells MC are formed, and the bit line selectors 200 select one out the plural first bit lines 1BL and connect it to one second bit line 2BL1 or 2BL2. These second bit lines 2BL1 and 2BL2 are connected to the sense amplifiers SA respectively. Hence, for example, in FIG. 12, the sense amplifiers SA in the cell array block B0 and the cell array block B1 can be made common, and the sense amplifiers SA in the cell array block B2 and the cell array block B3 can be made common.

Likewise, since one reference voltage generating circuit VG is shared by two cell array blocks, the number of the reference voltage generating circuits VG in the entire semiconductor memory device can be reduced, whereby an area occupied by them can be reduced. Therefore, in this embodiment, the first reference bit lines 1RBL connected to the respective reference cells RC0 and RC1 are formed, and the bit line selectors 200 select one out the plural first reference bit lines 1RBL and connect it to one second reference bit line 2RBL1 or 2RBL2. For example, in FIG. 13, the reference voltage generating circuits VG in the cell array block B0 and the cell array block B1 can be made common, and the reference voltage generating circuits VG in the cell array block B2 and the cell array block B3 can be made common.

Besides, since the first bit lines 1BL are formed in the first wiring layer 210 and the second bit lines 2BL1 and 2BL2 are formed in the second wiring layer 220, when the second bit lines 2BL1 and 2BL2 are run to the sense amplifiers SA, an increase in cell area can be prevented. Moreover, since the first reference bit lines 1RBL are formed in the first wiring layer 210 and the second reference bit lines 2RBL1 and 2RBL2 are formed in the second wiring layer 220, when the second reference bit lines 2RBL1 and 2RBL2 are run to the reference voltage generating circuits VG, an increase in cell area can be prevented.

In addition, since the column selection lines (read column selection signal line RCSL, write column selection signal line WCSL, and reference cell refresh column signal line DWCSL) together with these second bit lines 2BL1 and 2BL2 and second reference bit lines 2RBL1 and 2RBL2 are formed in the second wiring layer 220, an increase in the number of wiring layers can be avoided.

Figure 15:
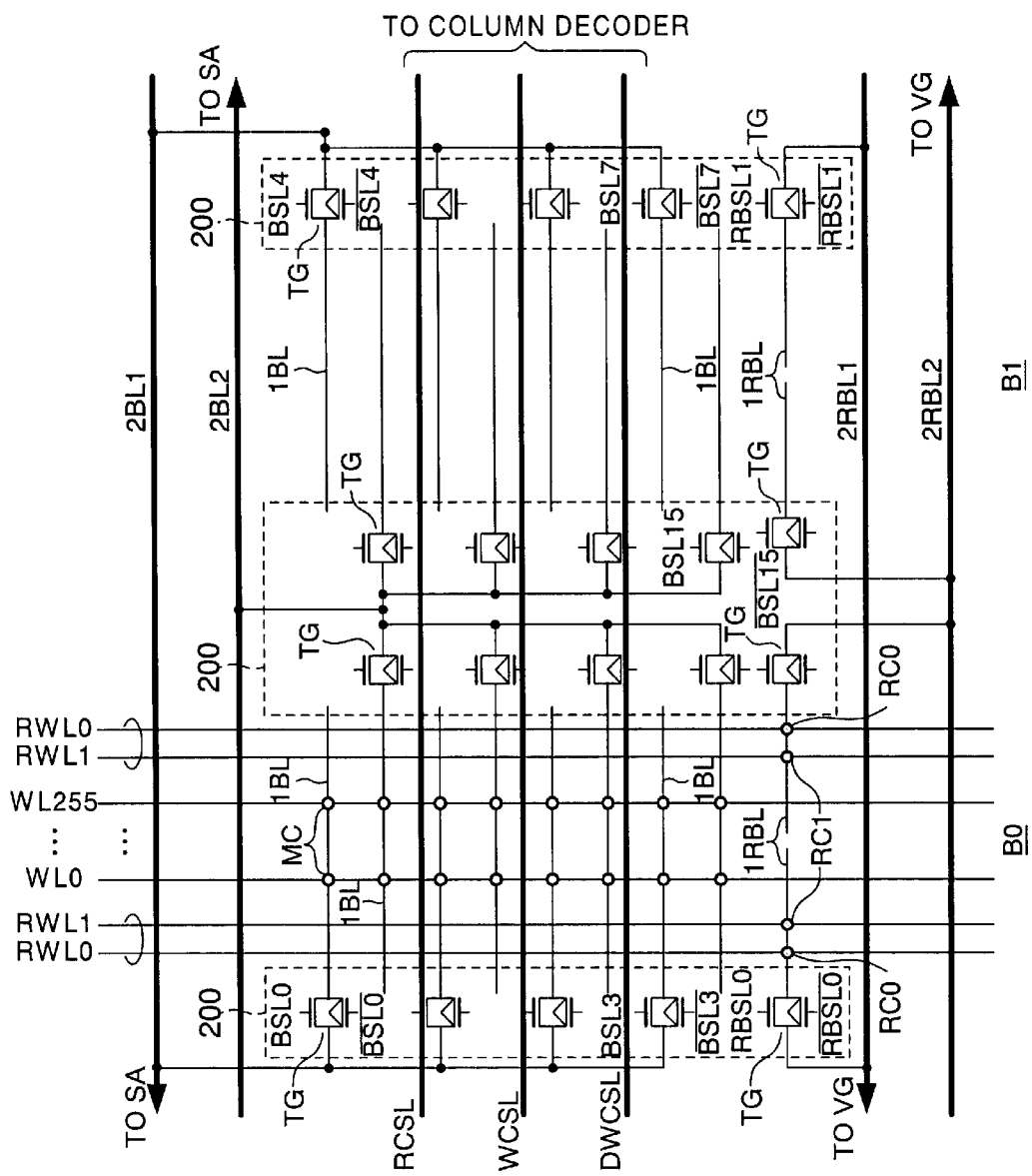
FIG. 15 is a diagram showing a modified example of the bit line selectors according to the first embodiment and corresponds to FIG. 13.

FIG. 15 is a diagram showing a modified example of the bit line selectors 200 in this embodiment, and corresponds to FIG. 13 described above. As shown in FIG. 15, in this modified example, in place of the N-type MISFETs TrN in FIG. 13, transfer gates TG are used as respective switching circuits which compose the bit line selectors 200. This transfer gate TG is configured by complementarily connecting an N-type MISFET and a P-type MISFET in parallel. To gate electrodes of the N-type MISFETs, similarly to FIG. 13, the bit line selection signals BSL0 to BSL15 and the reference bit line selection signals RBSL0 to RBSL3 are inputted, but to the P-type MISFETs, bit line selection signals /BSL0 to /BSL15 and reference bit line selection signals /RBSL0 to /RBSL3, which are obtained by inverting the above signals, are inputted.

In FIG. 13 described above, the bit line selection signals BSL0 to BSL15 and the reference bit line selection signals RBSL0 to RBSL3 are inputted to the gate electrodes of the N-type MISFETs TrN, and since these switching circuits are N-type MISFETs, a voltage higher than the voltages to be applied to the first bit lines 1BL and the first reference bit lines 1RBL by a threshold voltage Vth or higher is needed.

On the other hand, in the bit line selectors 200 in FIG. 15, the switching circuits are formed by the transfer gates TG, and hence high-level voltages of the bit line selection signals BSL0 to BSL15 and the reference bit line selection signals RBSL0 to RBSL3, and high-level voltages of the bit line selection signals /BSL0 to /BSL15 and the reference bit line selection signals /RBSL0 to /RBSL3 can be equalized to the voltages to be applied to the first bit lines 1BL and the first reference bit lines 1RBL. This contributes to a reduction in voltage used in the semiconductor memory device. Consequently, the reliability problem of high voltage application to peripheral circuits in the semiconductor memory device is mitigated, and power consumption of this semiconductor memory device can be reduced as well.

Second Embodiment

In the second embodiment, the number of the sense amplifiers SA and the number of the reference voltage generating circuits VG are further reduced by making the second bit lines 2BL1 and 2BL2 and the second reference bit lines 2RBL1 and 2RBL2 longer than those in the first embodiment.

Figure 16:
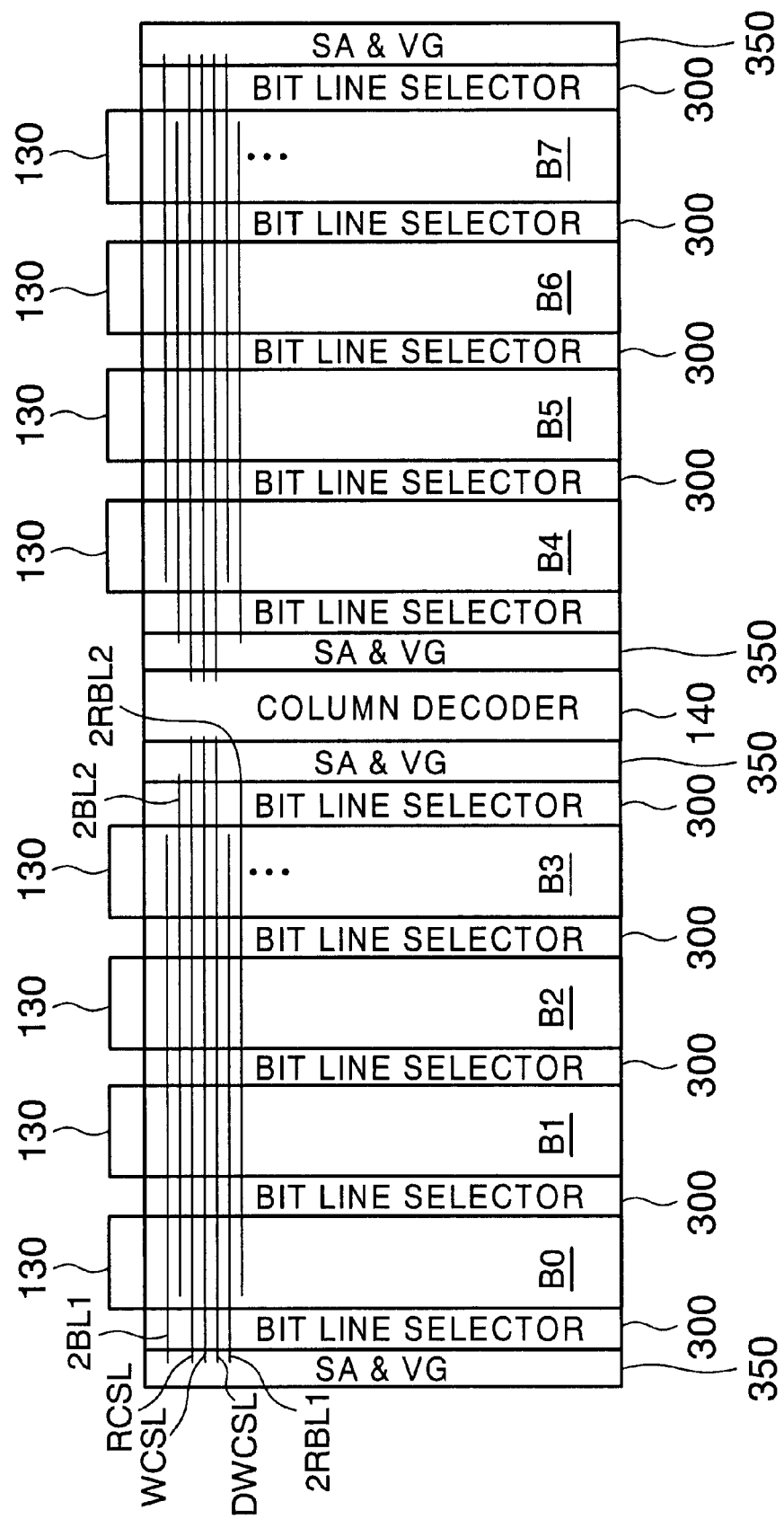
FIG. 16 is a diagram showing the layout of the entire cell array according to a second embodiment.
Figure 17:
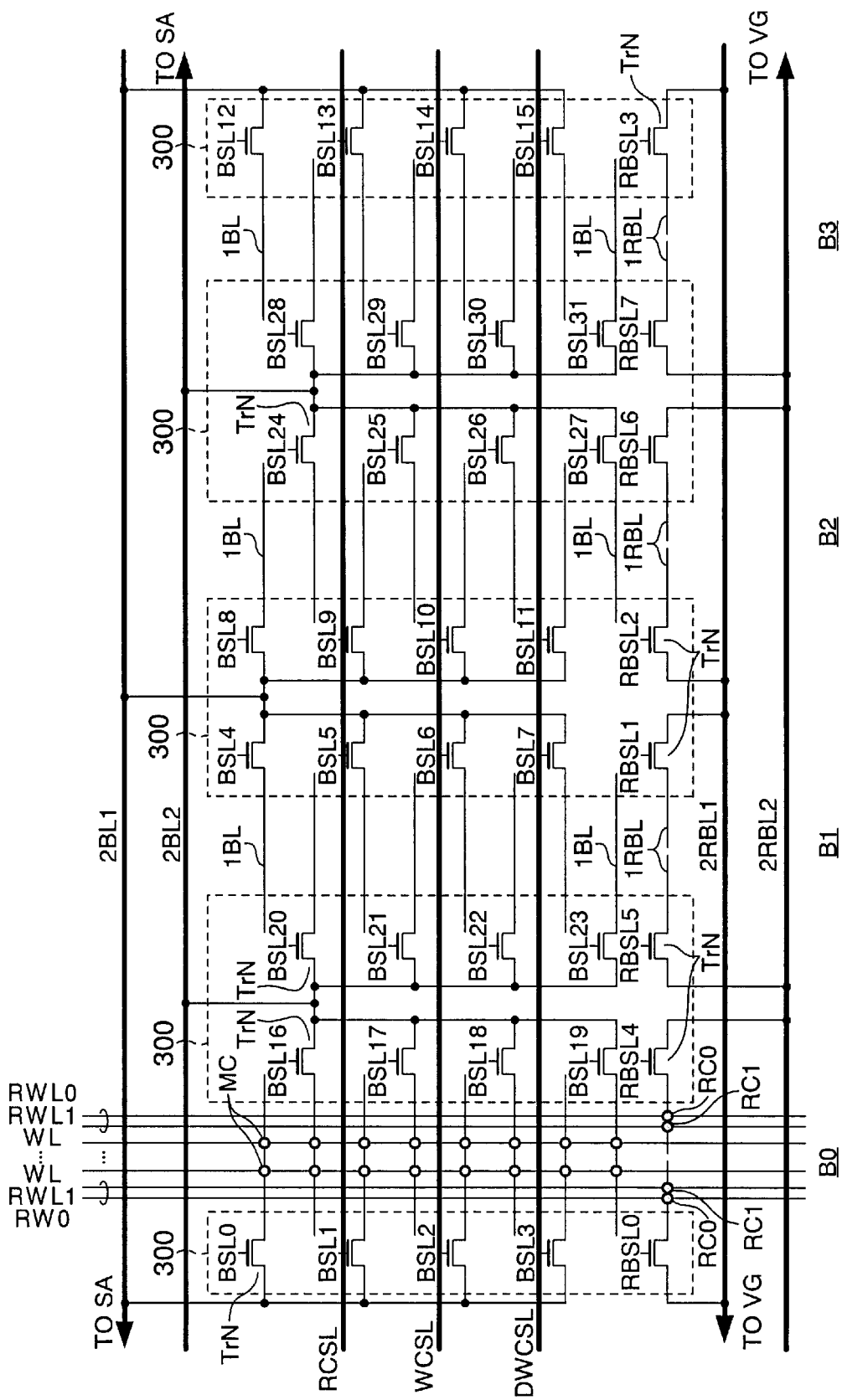
FIG. 17 is a diagram explaining the arrangement of respective memory cells, respective word lines, respective first bit lines, respective second bit lines, respective first reference bit lines, respective second reference bit lines, column selection lines, and bit line selectors in the second embodiment.

FIG. 16 is a diagram showing the entire layout of the cell array 100 according to the second embodiment. FIG. 17 is a diagram showing the configurations of bit line selectors 300 corresponding to two left and right sense amplifiers SA and two left and right reference voltage generating circuits VG, and a diagram showing the bit line selectors 300 in the cell array blocks B0 to B3. Incidentally, the sectional view of the first wiring layer 210 and the second wiring layer 220 in this embodiment is the same as that in FIG. 14 described above.

As shown in FIG. 16, the cell array 100 according to this embodiment is also divided into eight cell array blocks B0 to B7. The cell array 100 is configured, including one column decoder 140 and four systems of sense amplifiers SA and reference voltage generating circuits VG. In other words, four sense unit arranging regions 350 are provided in the cell array 100 according to this embodiment.

In this embodiment, two sense unit arranging regions 350 are provided for every four cell array blocks. The memory cell array 100 in this embodiment also adopts double end type bit line arrangement such as shown in FIG. 5.

As shown in FIG. 17, the first bit lines 1BL are connected to the drains of the memory cells MC arranged in the bit line direction in each of the cell array blocks. These first bit lines 1BL are connected to the second bit line 2BL1 or the second bit line 2BL2 via N-type MISFETs TrN which are provided alternately on both sides.

Bit line selection signals BSL0 to BSL31 are inputted to the gate electrodes of the MISFETs Tr connected to the first bit lines 1BL, and based on these bit line selection signals BSL0 to BSL31, one first bit line 1BL is connected to the second bit line 2BL1 and one first bit line 1BL is connected to the second bit line 2BL2. More specifically, by driving any one of the bit line selection signals BSL0 to BSL15 high, one first bit line 1BL is connected to one second bit line 2BL1. By driving any one of the bit line selection signals BSL16 to BSL31 high, one first bit line 1BL is connected to the second bit line 2BL2.

As shown in FIG. 16, the second bit line 2BL1 is formed across four cell array blocks and inputted to the left sense amplifier SA. The second bit line 2BL2 is also formed across the four cell array blocks, and inputted to the right sense amplifier SA. Therefore, cell currents flowing through the second bit line 2BL1 and 2BL2 are sensed by the left and right sense amplifier SA, and data is read.

As shown in FIG. 17, the first reference bit lines 1RBL extending in the bit line direction in the respective cell array blocks are connected to the second reference bit line 2RBL1 or the second reference bit line 2RBL2 via N-type MISFETs TrN. Reference bit line selection signals RBSL0 to RBSL7 are inputted to gate electrode of the MISFETs TrN connected to the first reference bit lines 1RBL. Thus, by driving any one of the reference bit line selection signals RBSL0 to RBSL3 high, one first reference bit line 1RBL is connected to one second reference bit line 2RBL1, and by driving any one of the reference bit line selection signals RBSL4 to RBSL7 high, one first reference bit line 1RBL is connected to one second reference bit line 2RBL2.

As shown in FIG. 16, the second reference bit line 2RBL1 is formed across four cell array blocks, and inputted to the left reference voltage generating circuit VG. The second reference bit line 2RBL2 is also formed across the four cell array blocks, and inputted to the right reference voltage generating circuit VG. Hence, reference currents flowing through the second reference bit lines 2RBL1 and 2RBL2 are inputted to the left and right reference voltage generating circuits VG and used for generating the reference voltage VREF. In this embodiment, plural such units are arranged in the word line direction with four cell array blocks as a unit. The configuration of each of the reference voltage generating circuits VG is the same as that in FIG. 8 described above.

As shown in FIG. 16, the read column selection signal line RCSL, the write column selection signal line WCSL, and the reference cell refresh column signal line DWCSL extend rightward and leftward from the column decoder 140. These read column selection signal line RCSL, write column selection signal line WCSL, and reference cell refresh column signal line DWCSL are inputted in common to each of the sense amplifiers SA. The configuration of each of the sense amplifiers SA is the same as that in FIG. 7 described above.

A read sequence, a write sequence, and a refresh sequence in a semiconductor memory device according to this embodiment are the same as those in the aforementioned first embodiment except that they are performed with four cell array blocks (B0 to B3, B4 to B7) as a unit. Namely, in the read sequence, the row decoders and word line drivers 130 drive one word line WL high in four cell array blocks (B0 to B3, B4 to B7). The bit line selectors 300 select one first bit line 1BL from the four cell array blocks (B0 to B3, B4 to B7) and connect it to the second bit line 2BL1, and select one first bit line 1BL and connect it to the second bit line 2BL2.

As stated above, according to the semiconductor memory device according to this embodiment, the number of the sense amplifiers SA and the number of the reference voltage generating circuits VG in the entire semiconductor memory device can be reduced further than that in the aforementioned first embodiment. Hence, in this embodiment, the second bit lines 2BL1 and 2BL2 and the second reference bit lines 2RBL1 and 2RBL2 which are run across the four cell array blocks are formed. Consequently, for example, in FIG. 17, the sense amplifiers SA in the cell array blocks B0 to B3 can be made common. Moreover, the reference voltage generating circuits VG in the cell array blocks B0 to B3 can be made common.

Figure 18:
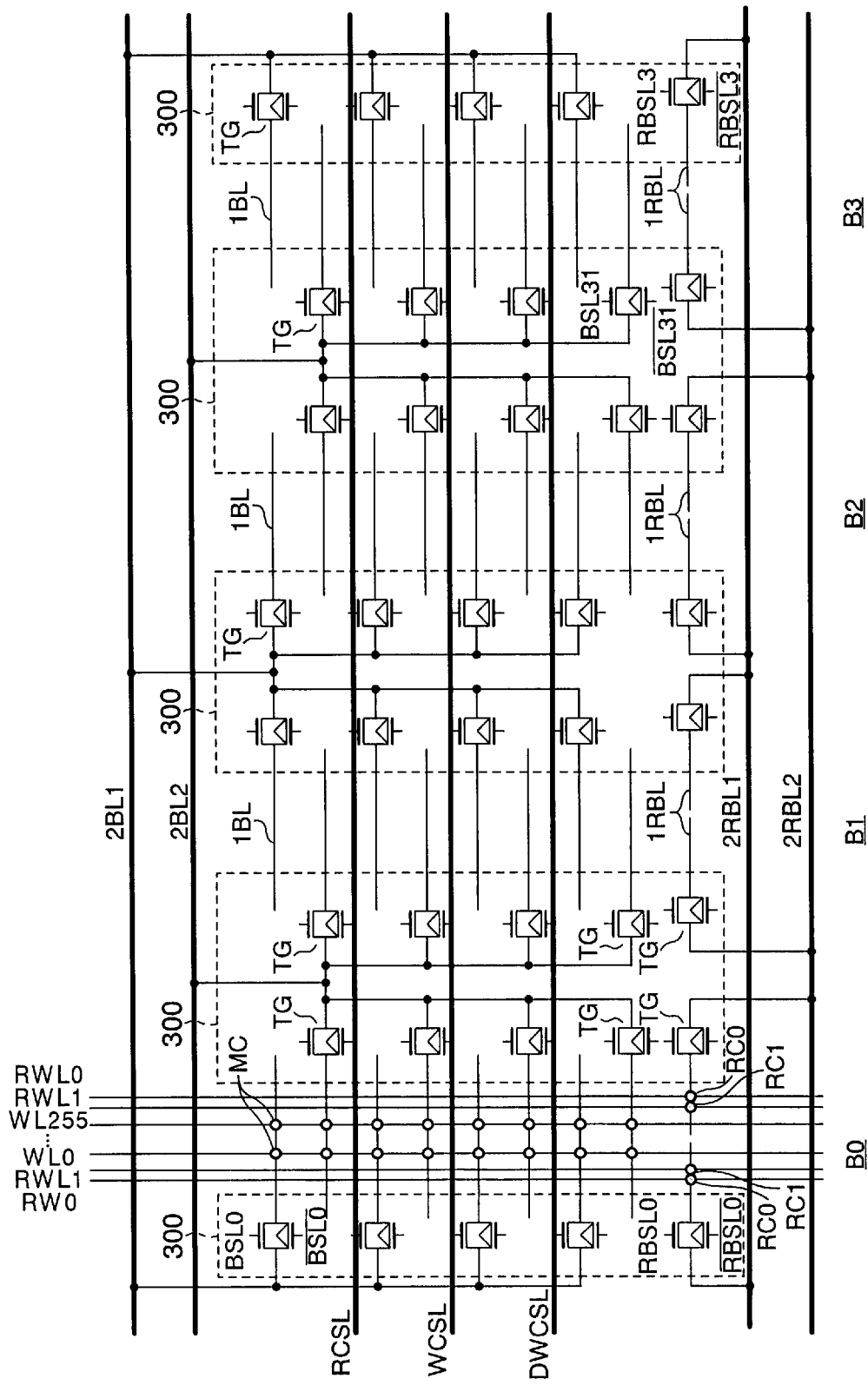
FIG. 18 is a diagram showing a modified example of the bit line selectors according to the second embodiment and corresponds to FIG. 17.

FIG. 18 is a diagram showing a modified example of the bit line selectors 300 in this embodiment, and corresponds to FIG. 17 described above. As shown in FIG. 18, in this modified example, in place of the N-type MISFETs TrN in FIG. 17, transfer gates TG are used as switching circuits. This transfer gate TG is configured by complementarily connecting an N-type MISFET and a P-type MISFET in parallel. To gate electrodes of the N-type MISFETs, similarly to FIG. 17, the bit line selection signals BSL0 to BSL31 and the reference bit line selection signals RBSL0 to RBSL7 are inputted, but to the P-type MISFETs, bit line selection signals /BSL0 to /BSL31 and reference bit line selection signals /RBSL0 to /RBSL7, which are obtained by inverting the above signals, are inputted.

Consequently, as described in the first embodiment, high-level voltages of the bit line selection signals BSL0 to BSL31 and the reference bit line selection signals RBSL0 to RBSL7, and high-level voltages of the bit line selection signals /BSL0 to /BSL31 and the reference bit line selection signals /RBSL0 to /RBSL7 can be equalized to the voltages to be applied to the first bit lines 1BL and the first reference bit lines 1RBL. This contributes to a reduction in voltage used in the semiconductor memory device. Consequently, the reliability problem of high voltage application to peripheral circuits in the semiconductor memory device is mitigated, and power consumption of this semiconductor memory device can be reduced as well.

Third Embodiment

Figure 11:
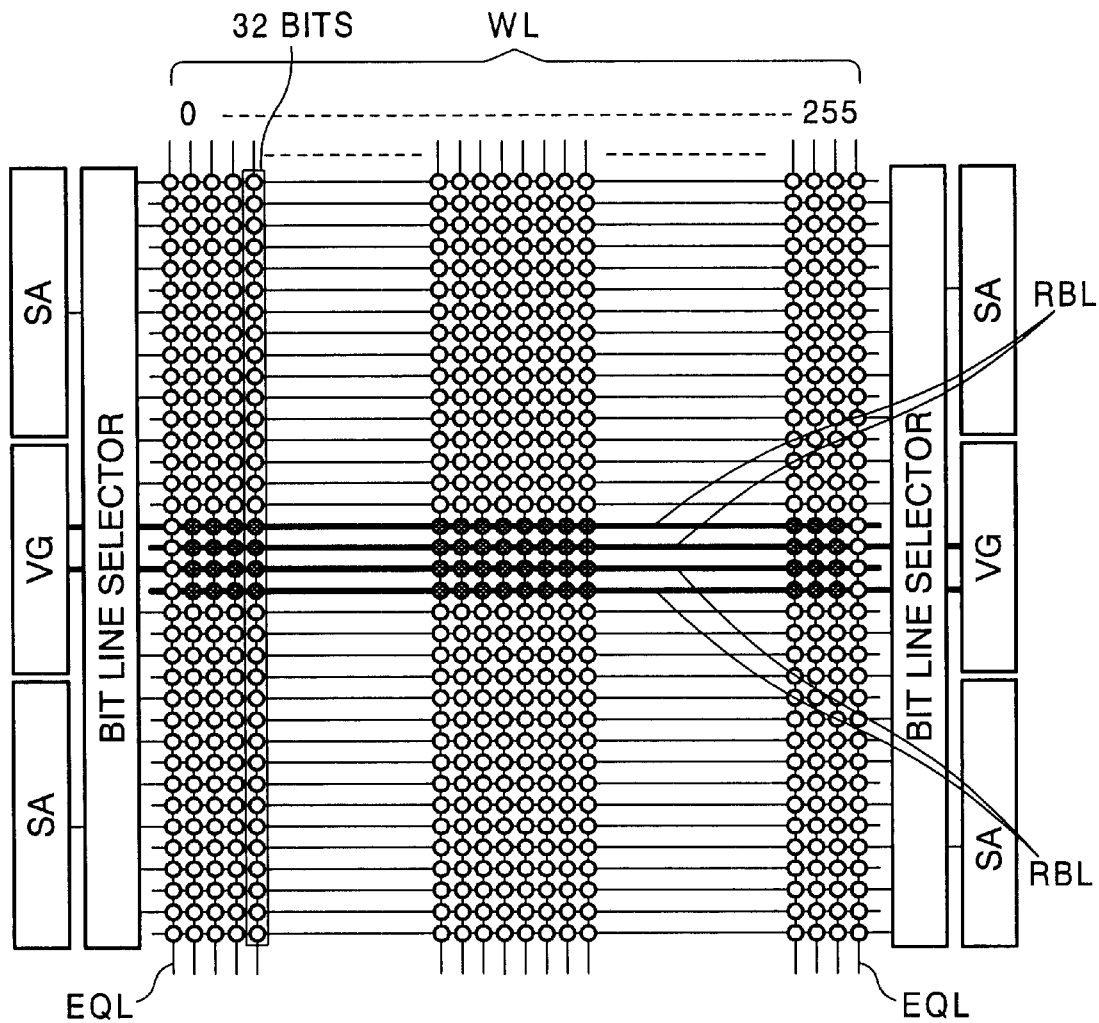
FIG. 11 is a diagram showing the arrangement of memory cells in a cell array with another structure.

In the aforementioned first embodiment, data in the memory cell MC is read on a read principle in FIG. 5 in the layout of the cell array 100 shown in FIG. 12, whereas in this third embodiment, the data in the memory cell MC is read on a read principle in FIG. 11 in the layout of the cell array 100 shown in FIG. 12.

Figure 19:
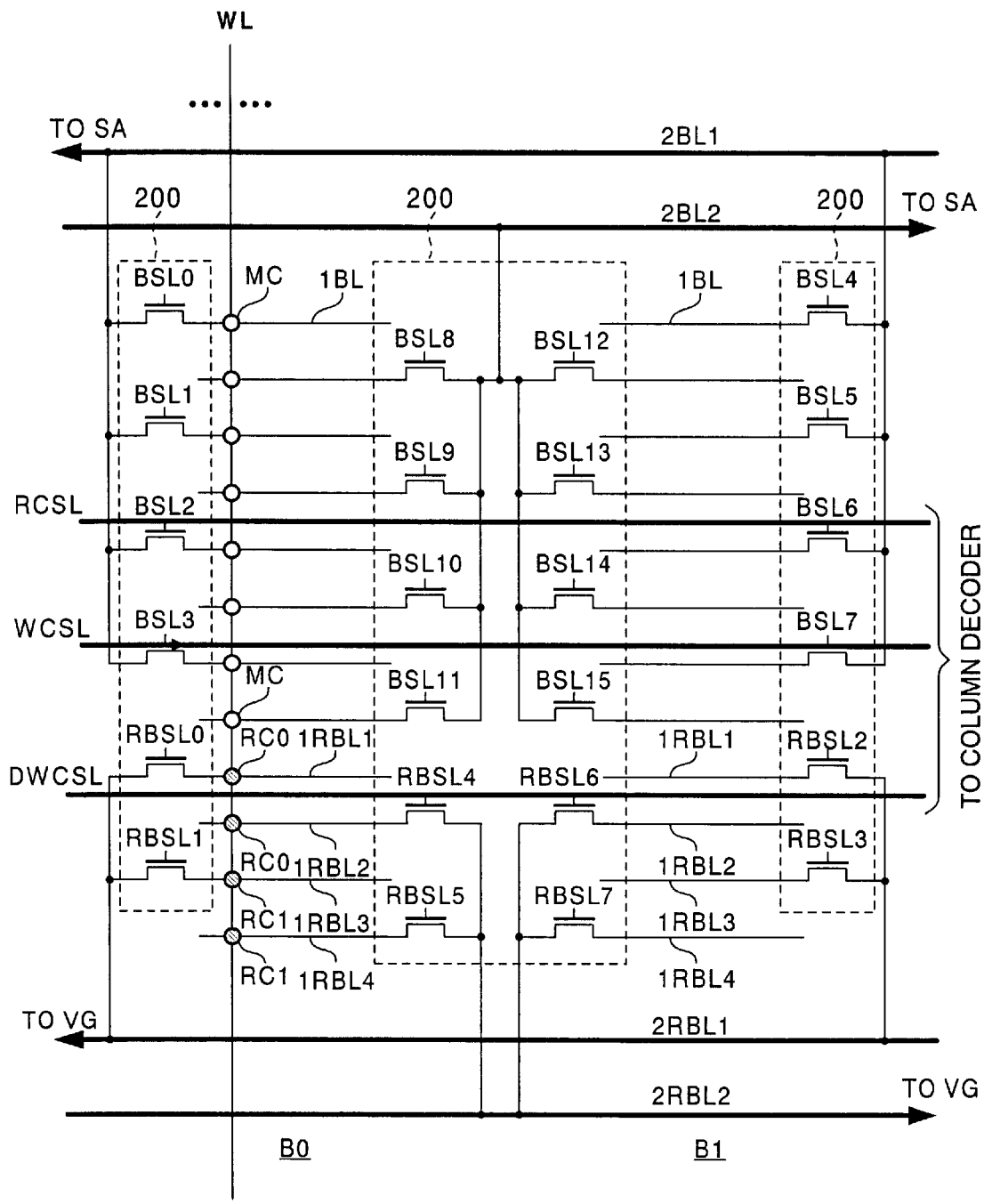
FIG. 19 is a diagram explaining the arrangement of respective memory cells, respective word lines, respective first bit lines, respective second bit lines, respective first reference bit lines, respective second reference bit lines, column selection lines, and bit line selectors in a third embodiment.
Figure 20:
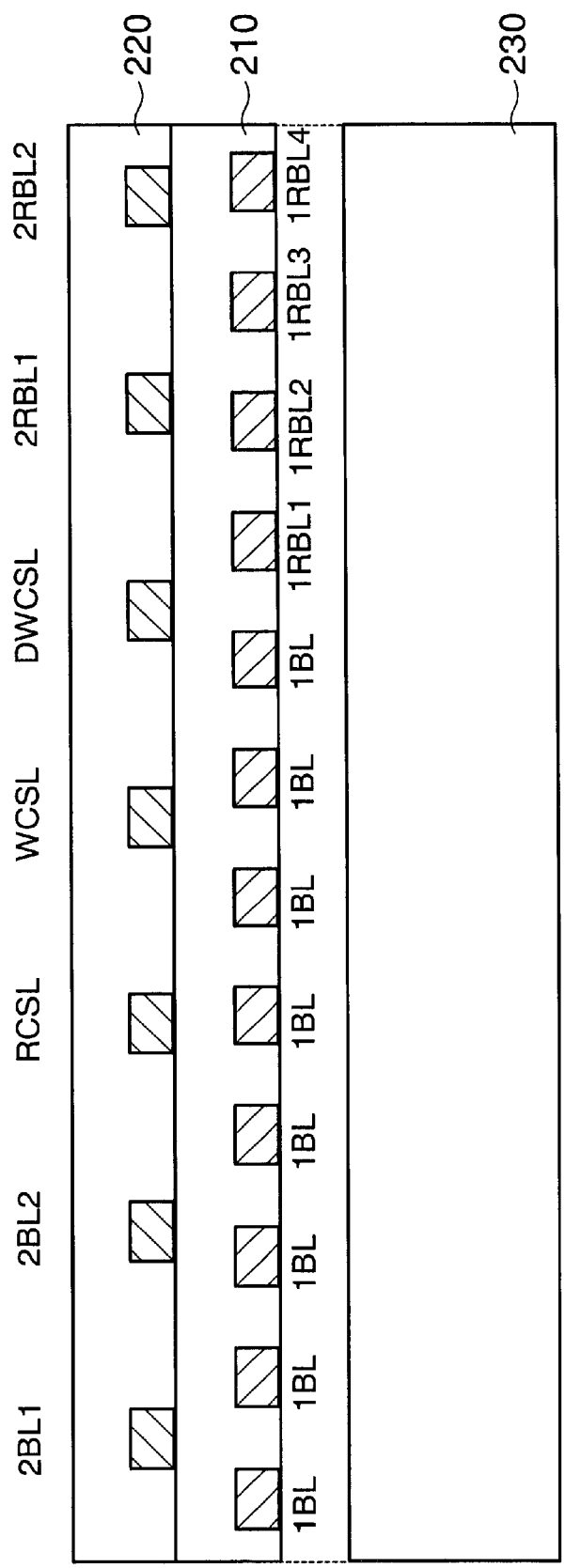
FIG. 20 is a sectional view explaining the structures of a first wiring layer and a second wiring layer corresponding to two left and right sense amplifiers and two left and right reference voltage generating circuits in the third embodiment.

FIG. 19 is a diagram showing the configurations of the bit line selectors 200 corresponding to two left and right sense amplifiers SA and two left and right reference voltage generating circuits VG according to this embodiment, and FIG. 20 is a partial sectional view of a semiconductor memory device according to this embodiment. The entire layout of the cell array 100 according to this embodiment is the same as that in FIG. 12.

As shown in FIG. 20, the semiconductor memory device according to this embodiment is different from that according to the first embodiment in that four first reference bit lines 1RBL1 to 1RBL4 in addition to eight first bit lines 1BL are formed in the first wiring layer 210.

Moreover, as shown in FIG. 19, in the cell array 100 according to this embodiment, reference cells are provided at intersection points of respective word lines WL and the first reference bit lines 1RBL1 to 1RBL4. In other words, four reference cells are connected to each of the word lines WL. More specifically, gate electrodes of four reference cells (two RC0's and two RC1's) are connected to each of the word lines WL. Although one word line WL is shown as a representative, in actuality, plural word lines WL are arranged in one cell array block. For example, in this embodiment, similarly to FIG. 11, 256 word lines WL are provided in one cell array block.

When one word line is selected and driven by the row decoder and word line driver 130 provided in each of the cell array blocks, four reference cells RC0, RC0, RC1, and RC1 are also driven. The two reference cells RC0's are cells in which the "0" data is stored, and the two reference cells RC1's are cells in which the "1" data is stored.

The first reference bit line 1RBL1 is connected in common to drains of the one group of reference cells RC0's which are provided in word lines and arranged in the bit line direction. This first reference bit line 1RBL1 is connected to the second reference bit line 2RBL1 via a MISFETs TrN provided in the bit line selector 200. The first reference bit line 1RBL2 is connected in common to drains of the other group of reference cells RC0's which are provided in the respective word lines and arranged in the bit line direction. This first reference bit line 1RBL2 is connected to the second reference bit line 2RBL2 via a MISFET TrN provided in the bit line selector 200.

The first reference bit line 1RBL3 is connected in common to drains of the one group of reference cells RC1's which are provided in the respective word lines and arranged in the bit line direction. This first reference bit line 1RBL3 is connected to the second reference bit line 2RBL1 via a MISFET TrN provided in the bit line selector 200. The first reference bit line 1RBL4 is connected in common to drains of the other of reference cells RC1's which are provided in the respective word lines and arranged in the bit line direction. This first reference bit line 1RBL4 is connected to the second reference bit line 2RBL2 via a MISFET TrN provided in the bit line selector 200.

In this embodiment, the second reference bit lines 2RBL1 and 2RBL2 are formed across two cell array blocks, the second reference bit line 2RBL1 is inputted to the left reference voltage generating circuit VG, and the second reference bit line 2RBL2 is inputted to the right reference voltage generating circuit VG.

Reference bit line selection signals RBSL0 to RBSL7 are inputted to gate electrodes of N-type MISFETs TrN connected to the first reference bit lines 1RBL1 to 1RBL4. Based on the reference bit line selection signals RBSL0 to RBSL7, a pair of the first reference bit lines 1RBL1 and 1RBL3 are connected to one second reference bit line 2RBL1, and a pair of the first reference bit lines 1RBL2 and 1RBL4 are connected to the second reference bit line 2RBL2.

More specifically, by driving a pair of the reference bit line selection signals RBSL0 and RBSL1 or a pair of the reference bit line selection signals RBSL2 and RBSL3 high, the current I0+I1 which is obtained by adding the cell I0 current corresponding to the "0" data and the cell current I1 corresponding to the "1" data flows through the second reference bit line 2RBL1. Then, this current I1+I0 is inputted to the left reference voltage generating circuit VG, and thereby the reference voltage VREF is generated.

Concurrently with the above, by driving a pair of the reference bit line selection signals RBSL4 and RBSL5 or a pair of the reference bit line selection signals RBSL6 and RBSL7 high, the current I0+I1 which is obtained by adding the cell I0 current corresponding to the "0" data and the cell current I1 corresponding to the "1" data flows through the second reference bit line 2RBL2. Then, this current I1+I0 is inputted to the right reference voltage generating circuit VG, and thereby the reference voltage VREF is generated.

It should be noted that a read sequence, a write sequence, and a refresh sequence in the semiconductor memory device according to this embodiment are the same as those in the aforementioned first embodiment.

As stated above, also in the semiconductor memory device according to this embodiment, similarly to the aforementioned first embodiment, one sense amplifier SA and one reference voltage generating circuit VG are shared by two cell array blocks, whereby the number of the sense, amplifiers SA and the number of the reference voltage generating circuits VG in the entire semiconductor memory device can be reduced.

Besides, the distance between the memory cell MC from which data is to be read and the reference cells RC0 and RC1 used in this read sequence can be limited to a predetermined distance. Hence, variations in cell characteristics due to a manufacturing process and variations in cell characteristics due to operating temperature conditions can be made to have the same tendency. This makes it possible to precisely compensate for these variations as common mode noise. Moreover, in the read sequence, it is required to activate only one normal word line WL, and thereby a reduction in power consumption in the read sequence can be realized.

Figure 21:
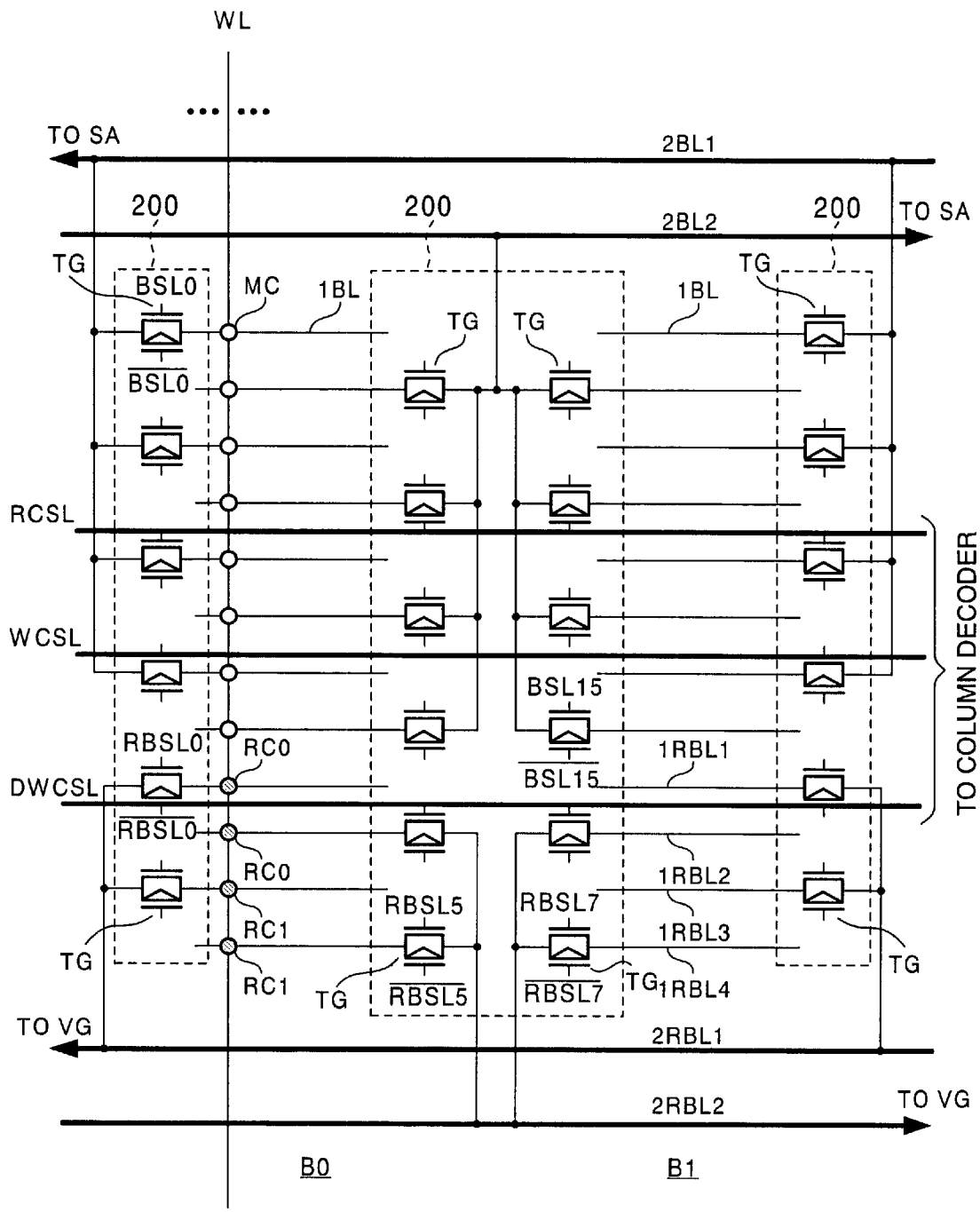
FIG. 21 is a diagram showing a modified example of the bit line selectors according to the third embodiment and corresponds to FIG. 20.

FIG. 21 is a diagram showing a modified example of the bit line selectors 200 in this embodiment, and corresponds to FIG. 19 described above. As shown in FIG. 21, in this modified example, in place of the N-type MISFETs TrN in FIG. 19, transfer gates TG are used as switching circuits composing the bit line selectors 200. This transfer gate TG is configured by complementarily connecting an N-type MISFET and a P-type MISFET in parallel. To gate electrodes of the N-type MISFETs, similarly to FIG. 19, the bit line selection signals BSL0 to BSL15 and the reference bit line selection signals RBSL0 to RBSL7 are inputted, but to the P-type MISFETs, bit line selection signals /BSL0 to /BSL15 and reference bit line selection signals /RBSL0 to /RBSL7, which are obtained by inverting the above signals, are inputted.

Consequently, as described in the first embodiment, high-level voltages of the bit line selection signals BSL0 to BSL15 and the reference bit line selection signals RBSL0 to RBSL7, and high-level voltages of the bit line selection signals /BSL0 to /BSL15 and the reference bit line selection signals /RBSL0 to /RBSL7 can be equalized to the voltages to be applied to the first bit lines 1BL and the first reference bit lines 1RBL1 to 1RBL4. This contributes to a reduction in voltage used in the semiconductor memory device. Consequently, the reliability problem of high voltage application to peripheral circuits in the semiconductor memory device is mitigated, and power consumption of this semiconductor memory device can be reduced as well.

Fourth Embodiment

In the aforementioned second embodiment, the data in the memory cell MC is read on the read principle in FIG. 5 in the layout of the cell array 100 shown in FIG. 16, whereas in this fourth embodiment, the data in the memory cell MC is read on the read principle in FIG. 11 in the layout of the cell array 100 shown in FIG. 16.

Figure 22:
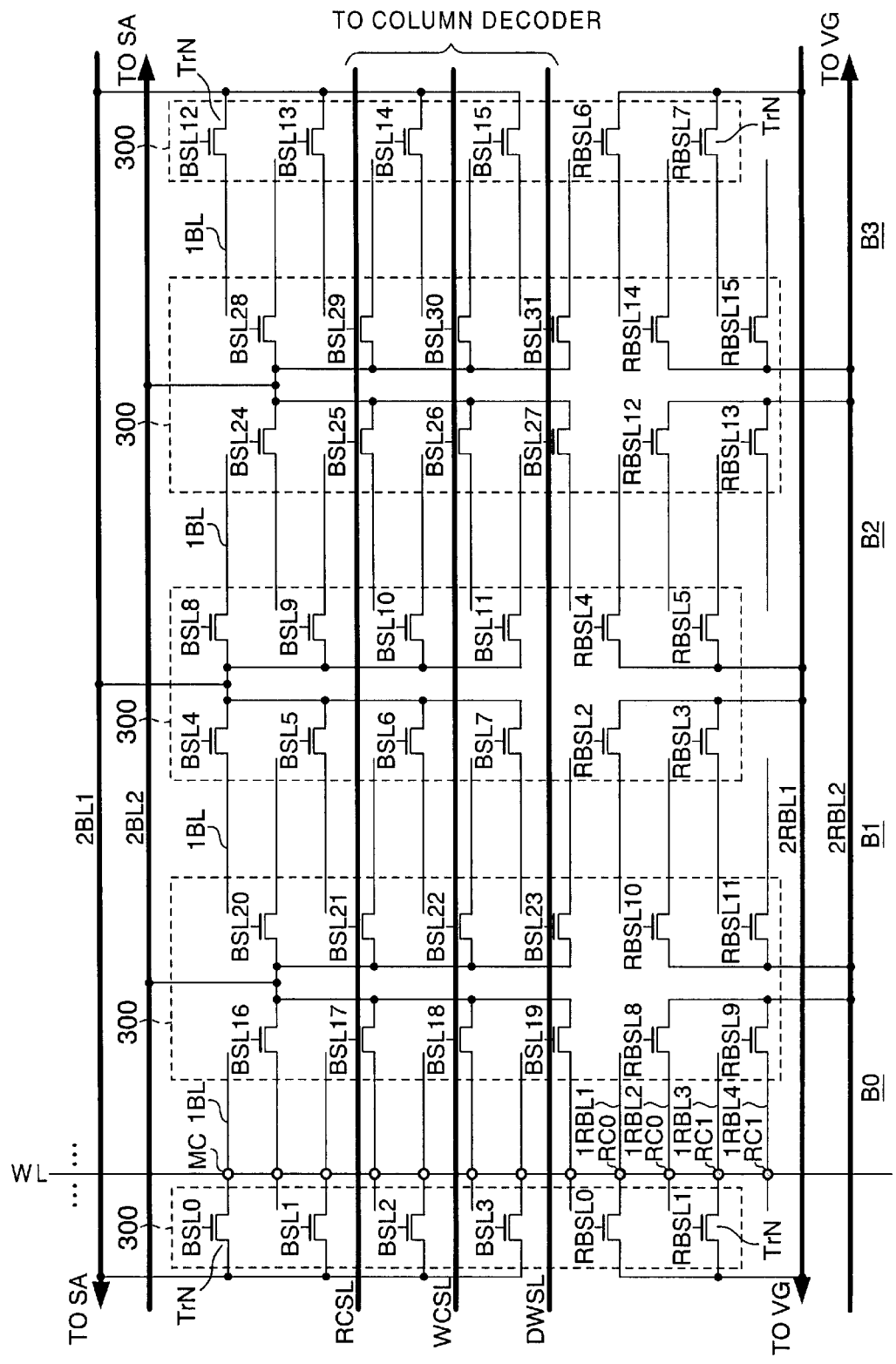
FIG. 22 is a diagram explaining the arrangement of respective memory cells, respective word lines, respective first bit lines, respective second bit lines, respective first reference bit lines, respective second reference bit lines, column selection lines, and bit line selectors in a fourth embodiment.

FIG. 22 is a diagram showing the configurations of the bit line selectors 300 corresponding to two left and right sense amplifiers SA and two left and right reference voltage generating circuits VG according to this embodiment. It should be noted that the sectional view of the first wiring layer 210 and the second wiring layer 220 of a semiconductor memory device according to this embodiment is the same as that in FIG. 20, and the entire layout of the cell array 100 according to this embodiment is the same as that in FIG. 16.

In the fourth embodiment, the number of the sense amplifiers SA and the number of the reference voltage generating circuits VG are further reduced by making the second bit lines 2BL1 and 2BL2 and the second reference bit lines 2RBL1 and 2RBL2 longer than those in the third embodiment.

In this embodiment, similarly to the second embodiment, two sense amplifiers SA and two reference voltage generating circuits VG are provided for four cell array blocks. The memory cell array 100 in this embodiment also adopts double end type bit line arrangement such as shown in FIG. 5.

As shown in FIG. 22 and FIG. 16, the second bit line 2BL1 is formed across four cell array blocks, and inputted to the left sense amplifier SA. The second bit line 2BL2 is also formed across the four cell array blocks, and inputted to the right sense amplifier SA. Therefore, cell currents flowing through the second bit lines 2BL1 and 2BL2 are sensed by the left and right sense amplifiers SA, and data is read.

As shown in FIG. 22, the first reference bit lines 1RBL1 to 1RBL4, which extend in the bit line direction in the respective cell array blocks, are connected to the second reference bit line 2RBL1 or the second reference bit line 2RBL2 via N-type MISFETs TRN. Reference bit line selection signals RBSL0 to RBSL15 are inputted to gate electrodes of the MISFETs TrN connected to these first reference bit lines 1RBL1 to 1RBL4. Hence, by driving any pair of the reference bit line selection signal RBSL0 and RBSL1, the reference bit line selection signals RBSL2 and RBSL3, the reference bit line selection signals RBSL4 and RBSL5, or the reference bit line selection signals RBSL6 and RBSL7 high, a pair of first reference bit lines (for example, 1RBL1 and 1RBL3) are connected to one second reference bit line 2RBL1. Moreover, by driving any pair of the reference bit line selection signals RBSL8 and RBSL9, the reference bit line selection signals RBSL10 and RBSL11, the reference bit line selection signals RBSL12 and RBSL13, or the reference bit line selection signals RBSL14 and RBSL15 high, a pair of first reference bit lines (for example, 1RBL2 and 1RBL4) are connected to one second reference bit line 2RBL2.

The second reference bit line 2RBL1 is formed across four cell array blocks, and inputted to the left reference voltage generating circuit VG. The second reference bit line 2RBL2 is also formed across the four cell array blocks, and inputted to the right reference voltage generating circuit VG. Hence, the currents I0+I1 flowing through the second reference bit lines 2RBL1 and 2RBL2 are inputted to the left and right reference voltage generating circuits VG and used for generating the reference voltage VREF. In this embodiment, plural such units are arranged in the word line direction with four cell array blocks as a unit.

Incidentally, a read sequence, a write sequence, and a refresh sequence in the semiconductor memory device according to this embodiment are the same as those in the aforementioned second embodiment.

As stated above, according to the semiconductor memory device according to this embodiment, the number of the sense amplifiers SA and the number of the reference voltage generating circuits VG in the entire semiconductor memory device can be reduced further than that in the aforementioned third embodiment.

Figure 23:
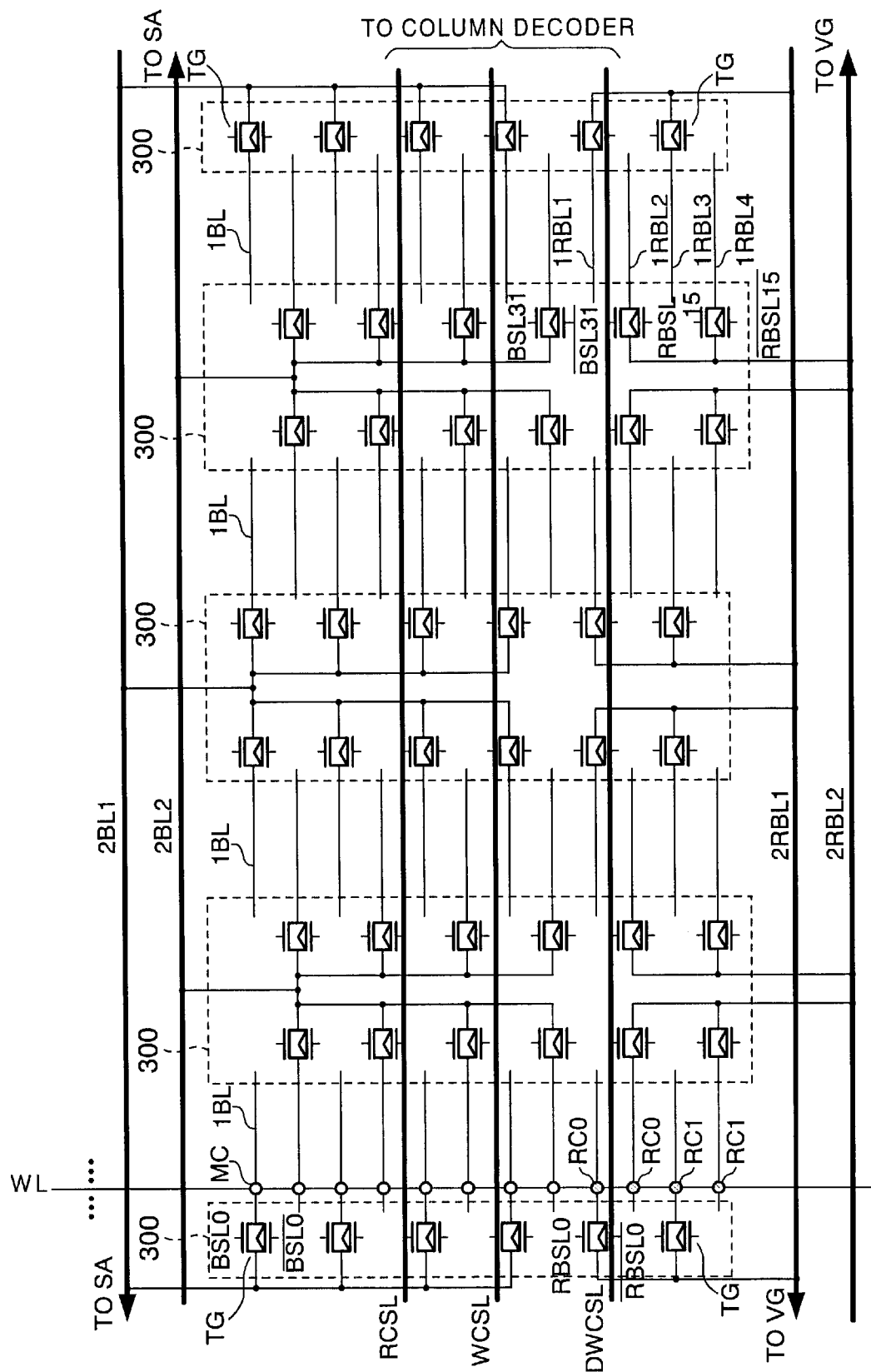
FIG. 23 is a diagram showing a modified example of the bit line selectors according to the fourth embodiment and corresponds to FIG. 22.

FIG. 23 is a diagram showing a modified example of the bit line selectors 300 in this embodiment, and corresponds to FIG. 22 described above. As shown in FIG. 23, in this modified example, in place of the N-type MISFETs TrN in FIG. 22, transfer gates TG are used as respective switching circuits composing the bit line selectors 300. This transfer gate TG is configured by complementarily connecting an N-type MISFET and a P-type MISFET in parallel. To gate electrodes of the N-type MISFETs, similarly to FIG. 22, the bit line selection signals BSL0 to BSL31 and the reference bit line selection signals RBSL0 to RBSL15 are inputted, but to the P-type MISFETs, bit line selection signals /BSL0 to /BSL31 and reference bit line selection signals /RBSL0 to /RBSL15, which are obtained by inverting the above signals, are inputted.

Consequently, as described in the first embodiment, high-level voltages of the bit line selection signals. BSL0 to BSL31 and the reference bit line selection signals RBSL0 to RBSL15, and high-level voltages of the bit line selection signals /BSL0 to /BSL31 and the reference bit line selection signals /RBSL0 to /RBSL15 can be equalized to the voltages to be applied to the first bit lines 1BL and the first reference bit lines 1RBL1 to 1RBL4. This contributes to a reduction in voltage used in the semiconductor memory device. Consequently, the reliability problem of high voltage application to peripheral circuits in the semiconductor memory device is mitigated, and power consumption of this semiconductor memory device can be reduced as well.

Fifth Embodiment

In the aforementioned first to fourth embodiments, as shown in FIG. 12 and FIG. 16, the column decoder 140 is placed in the central portion of the cell array 100, and the sense unit arranging regions 250 or 350 are arranged at least on both sides on one side of cell array 100 divided into two portions by the column decoder 140. Therefore, the sense amplifiers SA and the reference voltage generating circuits VG are arranged on the left and right sides of the cell array 100, and since it is necessary to connect the column selection lines (read column selection signal line RCSL, write column selection signal line WCSL, and reference cell refresh column signal line DWCSL) from the column decoder 140 to the sense amplifiers SA, these column selection lines need to be provided in the bit line direction on the cell array 100.

Thus, in the fifth embodiment, by adopting arrangement which allows the sense unit arranging regions to be unified at the same place, it becomes unnecessary to run the column selection lines on the cell array 100. Further details will be explained below.

Figure 24:
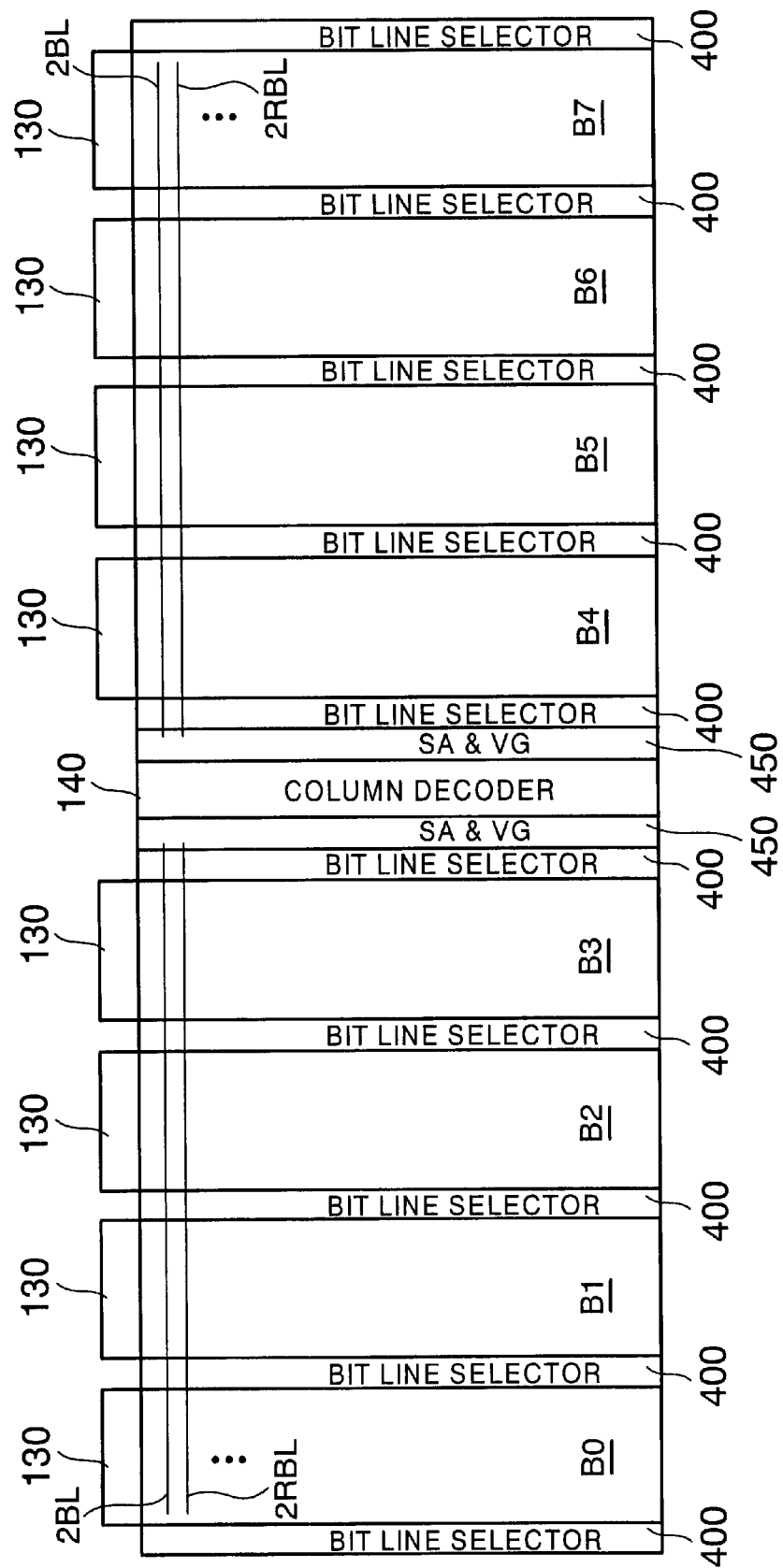
FIG. 24 is a diagram showing the layout of the entire cell array according to a fifth embodiment.
Figure 25:
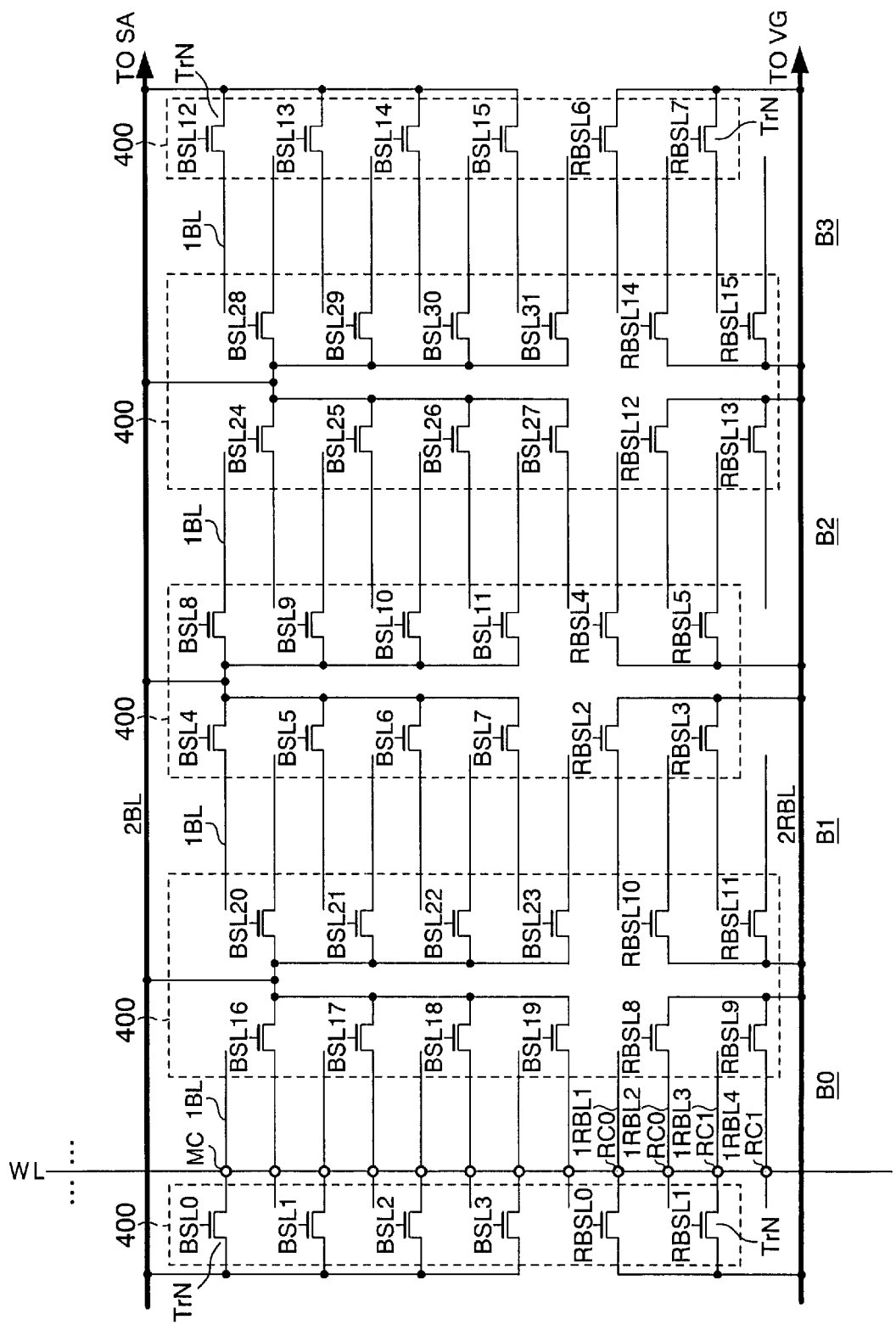
FIG. 25 is a diagram explaining the arrangement of respective memory cells, respective word lines, respective first bit lines, a second bit line, respective first reference bit lines, a second reference bit line, and bit line selectors in the fifth embodiment.
Figure 26:
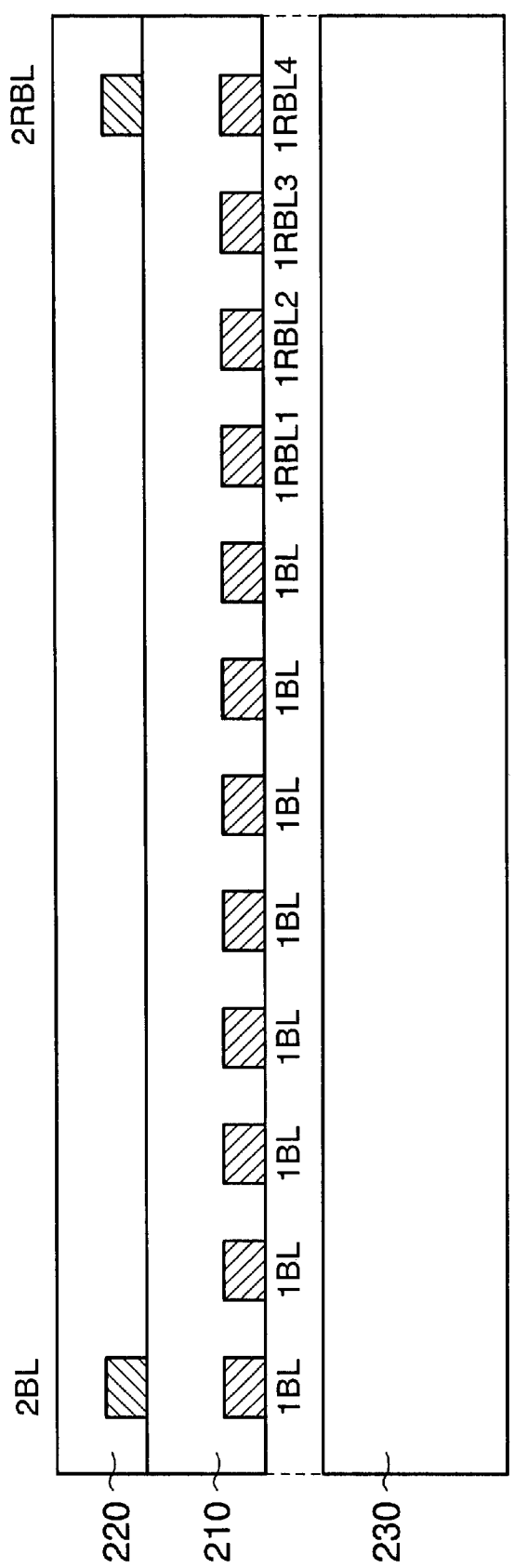
FIG. 26 is a sectional view explaining the structures of a first wiring layer and a second wiring layer corresponding to one sense amplifier and one reference voltage generating circuit in the fifth embodiment.

FIG. 24 is a diagram showing the entire layout of the cell array 100 according to the fifth embodiment, FIG. 25 is a diagram showing the configurations of bit line selectors 400 corresponding to one sense amplifier SA and one reference voltage generating circuit VG in the cell array 100 in FIG. 24, and FIG. 26 is a partial sectional view of a semiconductor memory device according to this embodiment.

As can be seen from these drawings, in this embodiment, the column selection lines RCSL, WCSL, DWCSL run on the cell array 100 in previous embodiment are not provided. As shown in FIG. 24, sense unit arranging regions 450 in each of which the sense amplifiers SA and the reference voltage generating circuits VG are arranged are provided on both sides of and adjacent to the column decoder 140. Therefore, the read column selection signal line RCSL, the write column selection signal line WCSL, and the reference cell refresh column signal line DWCSL from the column decoder 140 are inputted directly to the sense amplifier SA in the adjacent sense unit arranging region 450. Hence, the cell array 100 according to this embodiment is of a single end type, and one sense amplifier SA and one reference voltage generating circuit VG are provided for four cell array blocks.

Therefore, as shown in FIG. 26, in the second wiring layer 220, the read column selection signal line RCSL, the write column selection signal line WCSL, and the reference cell refresh column signal line DWCSL are not formed, and only a second bit line 2BL and a second reference bit line 2RBL are formed.

As shown in FIG. 25, the arrangement of the memory cells MC and the reference cells RC0 and RC1 according to this embodiment is the same as that in the aforementioned third and fourth embodiments. Namely, the data in the memory cell MC is read on the read principle shown in FIG. 11.

Moreover, as shown in FIG. 25, the first bit lines 1BL formed in the first wiring layer 210 are alternately inputted to the left and right bit line selectors 400. On the other hand, the second bit line 2BL formed in the second wiring layer 220 is inputted to the sense amplifier SA provided on one side. Similarly, the first reference bit lines 1RBL1 to 1RBL4 formed in the first wiring layer 210 are alternately inputted to the left and right bit line selectors 400. On the other hand, the second reference bit line 2RBL formed in the second wiring layer 220 is inputted to the reference voltage generating circuit VG provided on one side.

The respective first bit lines 1BL extending in the bit line direction in each of the cell array blocks are connected to the second bit line 2BL via N-type MISFETs. Bit line selection signals BSL0 to BSL31 are inputted to gate electrodes of the MISFETs as switching circuits connected to the second bit line 2BL, and by driving any one of these bit line selection signals BSL0 to BSL31 high, one first bit line 1BL is connected to one second bit line 2BL.

The second bit line 2BL is formed across four cell array blocks, and inputted to the sense amplifier SA provided adjacent to the column decoder 140. Thus, a cell current flowing through the second bit line 2BL is sensed by the sense amplifier SA, and data is read.

The first reference bit lines 1RBL1 to 1RBL4 extending in the bit line direction in each of the cell array blocks are connected to the second reference bit line 2RBL via N-type MISFETs TrN. Reference bit line selection signals RBSL0 to RBSL15 are inputted to gate electrodes of the MISFETs TrN connected to these first reference bit lines 1RBL1 to 1RBL4. Therefore, by driving any pair of the reference bit line selection signals RBSL0 and RBSL1, the reference bit line selection signals RBSL2 and RBSL3, the reference bit line selection signals RBSL4 and RBSL5, the reference bit line selection signals RBSL6 and RBSL7, the reference bit line selection signals RBSL8 and RBSL9, the reference bit line selection signals RBSL10 and RBSL11, the reference bit line selection signals RBSL12 and RBSL13, or the reference bit line selection signals RBSL14 and RBSL15 high, a pair of first reference bit lines (for example, 1RBL2 and 1RBL4) are connected to one second reference bit line 2RBL.

In the bit line selectors 400 according to this embodiment, the reference bit line MISFET TrN on the same side as the MISFET TrN which is turned on to read data from the normal memory cell MC is turned on. For example, when the bit line selection signal BSL0 is driven high, the reference bit line selection signals RBSL0 and RBSL1 are driven high. On the other hand, when the bit line selection signal BSL16 is driven high, the reference bit line selection signals RBSL8 and RBSL9 are driven high.

By so doing, the bit line resistance of the memory cell MC and the reference bit line resistances of the reference cells RC0 and RC1 are adjusted same. Namely, if the reference bit line MISFET TrN on the same side as the MISFET TrN which is turned on to read data from the normal memory cell MC is turned on, the length of the bit line (1BL+2BL) from the memory cell MC, from which data is to be read, to the sense amplifier SA and the length of the reference bit line (1RBL+2RBL) from the reference cells RC0 and RC1 to be used to the reference voltage generating circuit VG can be almost same. Consequently, the bit line resistance of the memory cell MC and the reference bit line resistances of the reference cells RC0 and RC1 are almost same, thereby enabling more precise compensation for common mode noise.

The second reference bit line 2RBL is formed across four cell array blocks, and imputed to the reference voltage generating circuit VG provided adjacent to the column decoder 140. Therefore, the current I0+I1 flowing through the second reference bit line 2RBL is inputted to the reference voltage generating circuit VG and used for generating the reference voltage VREF. In the sense unit arranging region in this embodiment, one reference voltage generating circuit VG is provided for two sense amplifiers SA to constitute one sense unit, and plural such sense units are provided in the word line direction.

In a read sequence in the semiconductor memory device according to this embodiment, the row decoders and word line drivers 130 select one word line WL from four cell array blocks (B0 to B3, B4 to B7) and drive it high. By driving this word line WL high, one reference cell RC0 and one reference cell RC1 are selected and the current I0+I1 as the reference is inputted to the reference voltage generating circuit VG. Then, using the reference voltage VREF generated by this reference voltage generating circuit VG, data in one memory cell MC is read from the four cell array blocks by one sense amplifier SA. Likewise with this, a write sequence and a refresh sequence are also performed by selecting one memory cell MC from the four cell array blocks with respect to one sense amplifier SA.

As stated above, also by the semiconductor memory device according to this embodiment, the number of the sense amplifiers SA and the number of the reference voltage generating circuits VG in the entire semiconductor memory device can be reduced.

Figure 27:
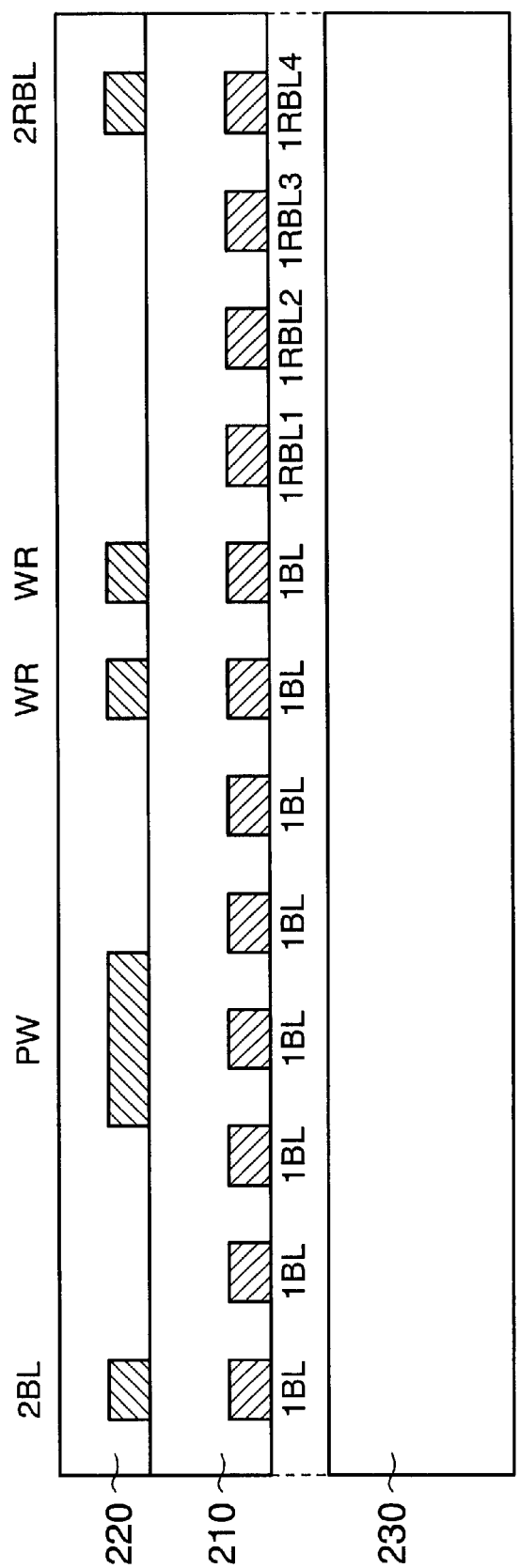
FIG. 27 is a sectional view when other wires are formed in the second wiring layer in the fifth embodiment.

Moreover, the sense amplifiers SA and the reference voltage generating circuits VG are concentrated adjacent to the column decoder 140, and hence it becomes unnecessary to form the column selection lines RCSL, WCSL, and DWCSL across plural cell array blocks on the cell array 100. Accordingly, the wiring pitch of the second bit line 2BL formed in the second wiring layer 220 can be increased. Consequently, as shown in FIG. 27, in addition to the second bit line 2BL, a power wire PW and other wires WR can be formed in the second wiring layer 220.

Figure 28:
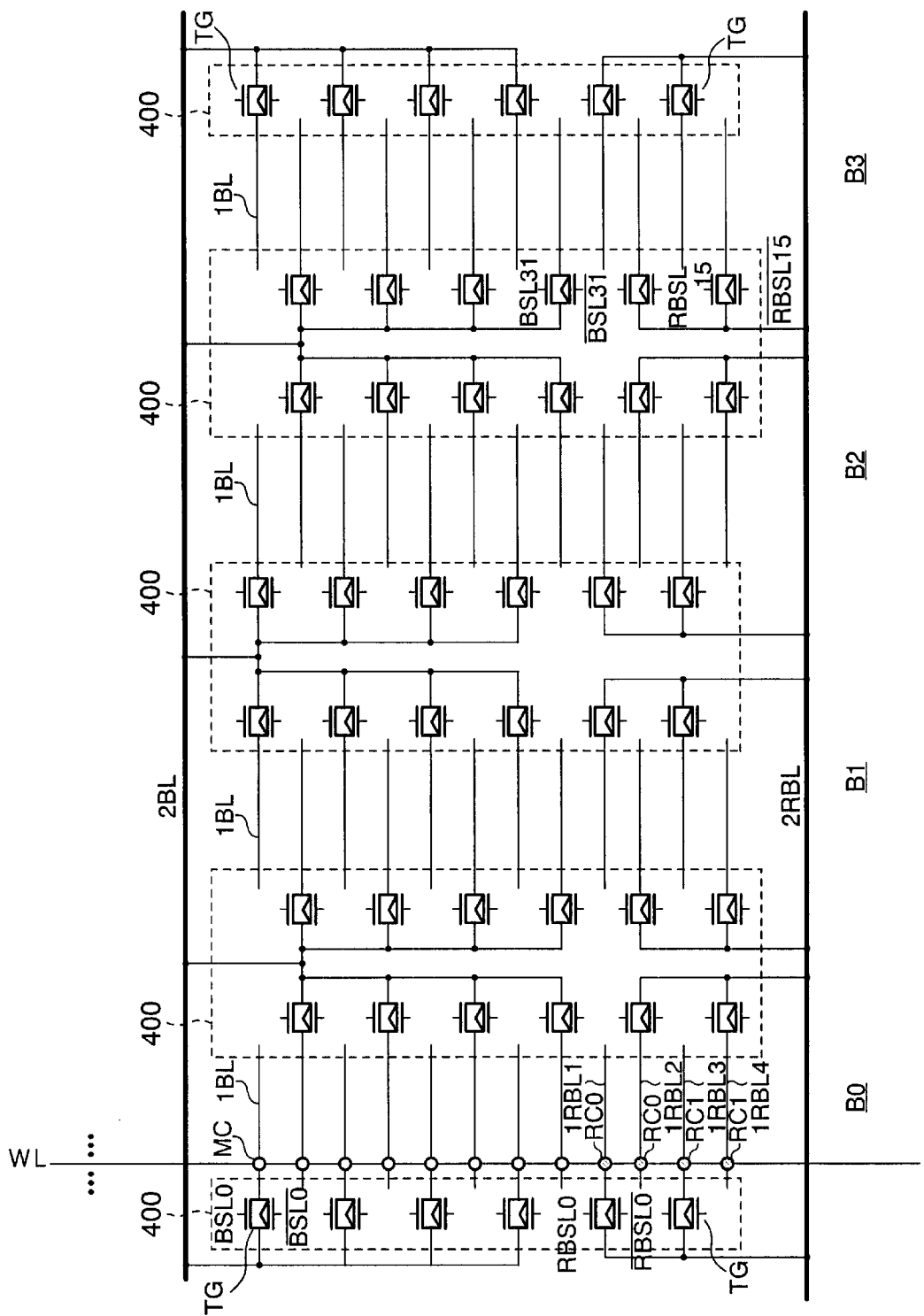
FIG. 28 is a diagram showing a modified example of the bit line selectors according to the fifth embodiment and corresponds to FIG. 25.

FIG. 28 is a diagram showing a modified example of the bit line selectors 400 in this embodiment, and corresponds to FIG. 25 described above. As shown in FIG. 28, in this modified example, in place of the N-type MISFETs TrN in FIG. 25, transfer gates TG are used as respective switching circuits composing the bit line selectors 400. This transfer gate TG is configured by complementarily connecting an N-type MISFET and a P-type MISFET in parallel. To gate electrodes of the N-type MISFETs, similarly to FIG. 25, the bit line selection signals BSL0 to BSL31 and the reference bit line selection signals RBSL0 to RBSL15 are inputted, but to the P-type MISFETs, bit line selection signals /BSL0 to /BSL31 and reference bit line selection signals /RBSL0 to /RBSL15, which are obtained by inverting the above signals, are inputted.

Consequently, high-level voltages of the bit line selection signals BSL0 to BSL31 and the reference bit line selection signals RBSL0 to RBSL15, and high-level voltages of the bit line selection signals /BSL0 to /BSL31 and the reference bit line selection signals /RBSL0 to /RBSL15 can be equalized to the voltages to be applied to the first bit lines 1BL and the first reference bit lines 1RBL1 to 1RBL4. This contributes to a reduction in voltage used in the semiconductor memory device. Consequently, the reliability problem of high voltage application to peripheral circuits in the semiconductor memory device is mitigated, and power consumption of this semiconductor memory device can be reduced as well.

Sixth Embodiment

The sixth embodiment is obtained by modifying the aforementioned fifth embodiment. Specifically, one reference cell RC0 and one reference cell RC1 are connected to each word line WL, the first reference bit line connecting with the reference cell RC0 is connected to the second bit line 2RBL via one MISFET, and the first reference bit line connecting with the reference cell RC1 is connected to the second reference bit line 2RBL via one MISFET. Further details will be explained below.

Figure 29:
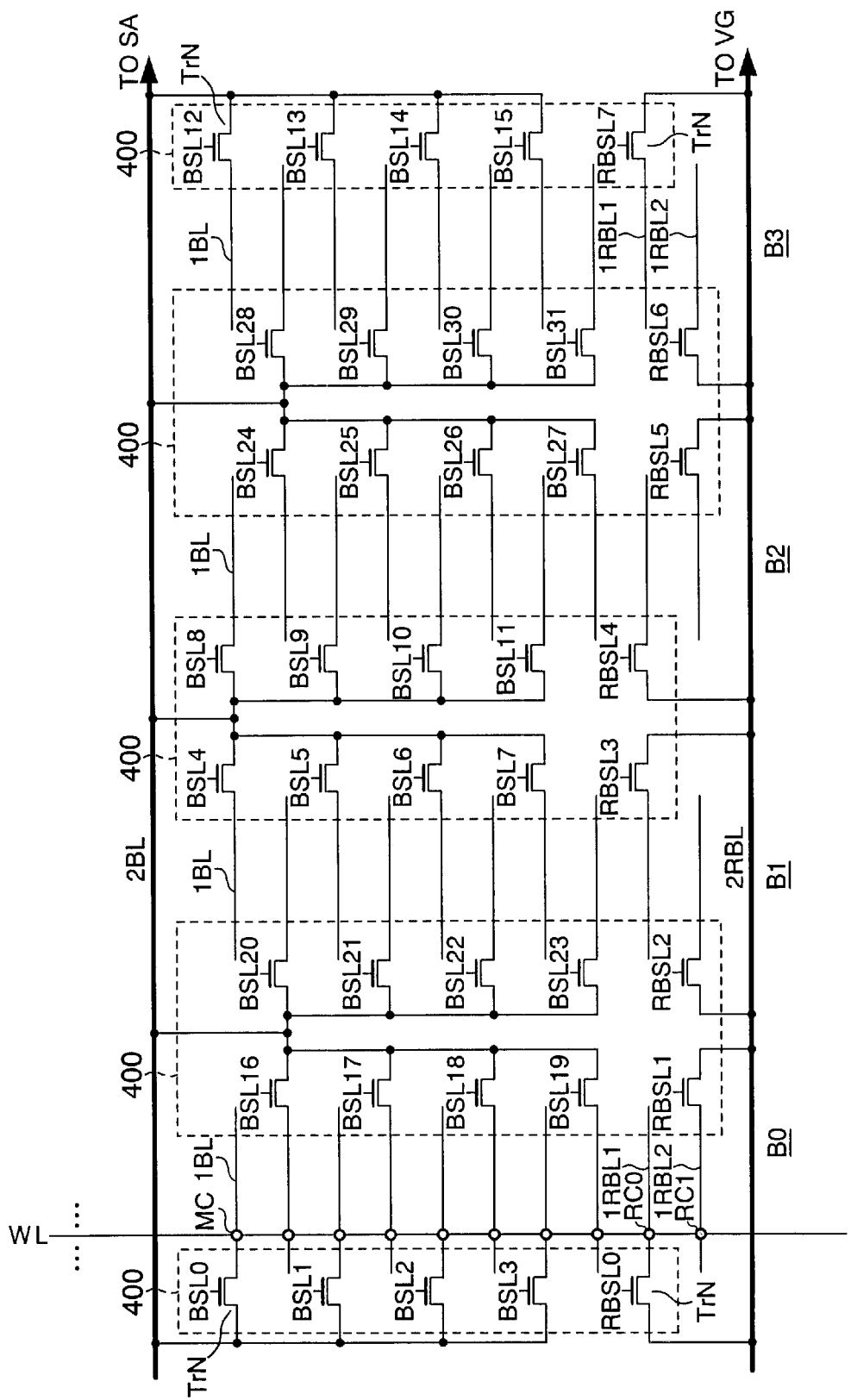
FIG. 29 is a diagram explaining the arrangement of respective memory cells, respective word lines, respective first bit lines, a second bit line, respective first reference bit lines, a second reference bit line, and bit line selectors in a sixth embodiment.
Figure 30:
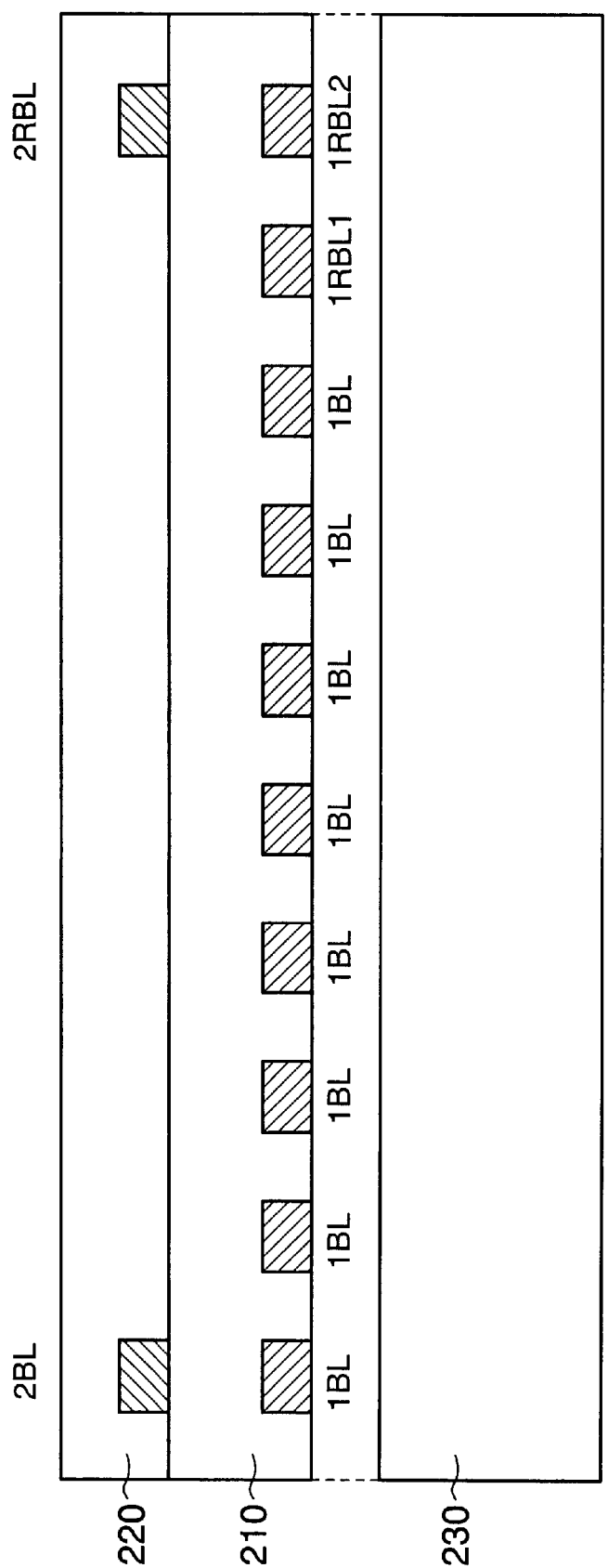
FIG. 30 is a sectional view explaining the structures of a first wiring layer and a second wiring layer corresponding to one sense amplifier and one reference voltage generating circuit in the sixth embodiment.

FIG. 29 is a diagram showing the configurations of the bit line selectors 400 corresponding to one sense amplifier SA and one reference voltage generating circuit VG according to this embodiment, and FIG. 30 is a partial sectional view of the first wiring layer 210 and the second wiring layer 220 of a semiconductor memory device according to this embodiment. It should be noted that the entire layout of the cell array 100 according to this embodiment is the same as that in FIG. 24.

As shown in FIG. 29, in this embodiment, with respect to one reference voltage generating circuit VG, a gate electrode of one reference cell RC0 and a gate electrode of one reference cell RC1 are connected to one word line WL. Therefore, as shown in FIG. 30, there are two first reference bit lines 1RBL1 and 1RBL2 formed in the first wiring layer 210.

Moreover, as shown in FIG. 29, the first reference bit line 1RBL and the first reference bit line 1RBL2 constitute a double end type bit line arrangement. Namely, each of drains of the reference cells RC0 arranged in the bit line direction is connected to the first reference bit line 1RBL1, and this first reference bit line 1RBL1 is connected to the second reference bit line 2RBL via the MISFET TrN provided on one side. Similarly, each of drains of the reference cells RC1 arranged in the bit line direction is connected to the first reference bit line 1RBL2, and this first reference bit line 1RBL2 is connected to the second reference bit line 2RBL via the MISFET TrN provided on the other side.

Since the first reference bit lines 1RBL1 and 1RBL2 are thus arranged, the usage of the first reference bit lines 1RBL1 and 1RBL2 according to this embodiment is different from that according to the aforementioned fifth embodiment. Namely, reference bit line selection signals RBSL0 to RBSL7 are inputted to gate electrodes of N-type MISFETs TrN connected to the first reference bit lines 1RBL1 and 1RBL2. By driving any pair of the reference bit line selection signals RBSL0 and RBSL1, the reference bit line selection signals RBSL2 and RBSL3, the reference bit line selection signals RBSL4 and RBSL5 or the reference bit line selection signals RBSL6 and RBSL7 out of these reference bit line selection signals RBSL0 to RBSL7 high, one first reference bit line 1RBL1 and one first reference bit line 1RBL2 are connected to one second reference bit line 2RBL.

For example, when the word line WL in the cell array block B0 is selected and driven high and when the bit line selection signal BSL0 is driven high in the bit line selector 400, the reference bit line selection signal RBSL0 and the reference bit line selection signal RBSL1 go high.

Moreover, also when the word line WL in the cell array block B0 is selected and driven high and when the bit line selection signal BSL16 is driven high, the reference bit line selection signal RBSL0 and the reference bit line selection signal RBSL1 go high. Thus, the current I0+I1 flows through the second reference bit line 2RBL and it is inputted to the reference voltage generating circuit VG.

Except for this point, a semiconductor memory device according to this embodiment is the same as that in the aforementioned fifth embodiment.

As stated above, also by the semiconductor memory device according to this embodiment, the number of the sense amplifiers SA and the number of the reference voltage generating circuits VG in the entire semiconductor memory device can be reduced.

Moreover, the sense amplifiers SA and the reference voltage generating circuits VG are concentrated adjacent to the column decoder 140, and hence it becomes unnecessary to form the column selection lines RCSL, WCSL, and DWCSL across plural cell array blocks on the cell array 100.

Figure 31:
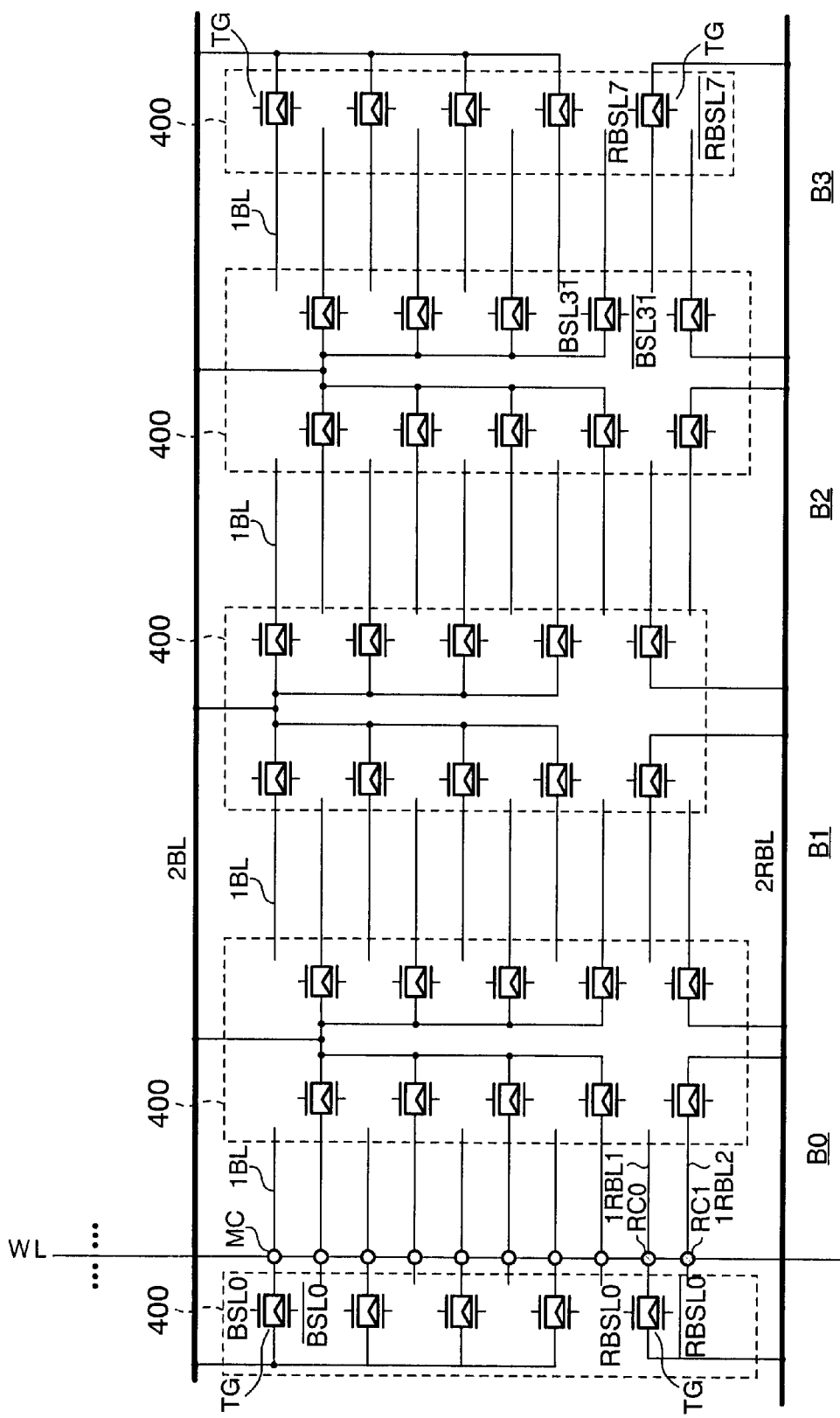
FIG. 31 is a diagram showing a modified example of the bit line selectors according to the sixth embodiment and corresponds to FIG. 29.

FIG. 31 is a diagram showing a modified example of the bit line selectors 400 in this embodiment, and corresponds to FIG. 29 described above. As shown in FIG. 31, in this modified example, in place of the N-type MISFETs TrN in FIG. 29, transfer gates TG are used as switching circuits. This transfer gate TG is configured by complementarily connecting an N-type MISFET and a P-type MISFET in parallel. To gate electrodes of the N-type MISFETs, similarly to FIG. 29, the bit line selection signals BSL0 to BSL31 and the reference bit line selection signals RBSL0 to RBSL7 are inputted, but to the P-type MISFETs, bit line selection signals /BSL0 to /BSL31 and reference bit line selection signals /RBSL0 to /RBSL7, which are obtained by inverting the above signals, are inputted.

Consequently, as described in the first embodiment, high-level voltages of the bit line selection signals BSL0 to BSL31 and the reference bit line selection signals RBSL0 to RBSL7, and high-level voltages of the bit line selection signals /BSL0 to /BSL31 and the reference bit line selection signals /RBSL0 to /RBSL7 can be equalized to the voltages to be applied to the first bit lines 1BL and the first reference bit lines 1RBL1 and 1RBL2. This contributes to a reduction in voltage used in the semiconductor memory device.

Consequently, the reliability problem of high voltage application to peripheral circuits in the semiconductor memory device is mitigated, and power consumption of this semiconductor memory device can be reduced as well.

Seventh Embodiment

The seventh embodiment is obtained by modifying the aforementioned sixth embodiment. Specifically, switching circuits are provided on both sides of each of the first reference bit lines 1RBL1 and 1RBL2, and the both sides of each of the first bit lines 1RBL1 and 1RBL2 are connected to the second reference bit line 2RBL. As a result, it is avoided that the reference bit line resistance of the reference cell RC0 and the reference bit line resistance of the reference cell RC1 become asymmetrical. Further details will be explained below.

Figure 32:
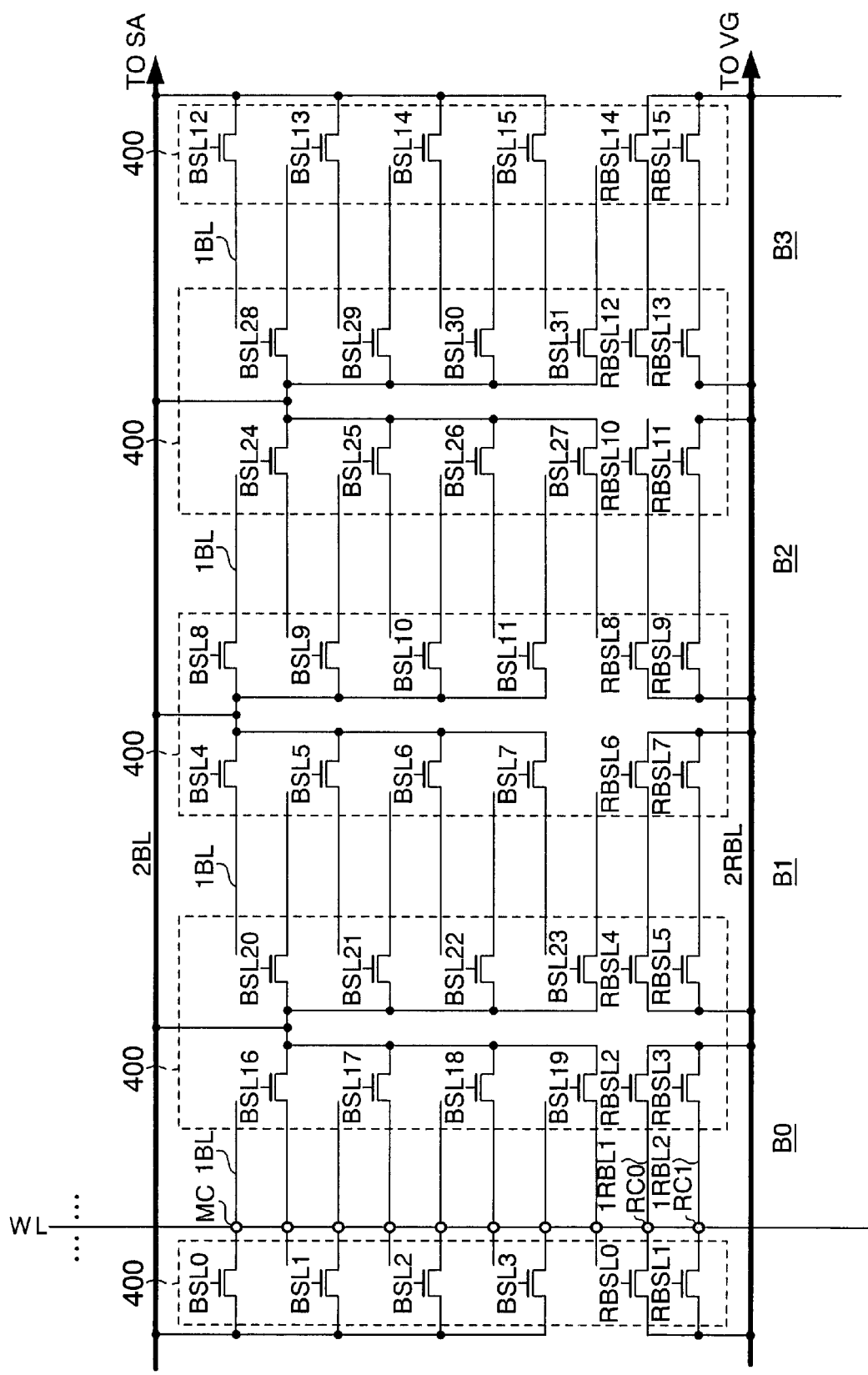
FIG. 32 is a diagram explaining the arrangement of respective memory cells, respective word lines, respective first bit lines, a second bit line, respective first reference bit lines, a second reference bit line, and bit line selectors in a seventh embodiment.

FIG. 32 is a diagram showing the configurations of the bit line selectors 400 as a unit according to this embodiment. Incidentally, sections of the first wiring layer 210 and the second wiring layer 220 of a semiconductor memory device according to this embodiment are the same as those in FIG. 30, and the entire layout of the cell array 100 according to this embodiment is the same as that in FIG. 24.

As shown in FIG. 32, in this embodiment, two MISFETs TrN's are connected to both sides of each of the first bit lines 1RBL1 and 1RBL2 extending in the bit line direction in each of the cell array blocks, and the first reference bit lines 1RBL1 and 1RBL2 are connected to the second reference bit line 2RBL via these MISFETs TrN's. Reference bit line selection signals RBSL0 to RBSL15 are inputted to gate electrodes of the MISFETs connected to the first reference bit lines 1RBL1 and 1RBL2. By driving the nearest pair out of the reference bit line selection signals RBSL0 to RBSL3, the reference bit line selection signals RBSL4 to RBSL7, the reference bit line selection signals RBSL8 to RBSL11, or the reference bit line selection signals RBSL2 to RBSL15 high, one first reference bit line 1RBL1 and one first reference bit line 1RBL2 are connected to one second reference bit line 2RBL.

For example, when the bit line selection signal BSL0 is driven high in the bit line selector 400, RBSL0 and RBSL1 out of four reference bit line selection signals RBSL0 to RBSL3 go high. Also when the bit line selection signal BSL16 is driven high, RBSL2 and RBSL3 out of four reference bit line selection signals RBSL0 to RBSL3 go high. Thus, the current I0+I1 flows through the second reference bit line 2RBL, and it is inputted to the reference voltage generating circuit VG.

Except for this point, the semiconductor memory device according to this embodiment is the same as that in the aforementioned sixth embodiment.

As stated above, also by the semiconductor memory device according to this embodiment, the number of the sense amplifiers SA and the number of the reference voltage generating circuits VG in the entire semiconductor memory device can be reduced.

Moreover, the sense amplifiers SA and the reference voltage generating circuits VG are concentrated adjacent to the column decoder 140, and hence it becomes unnecessary to form the column selection lines RCSL, WCSL, and DWCSL across plural cell array blocks on the cell array 100.

Figure 33:
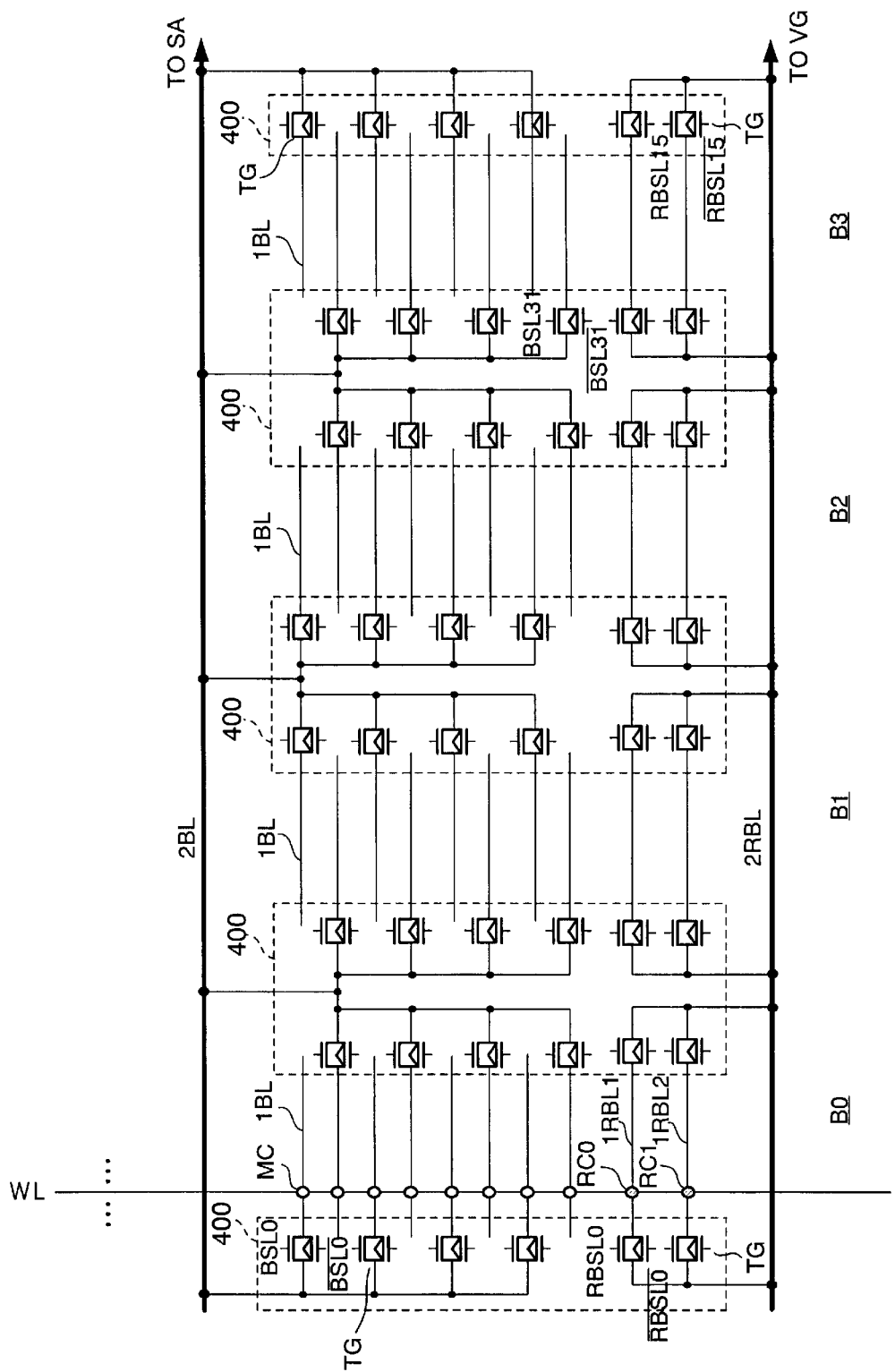
FIG. 33 is a diagram showing a modified example of the bit line selectors according to the seventh embodiment and corresponds to FIG. 32.

FIG. 33 is a diagram showing a modified example of the bit line selectors 400 in this embodiment, and corresponds to FIG. 32 described above. As shown in FIG. 33, in this modified example, in place of the N-type MISFETs TrN in FIG. 32, transfer gates TG are used as respective switching circuits composing the bit line selectors 400. This transfer gate TG is configured by complementarily connecting an N-type MISFET and a P-type MISFET in parallel. To gate electrodes of the N-type MISFETs, similarly to FIG. 32, the bit line selection signals BSL0 to BSL31 and the reference bit line selection signals RBSL0 to RBSL15 are inputted, but to the P-type MISFETs, bit line selection signals /BSL0 to /BSL31 and reference bit line selection signals /RBSL0 to /RBSL15, which are obtained by inverting the above signals, are inputted.

Consequently, high-level voltages of the bit line selection signals BSL0 to BSL31 and the reference bit line selection signals RBSL0 to RBSL15, and high-level voltages of the bit line selection signals /BSL0 to /BSL31 and the reference bit line selection signals /RBSL0 to /RBSL15 can be equalized to the voltages to be applied to the first bit lines 1BL and the first reference bit lines 1RBL1 and 1RBL2. This contributes to a reduction in voltage used in the semiconductor memory device. Consequently, the reliability problem of high voltage application to peripheral circuits in the semiconductor memory device is mitigated, and power consumption of this semiconductor memory device can be reduced as well.

Eighth embodiment

Figure 34:
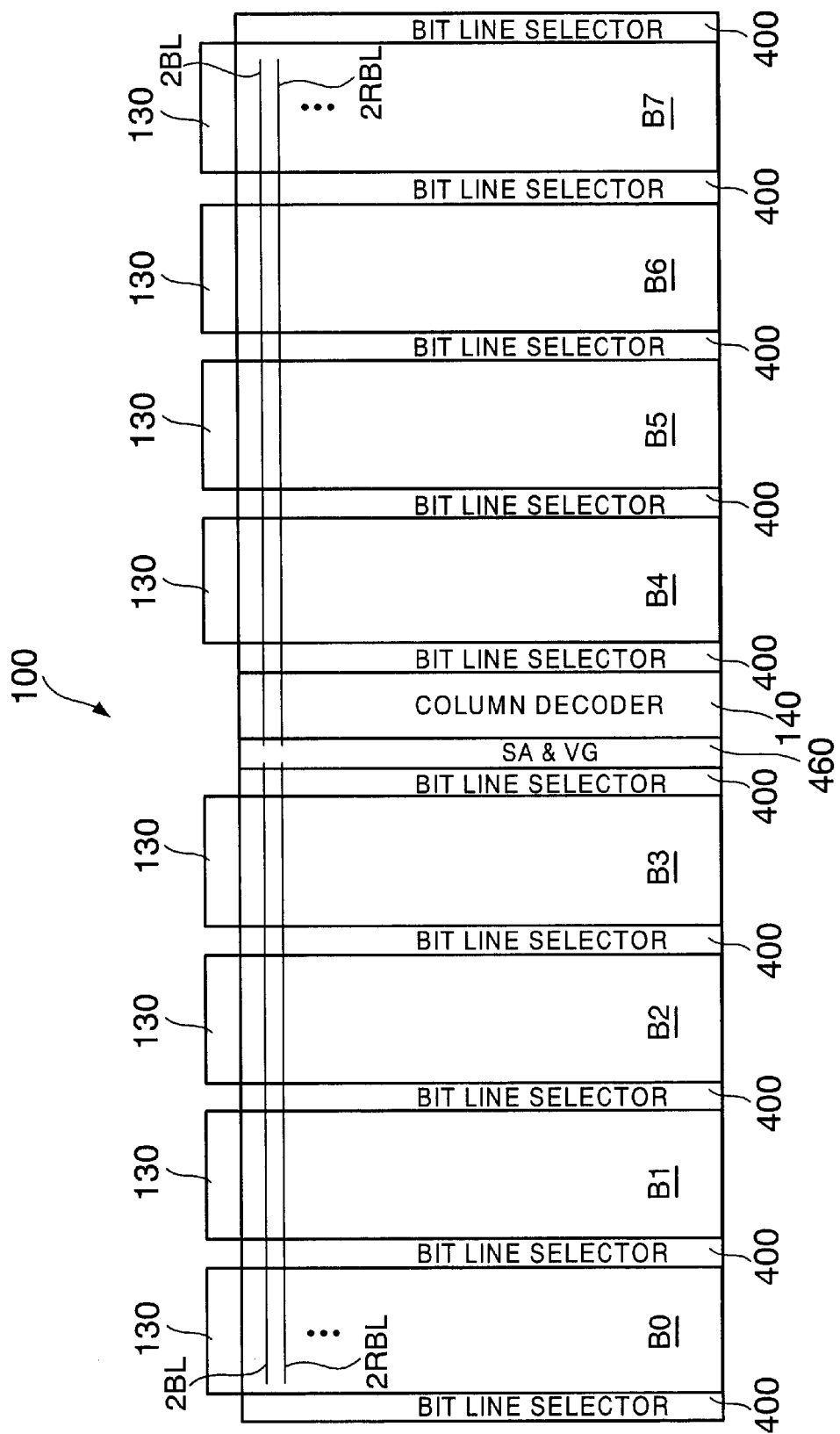
FIG. 34 is a diagram showing the layout of the entire cell array according to an eighth embodiment.

In the eighth embodiment, a further reduction in the number of the sense amplifiers SA and the number of the reference voltage generating circuits VG in the aforementioned fifth to seventh embodiments is realized. FIG. 34 is a diagram showing the entire layout of the cell array 100 according to this embodiment. As shown in FIG. 34, in the cell array 100 according to this embodiment, the column decoder 140 is provided in its central portion. Namely, similarly to the aforementioned embodiments, four cell array blocks B0 to B3 are located on one side of the column decoder 140 and four cell array blocks B4 to B7 are located on the other side thereof.

On one side of the column decoder 140, a sense unit arranging region 460 as a region in which the sense amplifiers SA and the reference voltage generating circuits VG are formed is provided. Namely, in this embodiment, unlike the aforementioned fifth to seventh embodiments, plural sense amplifiers SA and plural reference voltage generating circuits VG are concentrated in the sense unit arranging region 460 located on one side of the column decoder 140. Hence, in this embodiment, each of the sense amplifiers SA and each of the reference voltage generating circuits VG are provided in common to eight cell array blocks B0 to B7. Therefore, when a read sequence, a write sequence, and a refresh sequence are performed for the memory cell MC, the following restrictions are caused.

Namely, only one sense amplifier SA and only one reference voltage generating circuit VG are provided for pairs of the second bit lines 2BL and the second reference bit lines 2RBL provided on both sides respectively. Therefore, for example, when a pair of the second bit line 2BL and the second reference bit line 2RBL spanning the array blocks B0 to B3 are selected, a pair of the second bit line BL and the second reference bit line 2RBL spanning the array blocks B4 to B7 which are connected to the same sense amplifier SA and reference voltage generating circuit VG can not be selected. Accordingly, the row decoders and word line drivers 130 need to control word lines so as to satisfy such a condition. In other words, only one word line is driven high in the entire cell array 100.

Except for this point, a semiconductor memory device according to this embodiment is the same as that in the aforementioned fifth to seventh embodiments.

As stated above, according to the semiconductor memory device in this embodiment, one sense amplifier SA and one reference voltage generating circuit VG are shared by all the cell array blocks in this cell array 100, and thus the number of the sense amplifiers SA and the number of the reference voltage generating circuits VG in the entire semiconductor memory device can be reduced to a minimum.

Ninth Embodiment

In the ninth embodiment, by providing an N-type MISFET at one end of each of the first bit lines 1BL extending in each cell array block and connecting it to the second bit line 2BL, and providing a P-type MISFET at the other end of each of the first bit lines 1BL and connecting it to the second bit line 2BL, the bit line resistances of respective memory cells are adjusted equal to that of the corresponding reference cells. Further details will be explained below.

Figure 35:
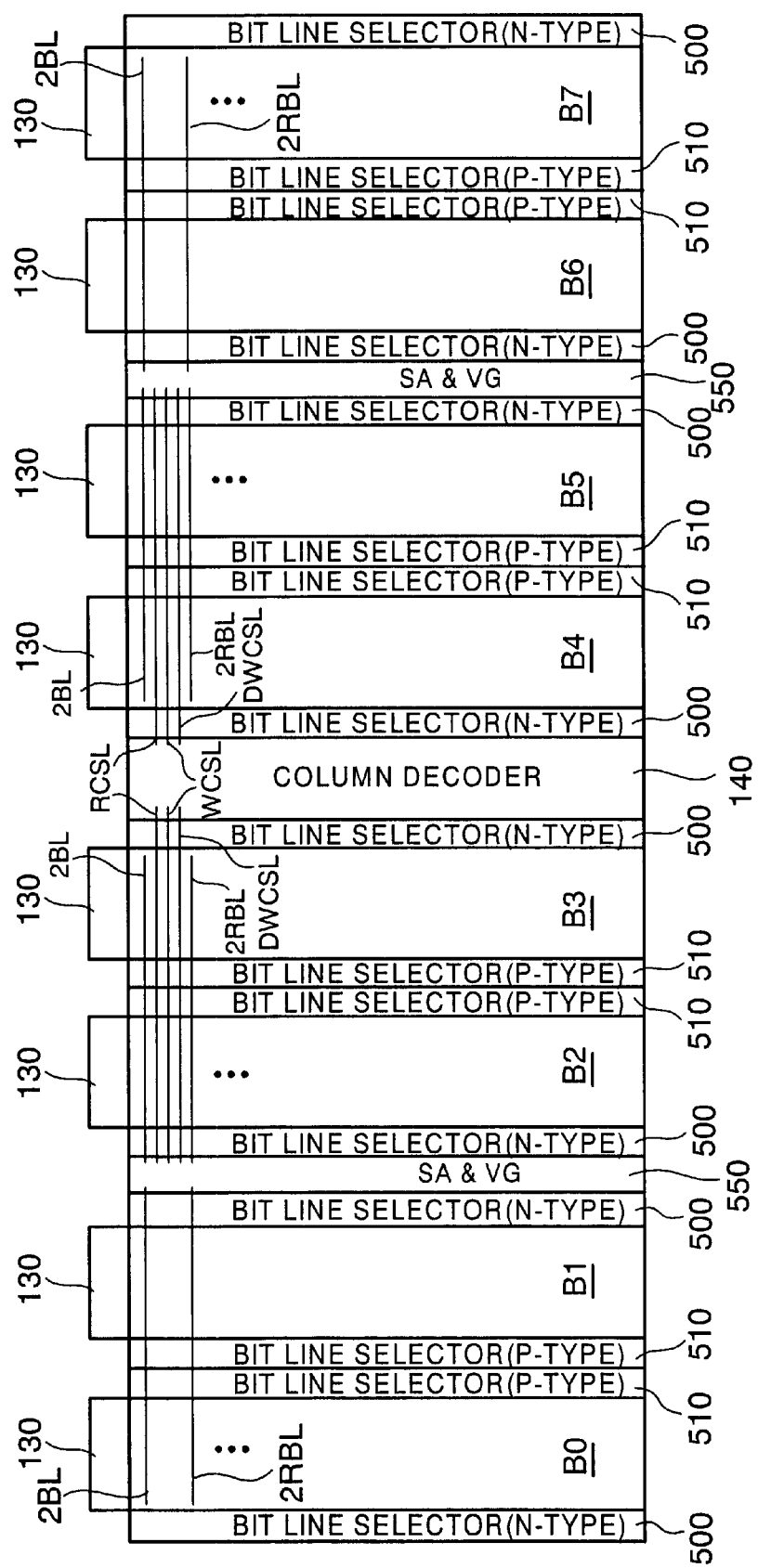
FIG. 35 is a diagram showing the layout of the entire cell array according to a ninth embodiment.
Figure 36:
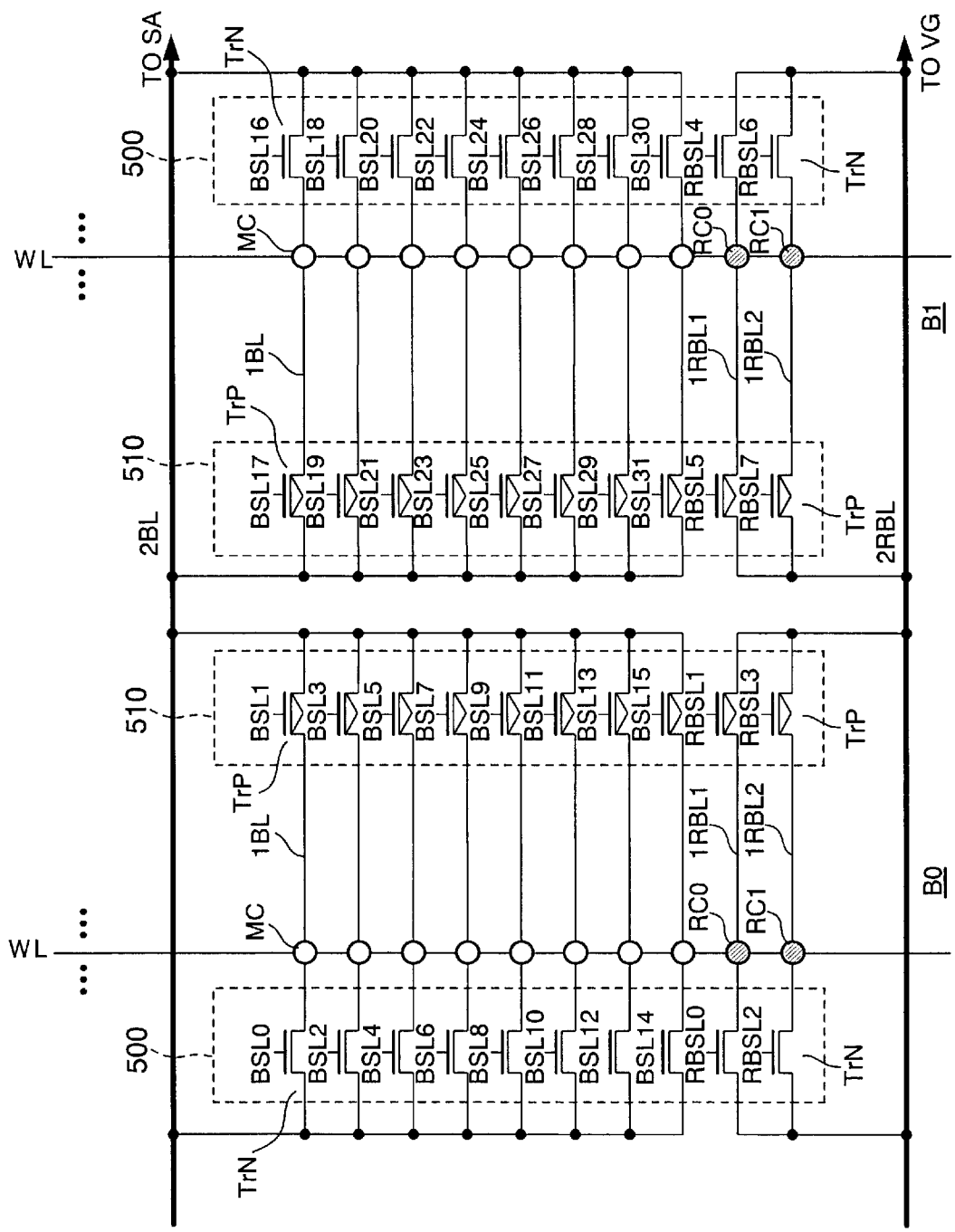
FIG. 36 is a diagram explaining the arrangement of respective memory cells, respective word lines, respective first bit lines, a second bit line, respective first reference bit lines, a second reference bit line, and bit line selectors in the ninth embodiment.
Figure 37:
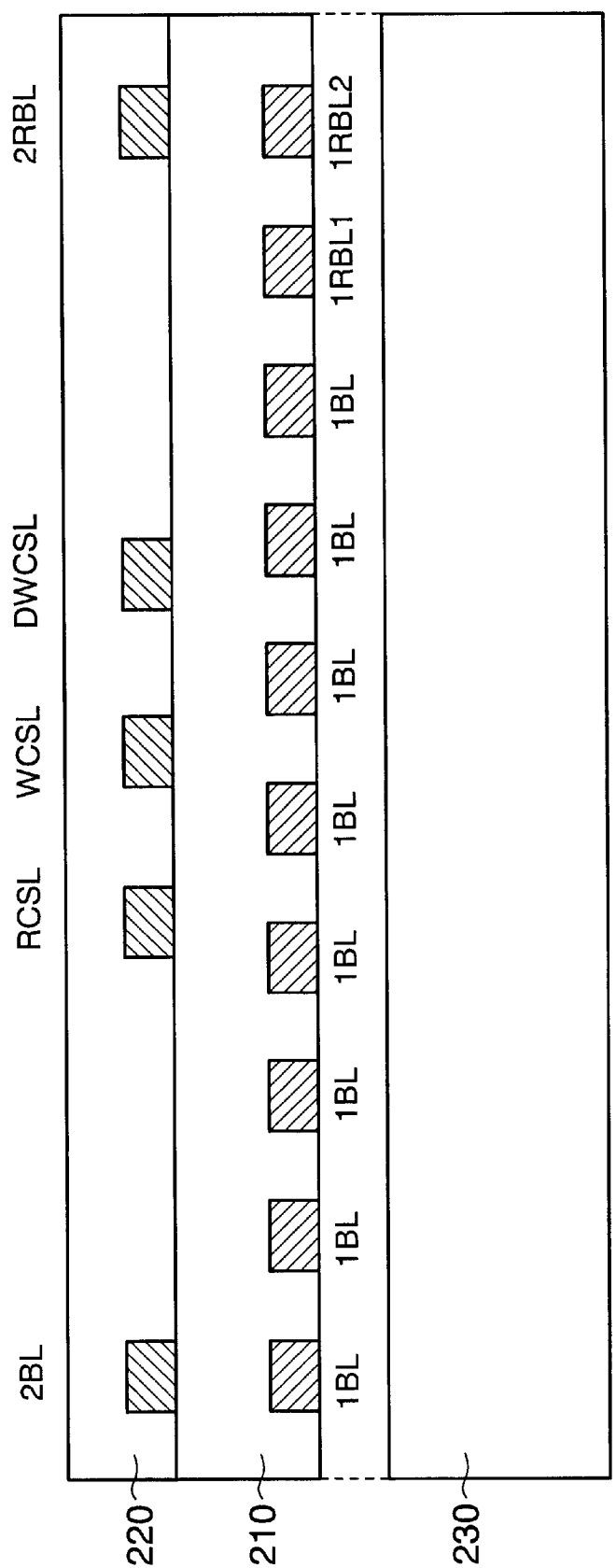
FIG. 37 is a sectional view of cell array blocks B2 to B5 for explaining the structures of a first wiring layer and a second wiring layer corresponding to one sense amplifier and one reference voltage generating circuit in the ninth embodiment.
Figure 38:
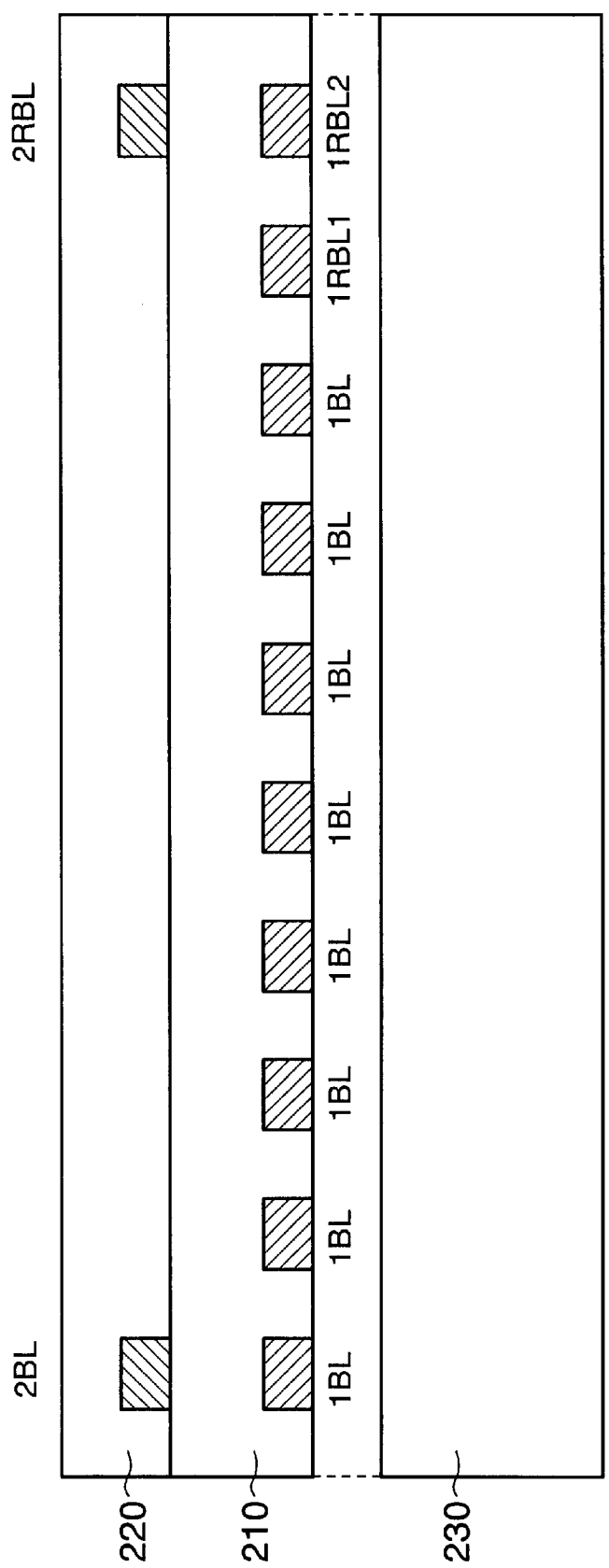
FIG. 38 is a sectional view of cell array blocks B0, B1, B6, and B7 for explaining the structures of the first wiring layer and the second wiring layer corresponding to one sense amplifier and one reference voltage generating circuit in the ninth embodiment.

FIG. 35 is a diagram showing the entire layout of the cell array 100 according to the ninth embodiment, and FIG. 36 is a diagram showing the configurations of bit line selectors 500 and 510 corresponding to one sense amplifier SA and one reference voltage generating circuit VG in the cell array 100 in FIG. 35, and shows the configuration of one unit in the cell array blocks B0 and B1. FIG. 37 is a partial sectional view showing the structures of the first wiring layer 210 and the second wiring layer 220 in the cell array blocks B2 to B5, and FIG. 38 is a partial sectional view showing the structures of the first wiring layer 210 and the second wiring layer 220 in the cell array blocks B0, B1, B6, and B7.

As shown in FIG. 35, the column decoder 140 is located in the central portion of the cell array 100 according to this embodiment. A sense unit arranging region 550 as a region in which plural sense amplifiers SA and plural reference voltage generating circuits VG are arranged is provided between the cell array block B1 and the cell array block B2, and a sense unit arranging region 550 is provided also between the cell array block B5 and the cell array block B6. Concerning the sense unit arranging regions 550 according to this embodiment, the sense amplifiers SA for the cell array blocks B0 and B1 and the sense amplifiers SA for the cell array blocks B2 and B3 are provided in one sense unit arranging region 550, and the sense amplifiers SA for the cell array blocks B4 and B5 and the sense amplifiers SA for the cell array blocks B6 and B7 are provided in one sense unit arranging region 550. In other words, in the cell array 100 according to this embodiment, one column decoder 140 and two systems of sense amplifiers SA and reference voltage generating circuits VG are provided.

The second bit line 2BL and the second reference bit line 2RBL adopt single end type bit line arrangement. In an example shown in FIG. 35, for example, the second bit line 2BL and the second reference bit line 2RBL of the cell array blocks B0 and B1 are inputted respectively to the sense amplifier SA and the reference voltage generating circuit VG of the sense unit arranging region 550 located on the right side, and the second bit line 2BL and the second reference bit line 2RBL of the cell array blocks B2 and B3 are inputted respectively to the sense amplifier SA and the reference voltage generating circuit VG in the same sense unit arranging region 550.

From the column decoder 140, the column selection lines (read column selection signal line RCSL, write column selection signal line WCSL, and reference cell refresh column signal line DWCSL) are inputted to the sense amplifier SA. Therefore, as shown in FIG. 37, these column selection lines are formed in the cell array blocks B2 to B5, but these column selection lines are not formed in the cell array blocks B0, B1, B6, and B7 as shown in FIG. 38.

Moreover, in this embodiment, on one side of each of the cell array blocks, a bit line selector 500 including N-type MISFETs TrN is provided, and on the other side thereof, a bit line selector 510 including P-type MISFETs TrP is provided.

As shown in FIG. 36, the N-type MISFET TrN composing the bit line selector 500 is connected to one end side of each of the first bit lines 1BL extending in the bit line direction in each of the cell array blocks, and each of the first bit lines 1BL is connected to the second bit line 2BL via this MISFET TrN. Further, the P-type MISFET TrP composing the bit line selector 510 is connected to the other end side of each of the first bit lines 1BL, and each of the first bit lines 1BL is connected to the second bit line 2BL via this MISFET TrP.

Similarly, the N-type MISFET TrN composing the bit line selector 500 is connected to one end side of each of the first reference bit lines 1RBL extending in the bit line direction in each of the cell array blocks, and each of the first reference bit lines 1RBL is connected to the second reference bit line 2RBL via this MISFET TrN. Further, the P-type MISFET TrP composing the bit line selector 510 is connected to the other end side of each of the first reference bit lines 1RBL, and each of the first reference bit lines 1RBL is connected to the second reference bit line 2RBL via this MISFET TrP.

Bit line selection signals BSL0 to BSL31 are inputted to gate electrodes of the MISFETs TrN and TrP connected to the first bit lines 1BL, and by turning the MISFETs TrN and TrP connected to the same first bit line 1BL out of these bit line selection signals BSL0 to BSL31 on, one first bit line 1BL is connected to the second bit line 2BL. For example, by driving the bit line selection signal BSL0 high and driving the bit line selection signal BSL1 low, one first bit line 1BL is connected to the second bit line 2BL.

In FIG. 36, the second bit line 2BL is inputted to the right sense amplifier SA, and a cell current flowing through the second bit line 2BL is sensed by the right sense amplifier SA, and data is read.

Reference bit line selection signals RBSL0 to RBSL7 are inputted to gate electrodes of the MISFETs TrN and TrP connected to the first reference bit lines 1RBL, and by turning the MISFETs TrN and TrP connected to the same first reference bit line 1RBL out of these bit line selection signals RBSL0 to RBSL7 on, one first reference bit line 1RBL is connected to the second reference bit line 2RBL. For example, when the word line WL in the cell array block B0 is driven high, the first reference bit lines 1RBL1 and 1RBL2 in the cell array block B0 which is the same cell array block where the word line WL driven high exists are connected to the second reference bit line 2RBL. For example, by driving the reference bit line selection signals RBSL0 and RBSL2 high and driving the reference bit line selection signals RBSL1 and RBSL3 low, one first reference bit line 1RBL1 and one first reference bit line 1RBL2 are connected to the second bit line 2RBL.

In FIG. 36, the second reference bit line 2RBL is inputted to the right reference voltage generating circuit VG, and the current I0+I1 flowing through the second reference bit line 2RBL is inputted to the right reference voltage generating circuit VG, and thereby the reference voltage VREF is generated.

As shown in FIG. 35, in a semiconductor memory device according to this embodiment, in its reading sequence, one word line WL is driven high for four cell array blocks (for example, B0, B1, B2, and B3). One first bit line 1BL is then connected to either of the second bit lines 2BL, and data is read in each sense amplifier SA. This respect applies also to a write sequence and a refresh sequence.

As stated above, according to the semiconductor memory device according to this embodiment, it becomes possible to make the reference bit line resistances of the reference cells RC0 and RC1 adjusted same as the bit line resistances of the memory cells MC.

Tenth Embodiment

The tenth embodiment is obtained by modifying the aforementioned ninth embodiment. Specifically, by providing sense unit arranging regions 560, in each of which the sense amplifiers SA and the reference voltage generating circuits VG are arranged, on both sides of the column decoder 140, it becomes unnecessary to form the column selection lines in each of the cell array blocks.

Figure 39:
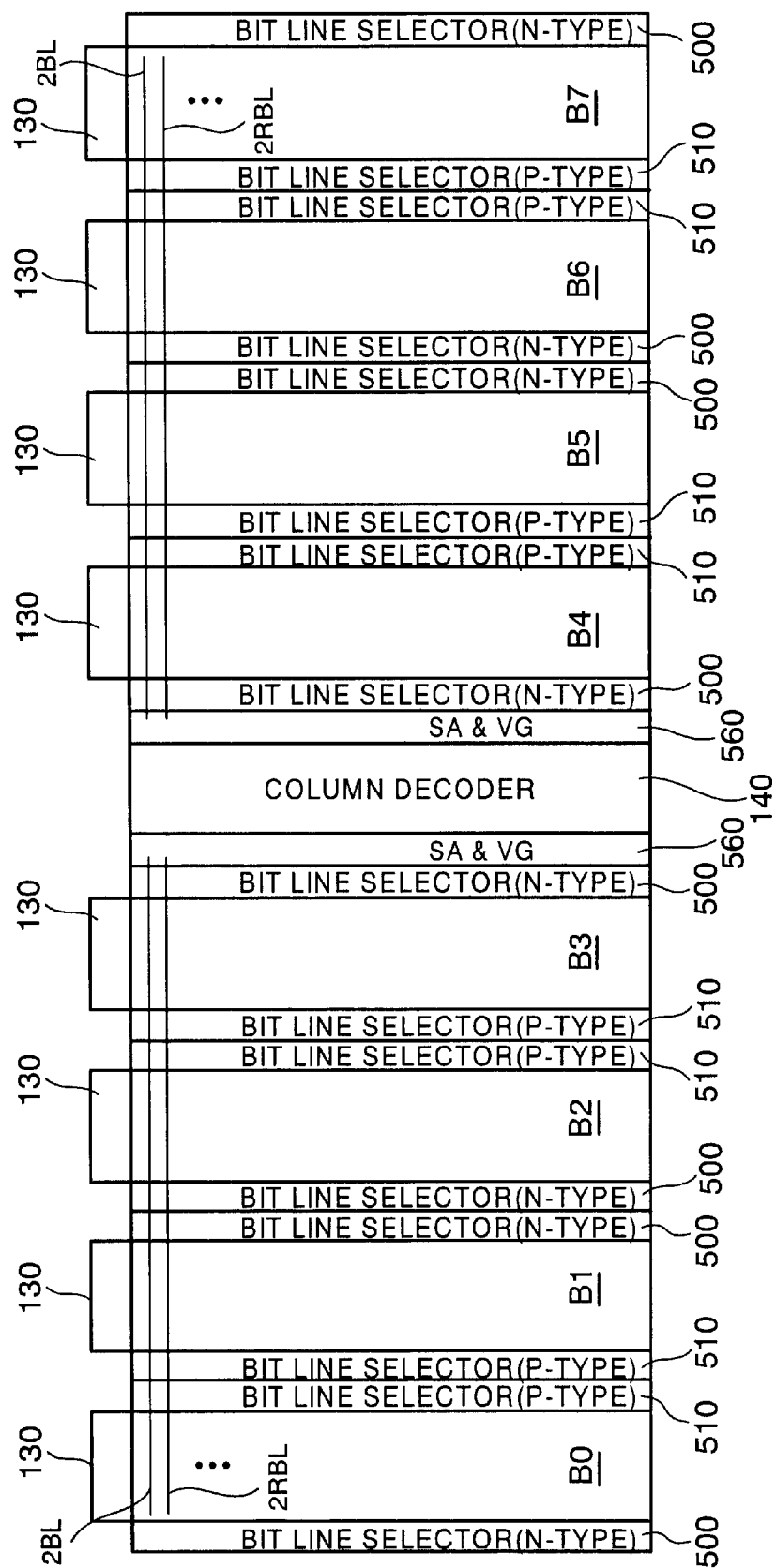
FIG. 39 is a diagram showing the layout of the entire cell array according to a tenth embodiment.
Figure 40:
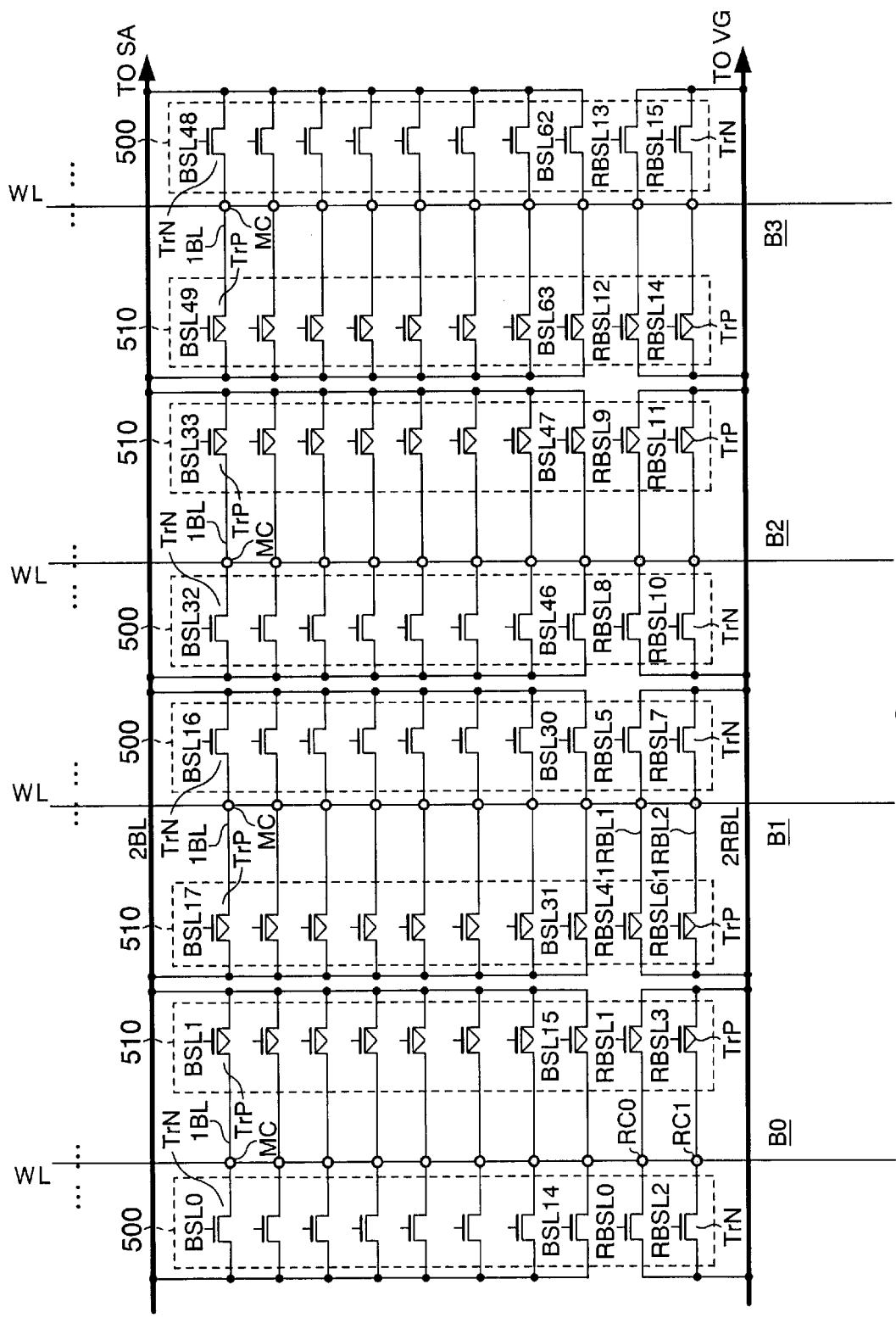
FIG. 40 is a diagram explaining the arrangement of respective memory cells, respective word lines, respective first bit lines, a second bit line, respective first reference bit lines, a second reference bit line, and bit line selectors in the tenth embodiment.

FIG. 39 is a diagram showing the entire layout of the cell array 100 according to the tenth embodiment, FIG. 40 is a diagram showing the configurations of the bit line selectors 500 and 510 corresponding to one sense amplifier SA and one reference voltage generating circuit VG in the cell array 100 in FIG. 39. Incidentally, the partial sectional view of the first wiring layer 210 and the second wiring layer 220 in this embodiment is the same as that in FIG. 38 described above.

As shown in FIG. 39, in this embodiment, the sense unit arranging regions 560 in which plural sense amplifiers SA and plural voltage generating circuits VG are arranged are provided on both sides of the column decoder 140 located in the central portion of the cell array 100. As a result, it becomes unnecessary to form the column selection lines (read column selection line RCSL, write column selection signal line WCSL, and reference cell refresh column signal line DWCSL) from the column decoder 140 in the cell array blocks.

Moreover, in this embodiment, the second bit line 2BL and the second reference bit line 2RBL are formed across four cell array blocks, and one end of the second bit line 2BL is inputted to the sense amplifier SA, and one end of the second reference bit line 2RBL is inputted to the reference voltage generating circuit VG. Hence, one sense unit is provided in common to four cell array blocks. Therefore, in one sense unit, data in one memory cell MC is read from four sense array blocks.

As shown in FIG. 40, also in the cell array 100 according to this embodiment, the bit line selectors 500 each including N-type MISFETs TrN and the bit line selectors 510 each including of P-type MISFETs TrP are provided. Similarly to the aforementioned ninth embodiment, each of the first bit lines 1BL is connected to one second bit line 2BL via the MISFET TrN provided on one end side thereof and the MISFET TrP provided on the other end side thereof. Each of the first reference bit lines 1RBL is connected to one second reference bit line 2RBL via the MISFET TrN provided on one end side thereof and the MISFET TrP provided on the other end side thereof.

Bit line selection signals BSL0 to BSL63 are inputted to gate electrodes of the MISFETs TrN and TrP connected to the first bit lines 1BL, and by turning the MISFET TrN and TrP connected to the same first bit line 1BL out of these bit line selection signals BSL0 to BSL63 on, one first bit line 1BL is connected to the second bit line 2BL. For example, by driving the bit line selection signal BSL0 high and the bit line selection signal BSL1 low, one first bit line BL is connected to the second bit line 2BL.

In FIG. 40, the second bit line 2BL is inputted to the right sense amplifier SA, and a cell current flowing through the second bit line 2BL is sensed by the right sense amplifier SA, and data is read.

Reference bit line selection signals RBSL0 to RBSL15 are inputted to gate electrodes of the MISFETs TrN and TrP connected to the first reference bit lines 1RBL, and by turning the MISFETs TrN and TrP connected to the same first reference bit line 1RBL out of these reference bit line selection signals RBSL0 to RBSL15 on, one first reference bit line 1RBL is connected to the second reference bit line 2RBL. For example, when the word line WL in the cell array block B0 is driven high, the reference bit line selection signals RBSL0 and RBSL2 go high, and the reference bit line selection signals RBSL1 and RBSL3 go low, whereby one first reference bit lines 1RBL1 and one first reference bit line 1RBL2 are connected to the second reference bit line 2RBL.

In FIG. 40, the second reference bit line 2RBL is connected to the right reference voltage generating circuit VG, and the current I0+I1 flowing through the second reference bit line 2RBL is inputted to the right reference voltage generating circuit VG, and thereby the reference voltage VREF is generated.

In a read sequence in a semiconductor memory device according to this embodiment, the row decoders and word line drivers 130 select one word line WL from four cell array blocks (B0 to B3, B4 to B7) and drive it high. By driving this word line WL high, one reference cell RC0 and one reference cell RC1 are selected and the current I0+I1 as the reference is inputted to the reference voltage generating circuit VG. Then, using the reference voltage VREF generated by this reference voltage generating circuit VG, data in one memory cell MC is read from the four cell array blocks by one sense amplifier SA. Likewise with this, a write sequence and a refresh sequence are also performed by selecting one memory cell MC from the four cell array blocks with respect to one sense amplifier SA.

As stated above, also by the semiconductor memory device according to this embodiment, it becomes possible to make the reference bit line resistances of the reference cells RC0 and RC1 adjusted same as the bit line resistances of the memory cells MC. Moreover, since the sense unit arranging regions 560 in which the sense amplifiers SA and the reference voltage generating circuits VG are arranged are located on both sides of and adjacent to the column decoder 140, it becomes unnecessary to run column selection lines across each of the cell array blocks.

Figure 41:
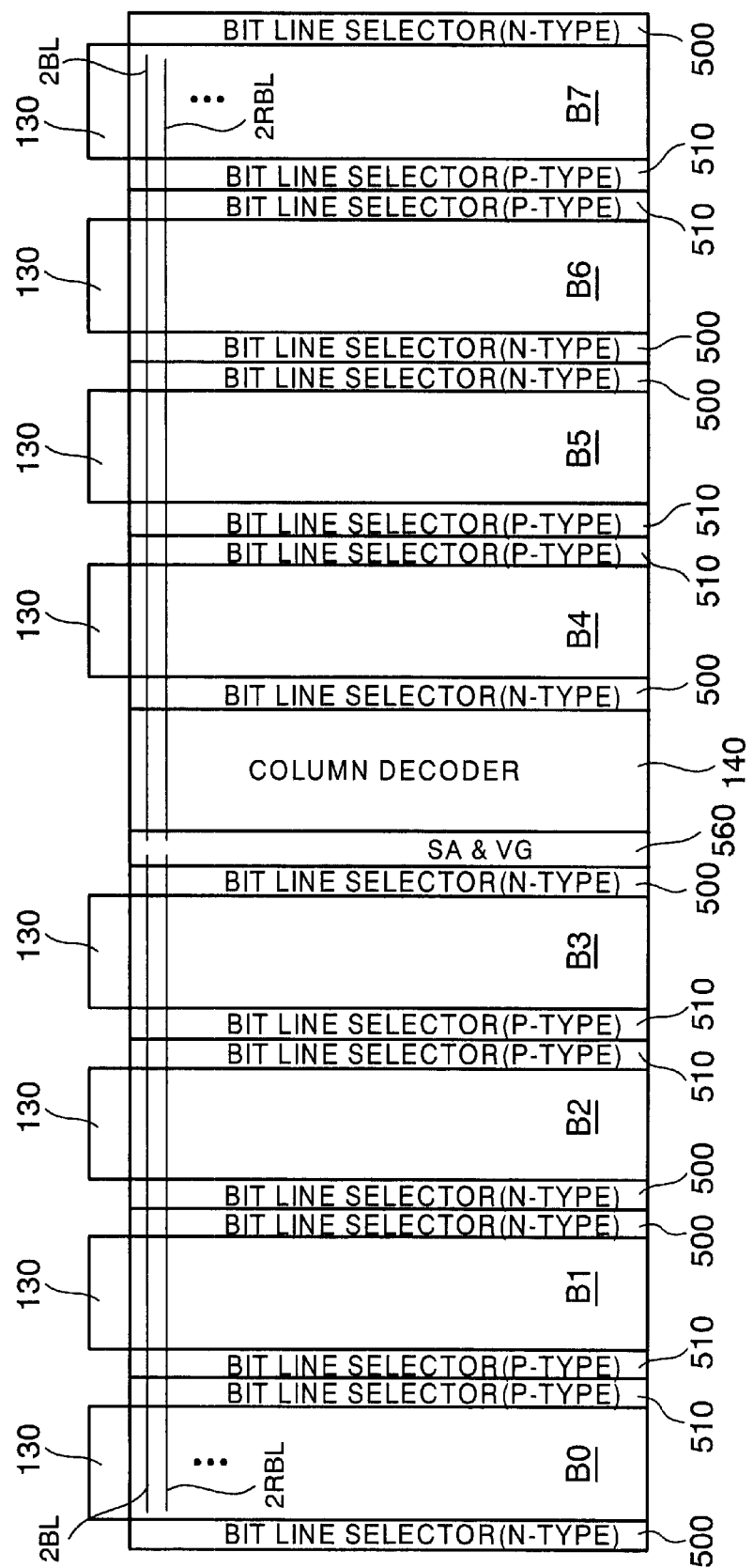
FIG. 41 is a diagram showing the layout of the entire cell array for explaining a modified example of the tenth embodiment.

FIG. 41 is a diagram showing a modified example of the cell array 100 according to this embodiment. In the cell array 100 in FIG. 41, the sense unit arranging region 560 in which plural sense amplifiers SA and plural reference voltage generating circuits VG are arranged is located on one side of the column decoder 140. In this example, one sense unit is provided for eight cell array blocks. Therefore, for example, a sense unit which reads data in the memory cell MC in the cell array blocks B0 to B3 can not read data in the memory cell MC in the cell array blocks B4 to B7. This is because the sense amplifier SA and the reference voltage generating circuit VG is common to the cell array blocks B0 to B3 and the cell array blocks B4 to B7.

Figure 42:
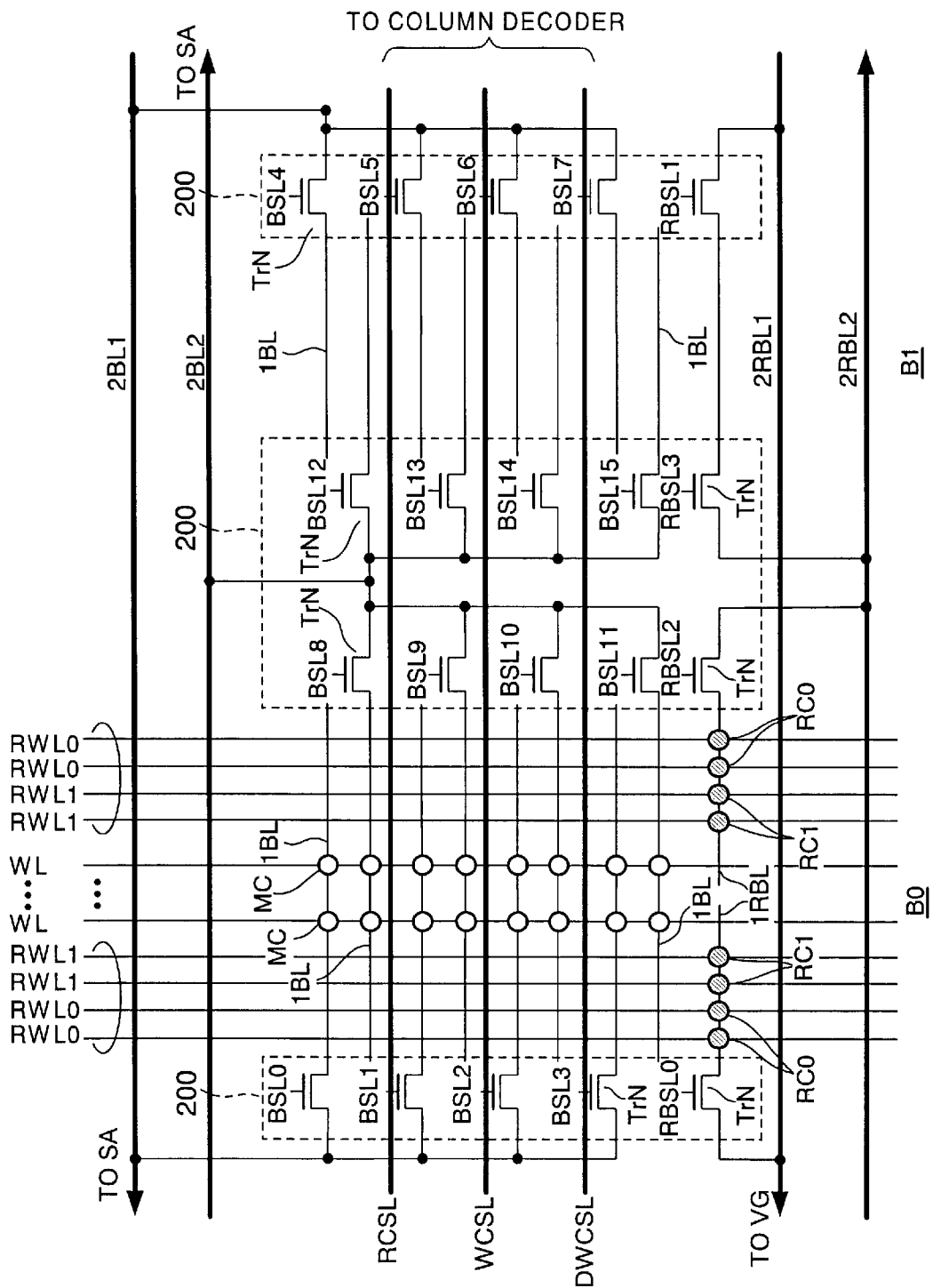
FIG. 42 is a diagram showing the configuration of the cell array when four reference cells are provided for one reference bit line in the first embodiment.

It should be noted that the present invention is not limited to the aforementioned embodiments, and various modifications may be made therein. For example, in the aforementioned first and second embodiments, two reference cells RC1 and RC0 are connected to one first reference bit line 1RBL, but the number of reference cells has only to be 2N (N is a natural number). In this case, the number of reference word lines RWL0 and RWL1 is also 2N. For example, when four reference cells RC0, RC0, RC1, and RC1 are provided for one first reference bit line 1RBL in the aforementioned first embodiment, the configuration of the cell array 100 is as shown in FIG. 42.

Figure 43:
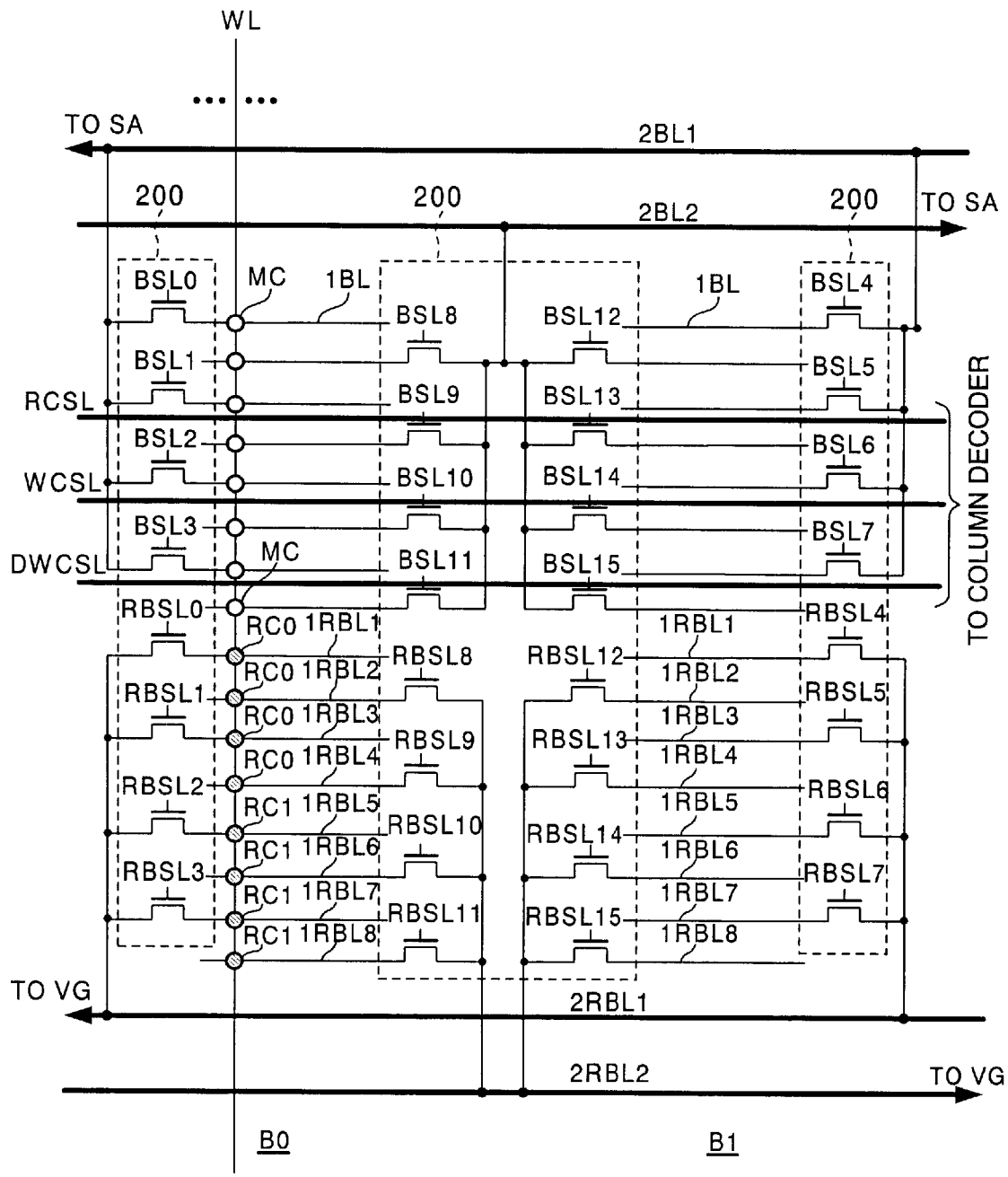
FIG. 43 is a diagram showing the configuration of the cell array when eight reference cells are provided for each word line in the third embodiment.

Similarly, in the aforementioned third to tenth embodiments, two first reference bit lines are provided for one second reference bit line in each of the cell array blocks, but the number of the first reference bit lines has only to be 2N (N is a natural number). For example, FIG. 43 shows a case where four first reference bit lines are provided for one second reference bit line in each cell array block in the aforementioned third embodiment. When a current as a reference is generated by reference cells, with respect to one second reference bit line, four first reference bit lines are selected, and a current 2×(I0+I1) as a reference is obtained by four reference cells. Needless to say, a current mirror with a current ratio of four should be provided for this reference cell current to be compared with a cell's one.

Furthermore, although one reference voltage generating circuit VG is shared by two sense amplifiers SA in the aforementioned embodiments, one reference voltage generating circuit VG may be shared by a larger number of sense amplifiers SA. Contrary to this, one reference voltage generating circuit VG may be used by one sense amplifier SA.

What is claimed is:

1. A semiconductor memory device comprising:
a memory cell array which includes a plurality of memory cells arranged in a matrix form on a semiconductor substrate, each of the memory cells including a MISFET which has a source, a drain, a channel body between the source and the drain and a gate electrode formed on the channel body, the channel body being in an electrical floating state, each of memory cells having a first state in which the number of the stored majority carriers is larger in the channel body and a second state in which the number of the stored majority carriers is smaller in the channel body;
a plurality of word lines, each of which is connected to the gate electrodes of the memory cells arranged in a first direction:
a plurality of first bit lines, each of which is connected to the drains of the memory cells arranged in a second direction which intersects the first direction, the bit lines being formed in a first wiring layer located above the semiconductor substrate; and
a second bit line which is formed in a second wiring layer located above the first wiring layer, the second bit line being connected to the first bit lines via bit line switches.

2. The semiconductor memory device as set forth in claim 1, further comprising:
N first reference word lines which extend in the first direction, where N is a natural number;
N second reference word lines which extend in the first direction;
a plurality of first reference bit lines which are formed in the second direction in the first wiring layer;
a second reference bit line which is formed in the second direction in the second wiring layer, the second reference bit line being connected to the first reference bit lines via reference bit line switches; and
a plurality of reference cells which are used for generating a reference current when data is read from the memory cells, 2N of the reference cells being provided for each of the first reference bit lines, a drain of each of the reference cells being connected to one of the first reference bit lines, wherein a gate electrode of each of N of the 2N reference cells is connected to one of the first reference word lines to be set in the first state and a gate electrode of each of the remaining N reference cells is connected to one of the second reference word lines to be set in the first state, in one of the first reference bit lines.

3. The semiconductor memory device as set forth in claim 2, further comprising:
a reference voltage generating circuit which is connected to the second reference bit line and which generates a reference voltage using the reference current generated by the reference cells; and
a sense amplifier which is connected to the second bit line so as to sense a cell current of a selected memory cell and which reads data of the selected memory cell using the reference voltage generated by the reference voltage generating circuit,
wherein the structure of the reference cells is the same as that of the memory cells.

4. The semiconductor memory device as set forth in claim 3, wherein each of the bit line switches is provided on one side of the respective first bit lines, and each of the reference bit line switches is provided on one side of the respective first reference bit lines.

5. The semiconductor memory device as set forth in claim 3, wherein each of the bit line switches is provided on one side of the respective first bit lines, and the reference bit line switches are provided on both sides of the respective first reference bit lines.

6. The semiconductor memory device as set forth in claim 4, wherein the bit line switches and the reference bit line switches are N-type MISFETs.

7. The semiconductor memory device as set forth in claim 4, wherein the bit line switches and the reference bit line switches are transfer gates, each of which comprises an N-type MISFET and a P-type MISFET connected in parallel to the N-type MISFET.

8. The semiconductor memory device as set forth in claim 5, wherein the bit line switches and the reference bit line switches are N-type MISFETs.

9. The semiconductor memory device as set forth in claim 5, wherein the bit line switches and the reference bit line switches are transfer gates, each of which comprises an N-type MISFET and a P-type MISFET connected in parallel to the N-type MISFET.

10. The semiconductor memory device as set forth in claim 3, wherein the reference voltage generating circuit and the sense amplifier constitute a sense unit, and a plurality of the sense units are provided in the first direction.

11. The semiconductor memory device as set forth in claim 10, further comprising a column decoder which generates a column selection signal to select at leaset one of the sense amplifiers,
wherein the memory cells arranged in the matrix form constitute a cell array which is divided into a plurality of cell array blocks, and
column selection lines are connected to the sense units so as to transmit the column selection signal, and the column selection lines are formed across the cell array blocks in the second wiring layer.

12. The semiconductor memory device as set forth in claim 10, further comprising a column decoder which generates a column selection signal to select at least one of the sense amplifiers, wherein the sense units are provided in a region on one side of the column decoder or in regions on both sides of the column decoder, the sense units being adjacent to the column decoder, and column selection lines are connected to the sense units so as to transmit the column selection signal without forming the column selection lines across the cell array blocks.

13. The semiconductor memory device as set forth in claim 1, further comprising:

2N first reference bit lines which are formed in the second direction in the first wiring layer, where N is a natural number;

a plurality of reference cells which are used for generating a reference current when data is read from the memory cells and which are provided at intersection point of the first reference bit lines and the word lines, a drain of each reference cell being connected to one of the first reference bit lines, a gate electrode of each reference cell being connected to one of the word lines, wherein the reference cells connected to N of the 2N first reference bit lines are to be set in the first state and the reference cells connected to the remaining N first reference bit lines are to be set in the second state; and a second reference bit line which is formed in the second direction in the second wiring layer, the second reference bit line being connected to the first reference bit lines via reference bit line switches.

14. The semiconductor memory device as set forth in claim 13, further comprising:

a reference voltage generating circuit which is connected to the second reference bit line and which generates a reference voltage using the reference current generated by the reference cells; and a sense amplifier which is connected to the second bit line so as to sense a cell current of a selected memory cell and which reads data of the selected memory cell using the reference voltage generated by the reference voltage generating circuit, wherein the structure of the reference cells is the same as that of the memory cells.

15. The semiconductor memory device as set forth in claim 14, wherein each of the bit line switches is provided on one side of the respective first bit lines, and each of the reference bit line switches is provided on one side of the respective first reference bit lines.

16. The semiconductor memory device as set forth in claim 14, wherein each of the bit line switches is provided on one side of the respective first bit lines, and the reference bit line switches are provided on both sides of the respective first reference bit lines.

17. The semiconductor memory device as set forth in claim 15, wherein the bit line switches and the reference bit line switches are N-type MISFETs.

18. The semiconductor memory device as set forth in claim 15, wherein the bit line switches and the reference bit line switches are transfer gates, each of which comprises an N-type MISFET and a P-type MISFET connected in parallel to the N-type MISFET.

19. The semiconductor memory device as set forth in claim 16, wherein the bit line switches and the reference bit line switches are N-type MISFETs.

20. The semiconductor memory device as set forth in claim 16, wherein the bit line switches and the reference bit line switches are transfer gates, each of which comprises an N-type MISFET and a P-type MISFET connected in parallel to the N-type MISFET.

21. The semiconductor memory device as set forth in claim 14, wherein the bit line switches are provided on both sides of the first bit lines, one of the bit line switches in each of the first bit lines is an N-type MISFET and the other of the bit line switches in each of the first bit lines is a P-type MISFET, and the reference bit line switches are provided on both sides of the first reference bit lines, one of the reference bit line switches in each of the first reference bit lines is an N-type MISFET and the other of the reference bit line switches in each of the first bit lines is a P-type MISFET.

22. The semiconductor memory device as set forth in claim 14, wherein the reference voltage generating circuit and the sense amplifier constitute a sense unit, and a plurality of the sense units are provided in the first direction.

23. The semiconductor memory device as set forth in claim 22, further comprising a column decoder which generates a column selection signal to select at least one of the sense amplifiers, wherein the memory cells arranged in the matrix form constitute a cell array which is divided into a plurality of cell array blocks, and column selection lines are connected to the sense units so as to transmit the column selection signal, and the column selection lines are formed across the cell array blocks in the second wiring layer.

24. The semiconductor memory device as set forth in claim 22, further comprising a column decoder which generates a column selection signal to select at least one of the sense amplifiers, wherein the sense units are provided in a region on one side of the column decoder or in regions on both sides of the column decoder, the sense units being adjacent to the column decoder, and column selection lines are connected to the sense units so as to transmit the column selection signal without forming the column selection lines across the cell array blocks.

* * * * *